(12) United States Patent
Kim et al.

(10) Patent No.: US 9,847,224 B2
(45) Date of Patent: Dec. 19, 2017

(54) SEMICONDUCTOR DEVICES AND METHODS OF MANUFACTURING THE SAME

(71) Applicant: SAMSUNG ELECTRONICS CO., LTD., Suwon-si (KR)

(72) Inventors: Dong-Hyuk Kim, Seongnam-si (KR); Geo-Myung Shin, Seoul (KR); Dong-Suk Shin, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 197 days.

(21) Appl. No.: 14/519,516

(22) Filed: Oct. 21, 2014

(65) Prior Publication Data

US 2015/0221654 A1 Aug. 6, 2015

(30) Foreign Application Priority Data

Feb. 3, 2014 (KR) ........................ 10-2014-0012039

(51) Int. Cl.
*H01L 21/311* (2006.01)
*H01L 29/16* (2006.01)
(Continued)

(52) U.S. Cl.
CPC .... *H01L 21/02532* (2013.01); *H01L 21/0245* (2013.01); *H01L 21/0262* (2013.01); *H01L 21/02381* (2013.01); *H01L 21/02576* (2013.01); *H01L 21/02579* (2013.01); *H01L 21/02639* (2013.01); *H01L 21/823431* (2013.01); *H01L 21/823456* (2013.01); *H01L 21/823814* (2013.01); *H01L 21/823878* (2013.01); *H01L 21/845* (2013.01); *H01L 27/0924* (2013.01); *H01L 27/1211* (2013.01);
(Continued)

(58) Field of Classification Search
CPC .. H01L 27/11–27/1104; H01L 27/1211; H01L 27/0886; H01L 27/0924; H01L 27/10826; H01L 27/10879; H01L 21/82343; H01L 21/823821; H01L 21/845; H01L 21/823878; H01L 21/823814; H01L 21/02532; H01L 21/28141; H01L 21/823468; H01L 21/823864
See application file for complete search history.

(56) References Cited

U.S. PATENT DOCUMENTS 7,314,787 B2  1/2008  Yagishita
7,534,669 B2  5/2009  Anderson et al.
(Continued)

FOREIGN PATENT DOCUMENTS

JP    2010-171337 A    8/2010

*Primary Examiner* — Maliheh Malek
(74) *Attorney, Agent, or Firm* — Sughrue Mion, PLLC

(57) ABSTRACT

A semiconductor device includes: a substrate including a plurality of first active regions and a plurality of second active regions; a plurality of first gate structures formed above the first active regions, respectively, and a plurality of second gate structures formed above the second active regions, respectively; and a plurality of first source/drain layers corresponding to the first gate structures, respectively, and a plurality of second source/drain layers corresponding to the second gate structures, respectively, wherein a width of each of the first source/drain layers is smaller than a width of each of the second source/drain layers.

20 Claims, 74 Drawing Sheets

(51) Int. Cl.

| | |
|---|---|
| H01L 21/02 | (2006.01) |
| H01L 21/8238 | (2006.01) |
| H01L 21/8234 | (2006.01) |
| H01L 27/092 | (2006.01) |
| H01L 29/165 | (2006.01) |
| H01L 21/84 | (2006.01) |
| H01L 29/66 | (2006.01) |
| H01L 29/78 | (2006.01) |
| H01L 27/12 | (2006.01) |
| H01L 27/11 | (2006.01) |

(52) U.S. Cl.
CPC ...... *H01L 29/165* (2013.01); *H01L 29/66545* (2013.01); *H01L 29/7848* (2013.01)

(56) References Cited

U.S. PATENT DOCUMENTS

| | | | |
|---|---|---|---|
| 7,667,271 B2 | 2/2010 | Yu et al. | |
| 7,755,104 B2 | 7/2010 | Yagishita | |
| 7,939,412 B2 | 5/2011 | Orlowski et al. | |
| 8,264,021 B2 | 9/2012 | Lai et al. | |
| 8,264,034 B2 | 9/2012 | Kim et al. | |
| 8,313,999 B2 | 11/2012 | Cappellani et al. | |
| 9,012,287 B2* | 4/2015 | Liaw | H01L 27/1104 438/283 |
| 9,166,010 B2* | 10/2015 | Kelly | H01L 29/0653 |
| 9,190,466 B2* | 11/2015 | Basker | H01L 29/06 |
| 9,324,832 B1* | 4/2016 | Baek | H01L 29/66545 |
| 9,368,388 B2* | 6/2016 | Liaw | H01L 27/1104 |
| 2002/0120911 A1 | 8/2002 | Hino | H01L 21/7621 716/120 |
| 2004/0188806 A1* | 9/2004 | Chung | H01L 21/76829 257/621 |
| 2005/0112817 A1* | 5/2005 | Cheng | H01L 21/823807 438/219 |
| 2007/0037336 A1* | 2/2007 | Kwon | H01L 21/823468 438/197 |
| 2007/0158764 A1* | 7/2007 | Orlowski | H01L 21/823431 257/401 |
| 2008/0087967 A1* | 4/2008 | Kim | H01L 21/823807 257/369 |
| 2008/0128785 A1* | 6/2008 | Park | H01L 27/105 257/321 |
| 2008/0296702 A1* | 12/2008 | Lee | H01L 21/823431 257/401 |
| 2009/0137093 A1* | 5/2009 | Lin | H01L 27/10876 438/421 |
| 2009/0246920 A1* | 10/2009 | Teo | H01L 21/823807 438/187 |
| 2010/0065917 A1* | 3/2010 | Ohta | H01L 21/845 257/369 |
| 2011/0062501 A1* | 3/2011 | Soss | H01L 21/28114 257/288 |
| 2011/0079829 A1* | 4/2011 | Lai | H01L 29/41791 257/288 |
| 2011/0147828 A1 | 6/2011 | Murthy et al. | |
| 2011/0171794 A1* | 7/2011 | Seo | H01L 21/823814 438/231 |
| 2011/0210393 A1 | 9/2011 | Chen et al. | |
| 2011/0223736 A1* | 9/2011 | Lin | H01L 21/823821 438/305 |
| 2012/0146154 A1* | 6/2012 | Itou | H01L 21/823807 257/369 |
| 2012/0306001 A1* | 12/2012 | Hirano | H01L 21/28282 257/324 |
| 2013/0134506 A1* | 5/2013 | Yagishita | H01L 29/66545 257/330 |
| 2013/0270652 A1* | 10/2013 | Liaw | H01L 27/1104 257/401 |
| 2013/0285143 A1* | 10/2013 | Oh | H01L 21/823821 257/347 |
| 2013/0292777 A1* | 11/2013 | Liaw | G11C 11/412 257/369 |
| 2013/0309838 A1* | 11/2013 | Wei | H01L 21/76229 438/424 |
| 2013/0341722 A1* | 12/2013 | Illgen | H01L 21/84 257/351 |
| 2014/0001562 A1* | 1/2014 | Liaw | H01L 21/823431 257/369 |
| 2014/0099784 A1* | 4/2014 | Kim | H01L 29/511 438/589 |
| 2014/0131813 A1* | 5/2014 | Liaw | H01L 27/1104 257/401 |
| 2014/0138773 A1* | 5/2014 | Cheng | H01L 21/3086 257/347 |
| 2014/0141589 A1* | 5/2014 | Shin | H01L 29/66568 438/306 |
| 2014/0167163 A1* | 6/2014 | Cheng | H01L 29/785 257/347 |
| 2014/0353740 A1* | 12/2014 | Nishida | H01L 21/823814 257/326 |
| 2014/0374831 A1* | 12/2014 | Liaw | H01L 27/1104 257/368 |
| 2015/0014808 A1* | 1/2015 | Tsai | H01L 21/76224 257/506 |
| 2015/0108544 A1* | 4/2015 | Ching | H01L 21/823821 257/192 |
| 2015/0187867 A1* | 7/2015 | Basker | H01L 29/06 257/401 |
| 2015/0187910 A1* | 7/2015 | Kim | H01L 21/823418 438/294 |
| 2015/0206890 A1* | 7/2015 | Liaw | H01L 27/1104 257/391 |
| 2015/0206956 A1* | 7/2015 | Kim | H01L 29/66795 438/294 |
| 2015/0214051 A1* | 7/2015 | Kim | H01L 21/02636 257/192 |
| 2015/0236016 A1* | 8/2015 | Wann | H01L 27/0886 257/401 |
| 2015/0243745 A1* | 8/2015 | Kelly | H01L 29/41766 257/369 |
| 2015/0279993 A1* | 10/2015 | Zhu | H01L 21/823412 257/192 |
| 2015/0318281 A1* | 11/2015 | Cheng | H01L 27/0886 257/384 |
| 2015/0325575 A1* | 11/2015 | Park | H01L 29/0653 257/401 |
| 2016/0020150 A1* | 1/2016 | You | H01L 29/66545 438/218 |
| 2016/0027876 A1* | 1/2016 | Lee | H01L 29/1054 257/369 |
| 2016/0035861 A1* | 2/2016 | Park | H01L 29/66545 438/301 |
| 2016/0079354 A1* | 3/2016 | Park | H01L 29/66545 257/386 |
| 2016/0163718 A1* | 6/2016 | Park | H01L 29/0653 257/195 |

* cited by examiner

FIG. 1
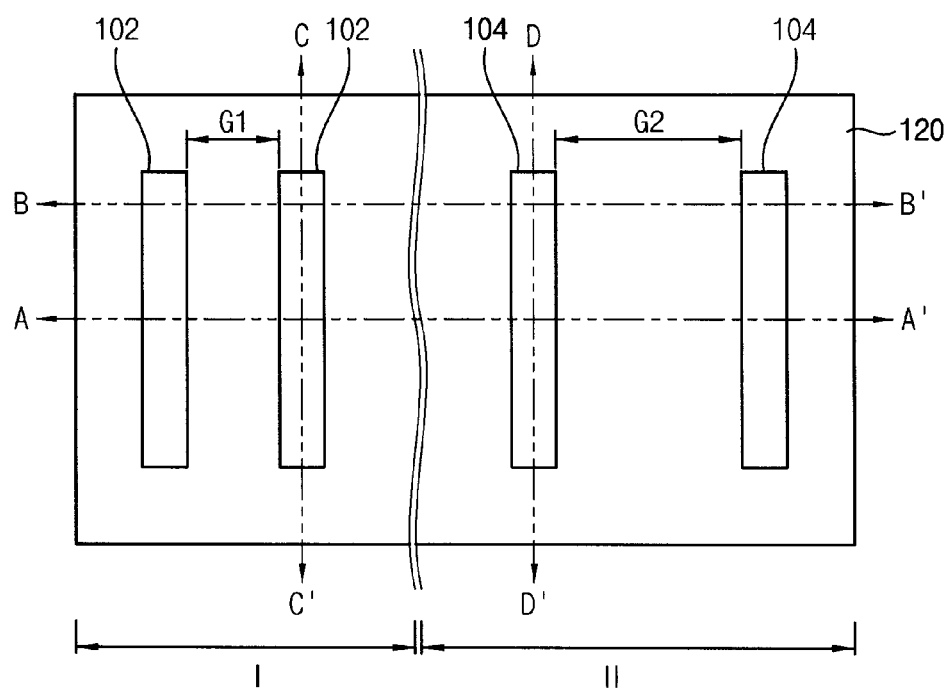
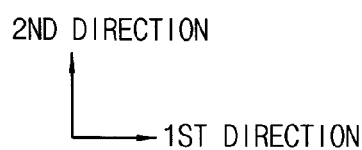

FIG. 4
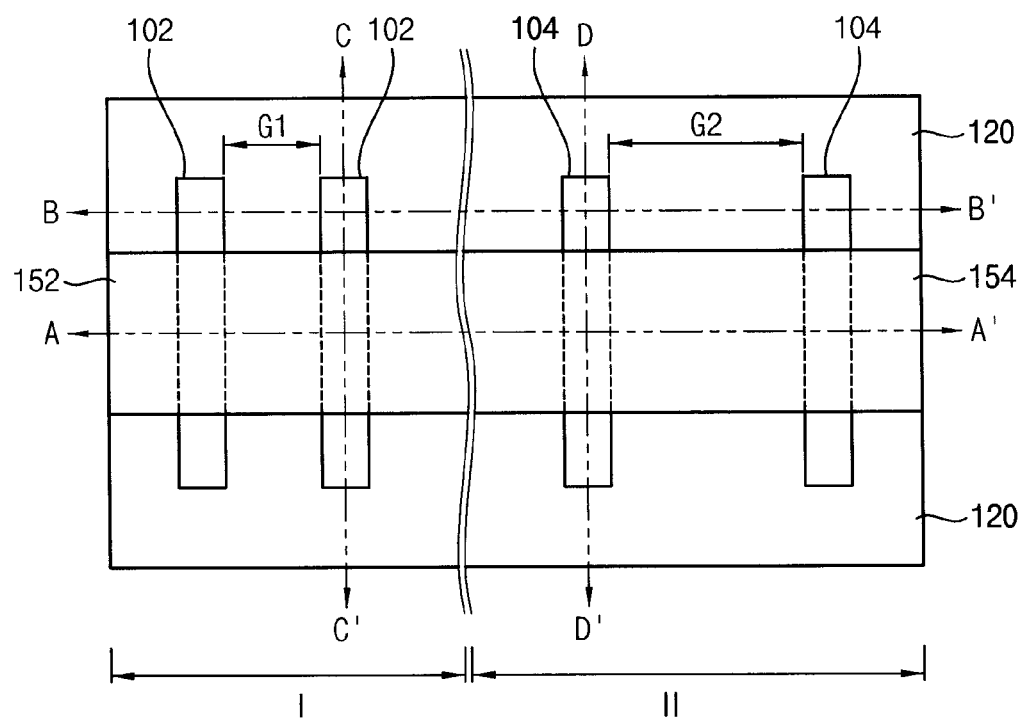
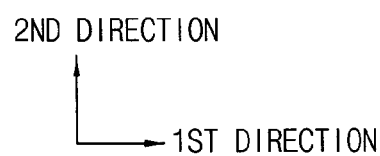

FIG. 12
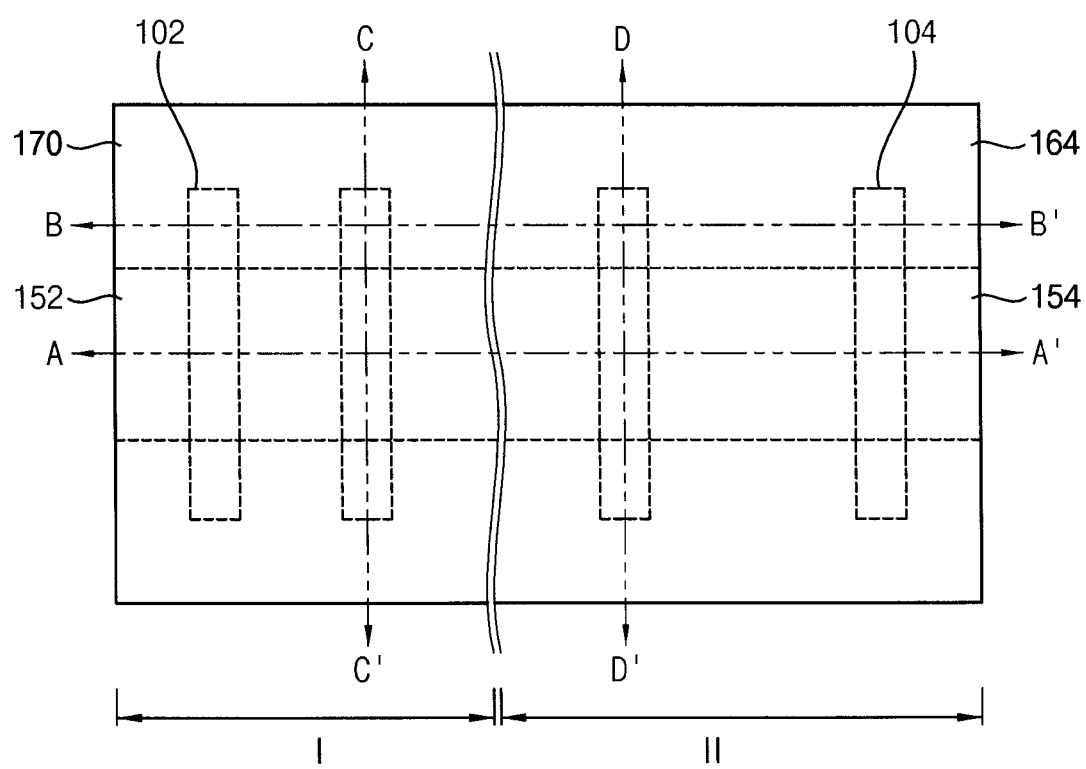
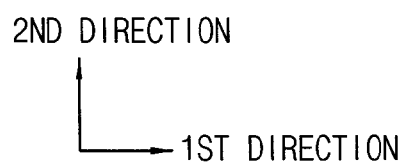

FIG. 16
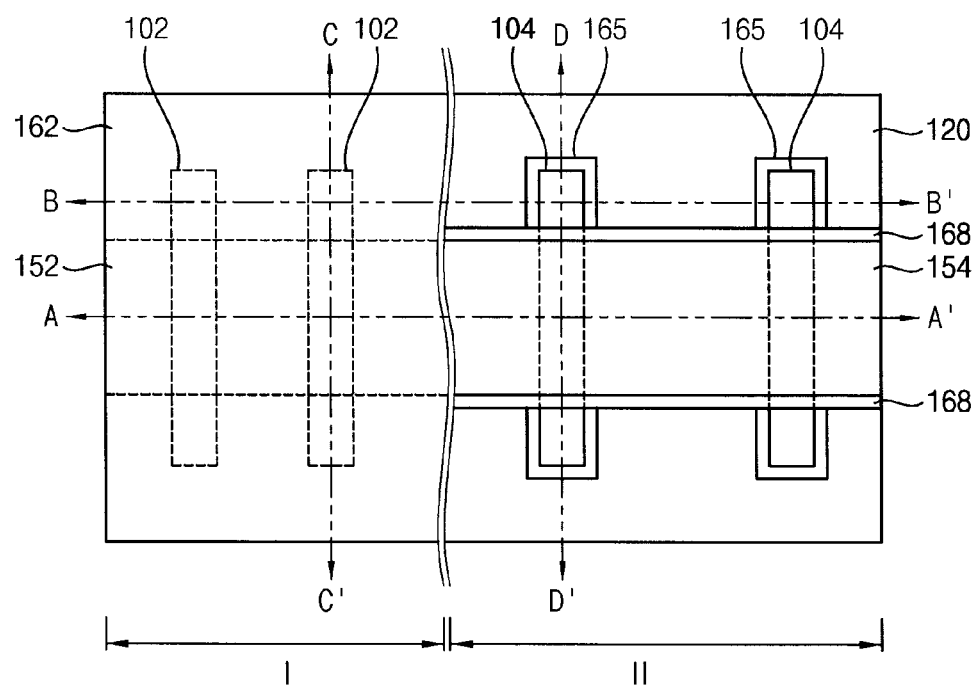
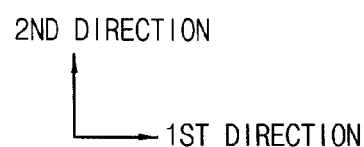

FIG. 18
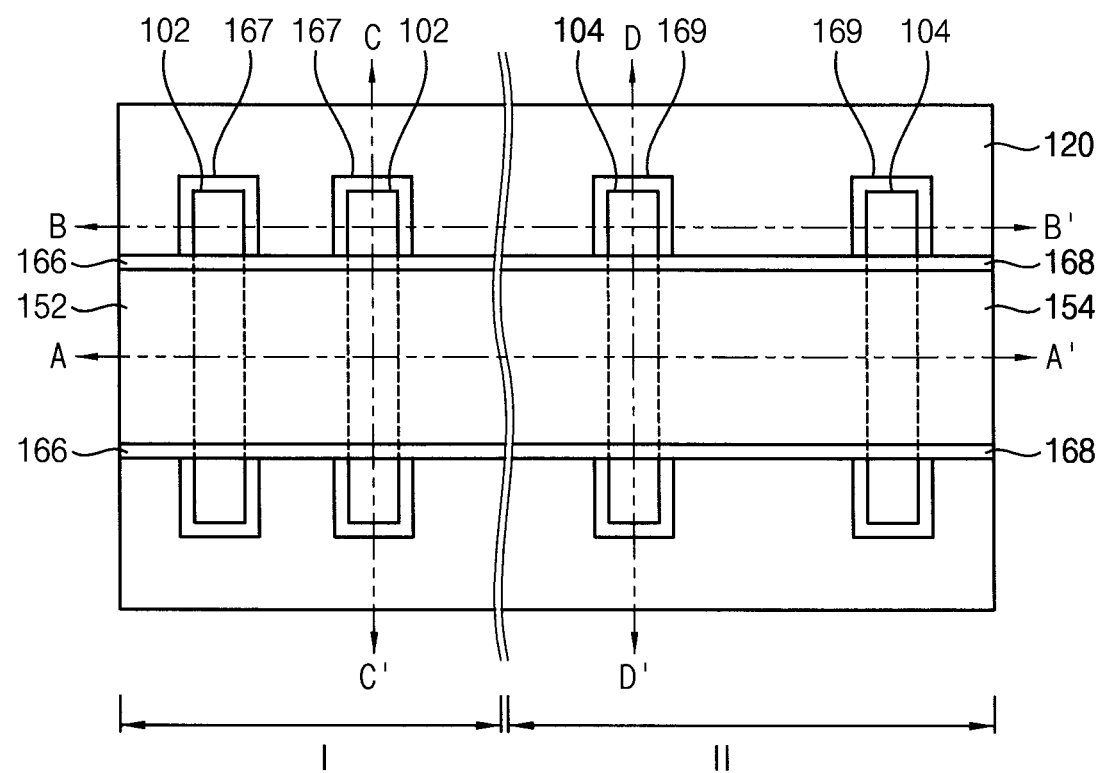

1ST DIRECTION
⊗→ 2ND DIRECTION

FIG. 27
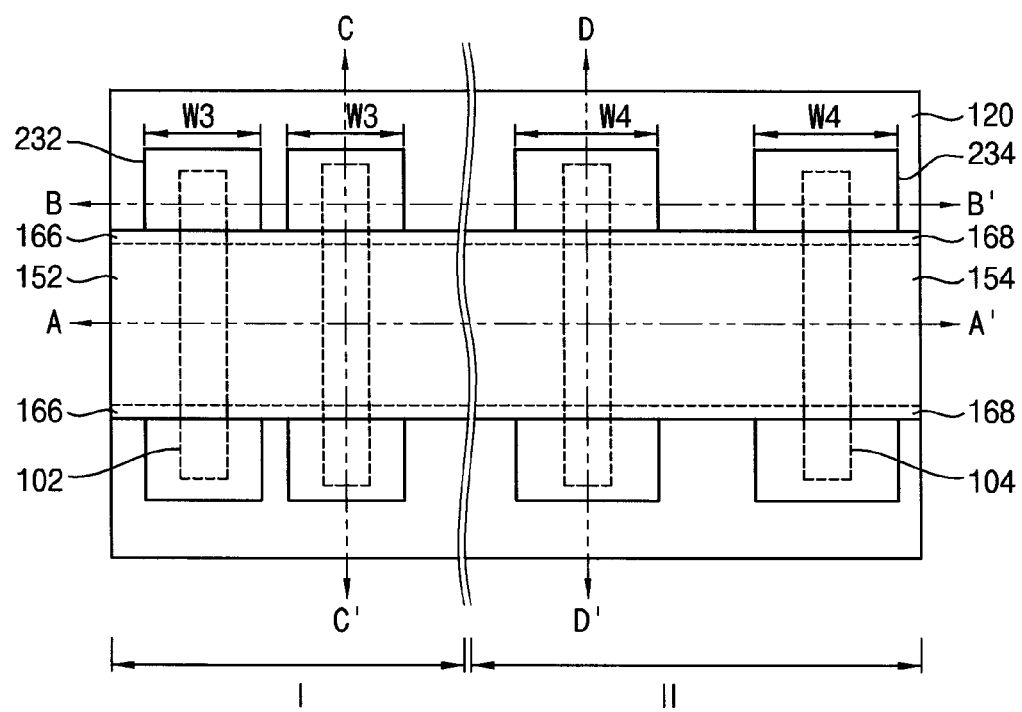
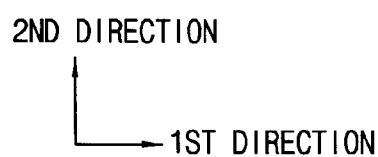

FIG. 33
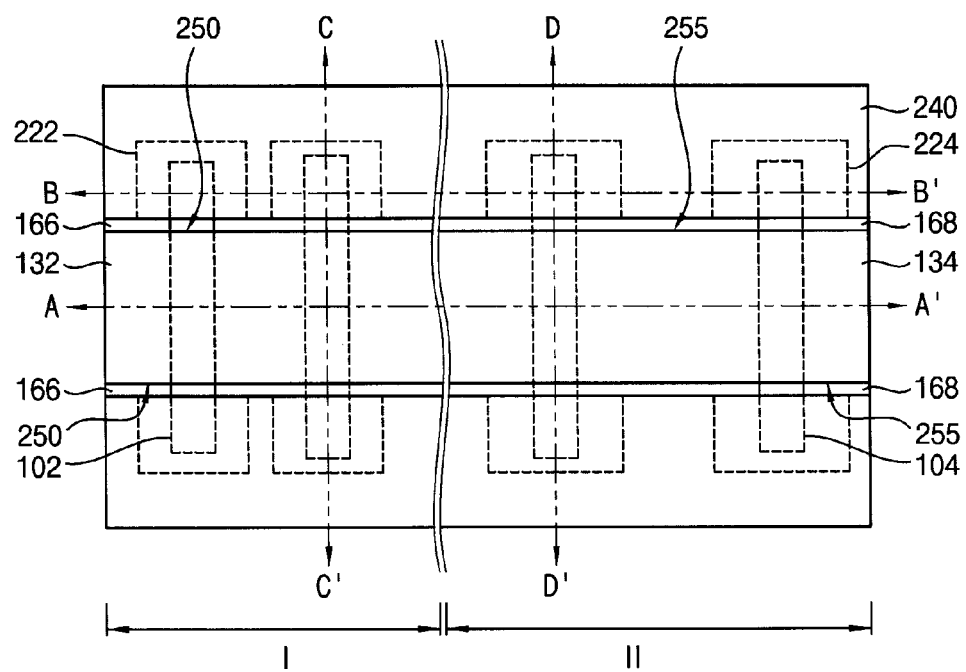
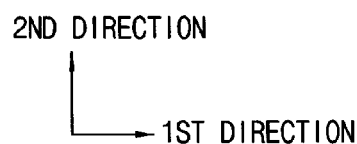

2ND DIRECTION
⊗ ← 1ST DIRECTION

1ST DIRECTION
⊗ ⟶ 2ND DIRECTION

FIG. 36
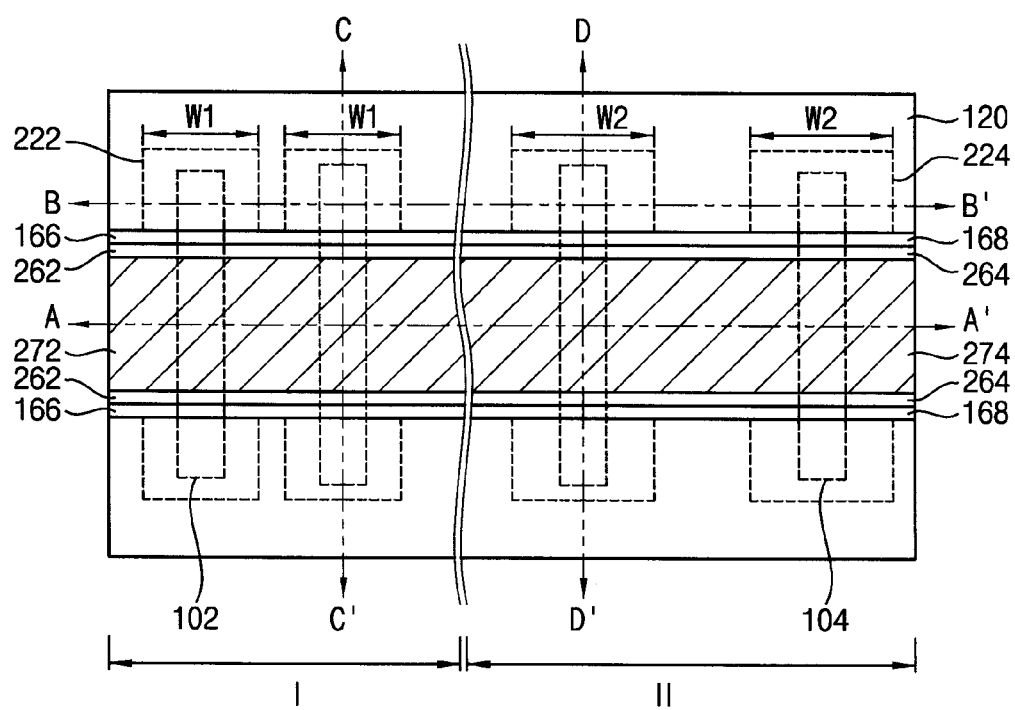
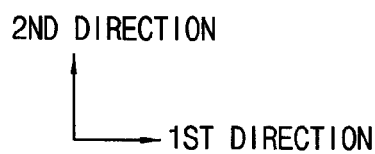

FIG. 44
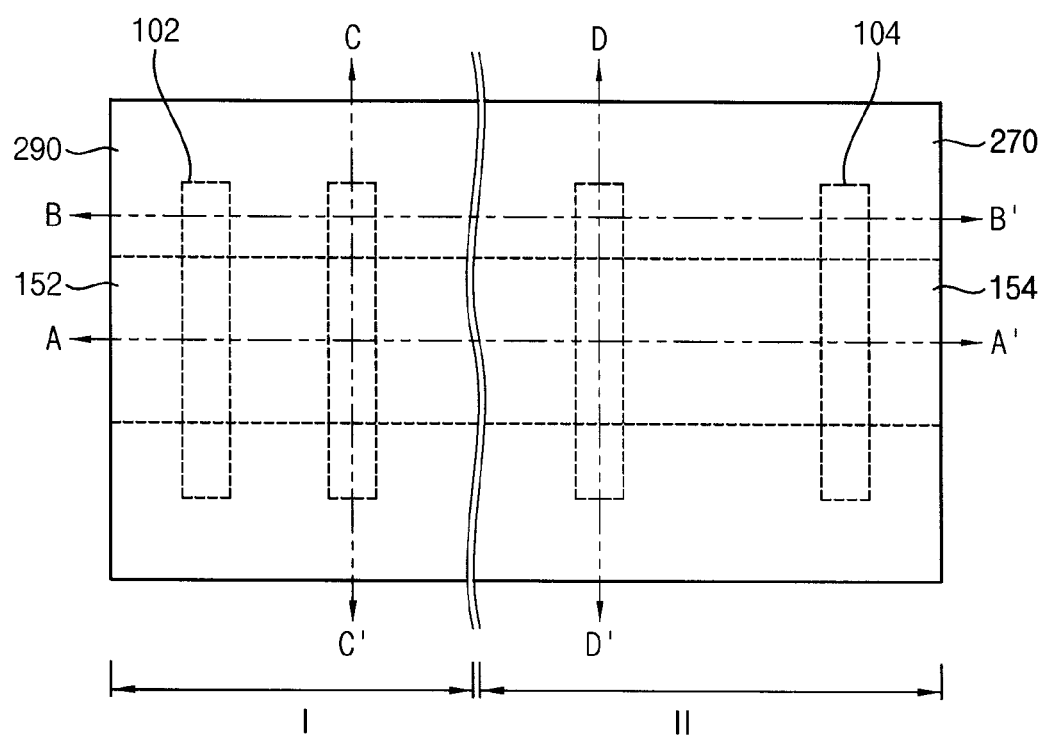
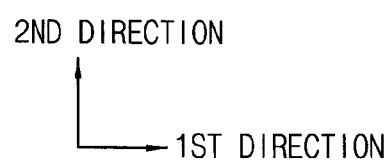

SEMICONDUCTOR DEVICES AND METHODS OF MANUFACTURING THE SAME

CROSS-REFERENCE TO RELATED APPLICATION

This application claims priority from Korean Patent Application No. 10-2014-0012039, filed on Feb. 3, 2014, the disclosure of which is incorporated herein by reference in its entirety.

BACKGROUND

1. Field

Apparatuses and methods consistent with exemplary embodiments of the inventive concept relate to semiconductor devices and, more particularly, to fin-type field effect transistors (finFETs) and methods of manufacturing the same.

2. Description of the Related Art

When a finFET is formed, portions of active fins not covered by a gate structure may be etched to form recesses, and silicon-germanium layers or silicon carbide layers serving as source/drain layers may be formed to fill the recesses by a selective epitaxial growth (SEG) process. When the active fins are formed very densely, source/drain layers formed at neighboring active fins may be grown to contact each other, and thus, an electrical short may be generated.

SUMMARY

One or more exemplary embodiments provide a semiconductor device which addresses the above problems of the related art semiconductor devices.

One or more exemplary embodiments provide a method of manufacturing a semiconductor device addressing the above problems of the related art semiconductor devices.

According to an aspect of an exemplary embodiment, there is provided a semiconductor device which may include: a substrate including a plurality of first active regions and a plurality of second active regions; a plurality of first gate structures formed above the first active regions, respectively, and a plurality of second gate structures formed above the second active regions, respectively; and a plurality of first source/drain layers corresponding to the first gate structures, respectively, and a plurality of second source/drain layers corresponding to the second gate structures, respectively, wherein a width of each of the first source/drain layers is smaller than a width of each of the second source/drain layers.

In the semiconductor device, top surfaces of the first source/drain layers may be formed as a substantially same height as top surfaces of the second source/drain layers.

In the semiconductor device, a distance between the first active regions may be formed to be smaller than a distance between the second active regions.

The semiconductor device may further include a plurality of first and second spacers. The first spacers may be formed along sidewalls of the first active regions, respectively, and the second spacers may be formed along sidewalls of the second active regions, respectively. Also, top portions of the first spacers may be formed to be higher than top portions of the second spacers.

According to an aspect of another exemplary embodiment, there is provided a semiconductor device which may include: a substrate, first and second gate structures, first and second spacers, and first and second source/drain layers. The substrate may include a field region and first and second active regions. An isolation layer may be formed on the field region, and the first and second active regions protrude from the isolation layer. The first and second gate structures may be formed on the first and second active regions, respectively. The first and second spacers may be formed on sidewalls of the first and second active regions, respectively. Top surfaces of the first and second spacers may be formed to be higher than those of the first and second active regions, respectively, and heights of the top surfaces of the first and second spacers may be different from each other. The first and second source/drain layers adjacent to the first and second gate structures may be formed on the first and second active regions, respectively, and contact the first and second spacers, respectively.

In the semiconductor device, the first and second spacers may be formed on both sidewalls of the first and second active regions, respectively, to define first and second recesses together with top surfaces of the first and second active regions, respectively, and the first and second source/drain layers may fill the first and second recesses and protrude from the first and second spacers, respectively.

In the semiconductor device, each of the first and second active regions may extend in a second direction substantially parallel to a top surface of the substrate, a top surface of the first spacer may be higher than that of the second spacer, and the first source/drain layer may have a maximum width in a first direction smaller than that of the second source/drain layer. The first direction may be substantially parallel to the top surface of the substrate and substantially perpendicular to the second direction.

In the semiconductor device, top surfaces of the first and second source/drain layers may be substantially coplanar with each other.

In the semiconductor device, each of the first and second source/drain layers may include silicon-germanium doped with p-type impurities.

In the semiconductor device, each of the first and second source/drain layers may include silicon doped with n-type impurities or silicon carbide doped with n-type impurities.

In the semiconductor device, the first active region may include a plurality of first active regions, each of which may extend in a second direction substantially parallel to a top surface of the substrate, disposed at a first gap from each other in a first direction substantially parallel to the top surface of the substrate and substantially perpendicular to the second direction, and the second active region may include a plurality of second active regions, each of which may extend in the second direction, disposed at a second gap from each other in the first direction. The second gap may be greater than the first gap.

In the semiconductor device, each of the first and second gate structures may extend in the first and second direction, and the semiconductor device may further include first and second gate spacers on both sidewalls of the first and second gate structures in the second direction. The first and second gate spacers may include a material substantially the same as that of the first and second spacers.

In the semiconductor device, each of the first and second gate structures may include a gate insulation layer pattern, a high-k dielectric layer pattern and a gate electrode sequentially stacked on the substrate.

In the semiconductor device, the first active region may be formed in a static random access memory (SRAM) region in which a SRAM device is formed, and the second active region may be formed in a logic region in which a logic device is formed.

According to an aspect of still another exemplary embodiment, there is provided a method of manufacturing a semiconductor device. In the method, an isolation layer may be formed on a substrate to define a field region and first and second active regions. The field region may be covered by the isolation layer, and the first and second active regions are not covered by the isolation layer and protrude from the isolation layer. First and second dummy gate structures may be formed on the first and second active regions, respectively. First and second spacers may be formed on both sidewalls of the first and second active regions not covered by the first and second dummy gate structures, respectively. Heights of top surfaces of the first and second spacers may be different from each other. Upper portions of the first and second active regions not covered by the first and second dummy gate structures, respectively, may be removed to form first and second recesses defined by the first and second spacers, respectively. First and second source/drain layers filling the first and second recesses and protruding from the first and second spacers, respectively, may be formed.

In the method, when the first and second source/drain layers are formed, a selective epitaxial growth (SEG) process may be performed using the first and second active regions exposed by the first and second recesses as a seed.

In the method, the first and second source/drain layers may be formed to include silicon-germanium doped with p-type impurities.

In the method, when the first and second spacers are formed, a spacer layer may be formed on the first and second dummy gate structures, the first and second active regions and the isolation layer. A photoresist pattern covering the first active region and exposing the second active region may be formed. A portion of the spacer layer on the second active region exposed by the photoresist pattern may be partially etched. The photoresist pattern may be removed. The spacer layer may be anisotropically etched to form the first and second spacers. The first spacer may have a first height on both sidewalls of the first active region, and the second spacer may have a second height on both sidewalls of the second active region. The second height may be lower than the first height.

In the method, when the spacer layer is anisotropically etched, first and second gate spacers may be formed on sidewalls of the first and second dummy gate spacers, respectively. An insulating interlayer covering the first and second source/drain layers and the first and second spacers, and surrounding the first and second dummy gate structures and the first and second gate spacers may be formed. The first and second dummy gate structures may be replaced by first and second gate structures, respectively.

According to an aspect of still another exemplary embodiment, the horizontal growth of source/drain layer structures that may be formed by an SEG process on active regions disposed at a relatively small distance from each other may be much restricted by a spacer having a relatively high top surface to have a relatively narrow width, so that an electrical short between the source/drain layer structures may be prevented. However, the horizontal growth of source/drain layer structures that may be formed by an SEG process on active regions disposed at a relatively large distance from each other may be little restricted by a spacer having a relatively low top surface to have a relatively wide width, so that a transistor including the source/drain layer structures may have an enhanced electrical performance.

BRIEF DESCRIPTION OF THE DRAWINGS

Exemplary embodiments will be more clearly understood from the following detailed description taken in conjunction with the accompanying drawings. FIGS. 1 to 76 represent non-limiting, exemplary embodiments as described herein.

FIGS. 1 to 39 are plan views and cross-sectional views illustrating stages of a method of manufacturing a semiconductor device, in accordance with exemplary embodiments;

FIGS. 40 to 50 are also plan views and cross-sectional views illustrating stages of a method of manufacturing a semiconductor device, in accordance with exemplary embodiments; and FIGS. 51 to 76 are also plan views and cross-sectional views illustrating stages of a method of manufacturing a semiconductor device, in accordance with exemplary embodiments.

DETAILED DESCRIPTION OF THE EXEMPLARY EMBODIMENTS

Figure 2:
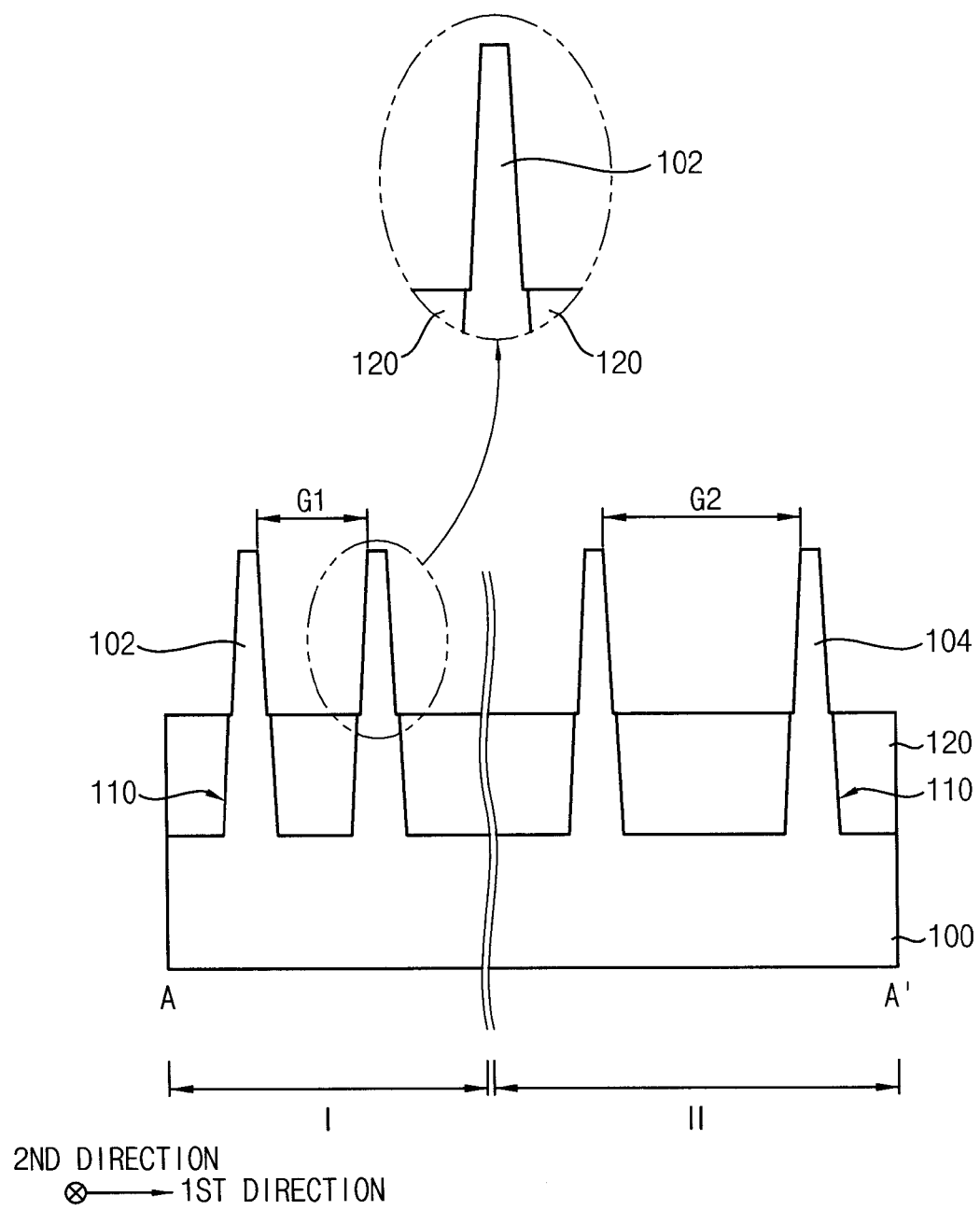

Various exemplary embodiments will be described more fully hereinafter with reference to the accompanying drawings. The inventive concept may, however, be embodied in many different forms and should not be construed as limited to the exemplary embodiments set forth herein. Rather, these exemplary embodiments are provided so that this description will be thorough and complete, and will fully convey the scope of the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 39 are plan views and cross-sectional views illustrating stages of a method of manufacturing a semiconductor device, in accordance with exemplary embodiments. Particularly, FIGS. 1, 4, 8, 12, 16, 18, 21, 24, 27, 30, 33 and 36 are plan views, and FIGS. 2-3, 5-7, 9-11, 13-15, 17, 19-20, 22-23, 25-26, 28-29, 31-32, 34-35 and 37-39 are cross-sectional views.

FIGS. 2, 5, 9, 13, 34 and 37 are cross-sectional views cut along a line A-A' of corresponding plan views, FIGS. 6, 10, 14, 17, 19, 22, 25, 28, 31 and 38 are cross-sectional views cut along a line B-B' of corresponding plan views, and FIGS. 3, 7, 11, 15, 20, 23, 26, 29, 32, 35 and 39 are cross-sectional views cut along a line C-C' and a line D-D' of corresponding plan views.

Figure 3:
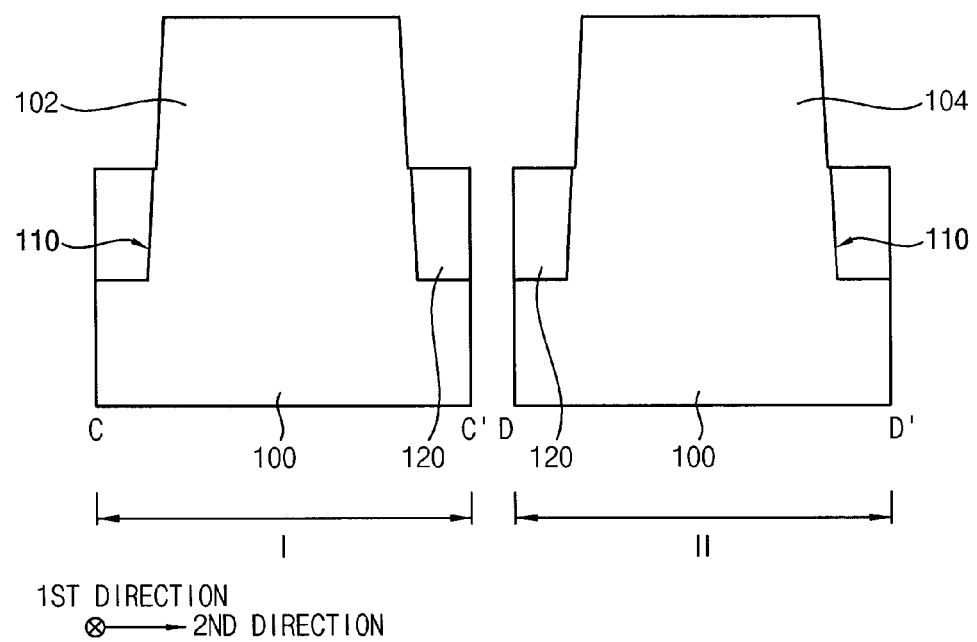
Figure 5:
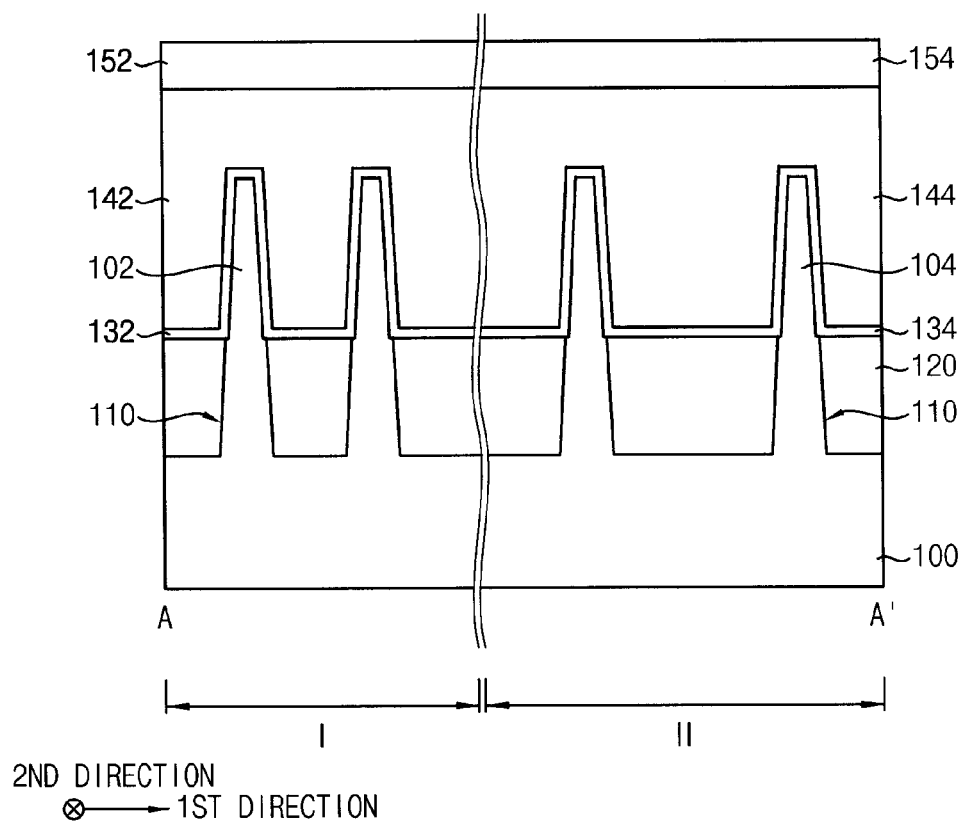
Figure 6:
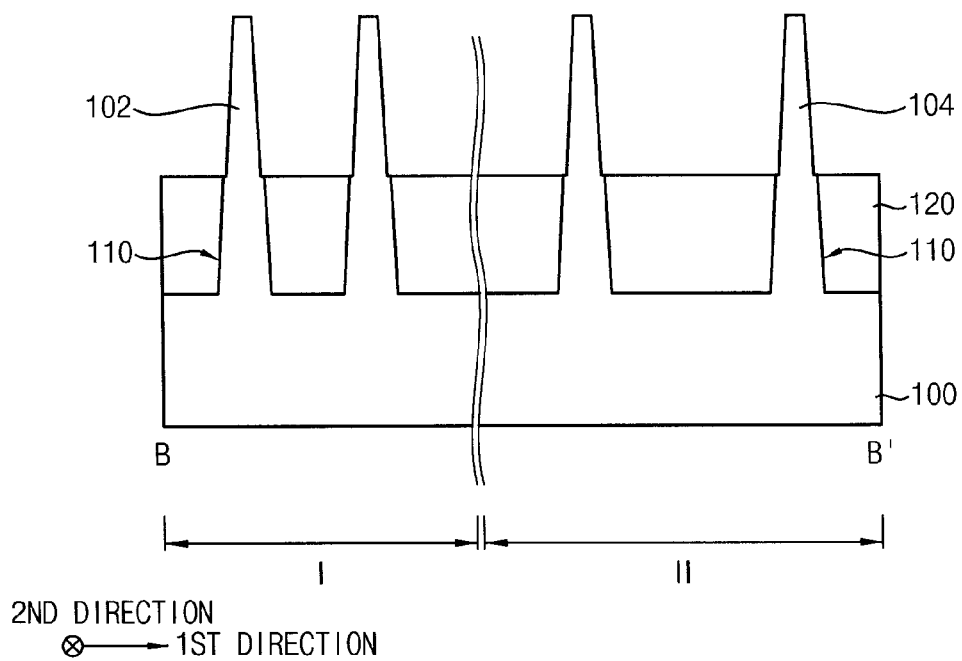
Figure 7:
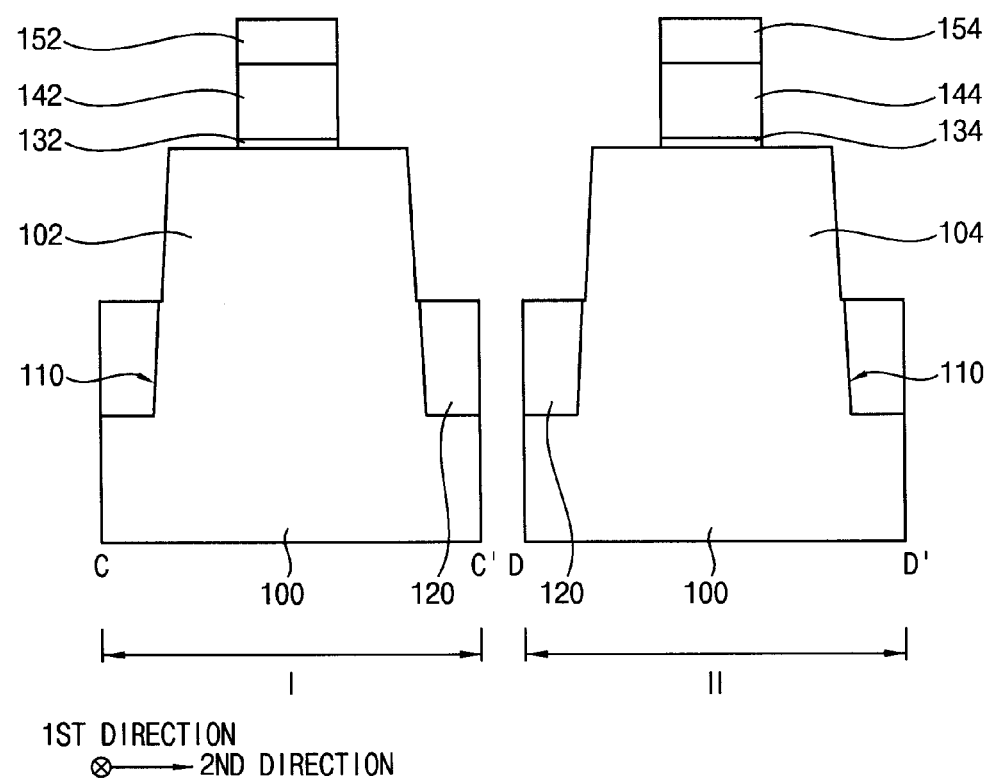
Figure 8:
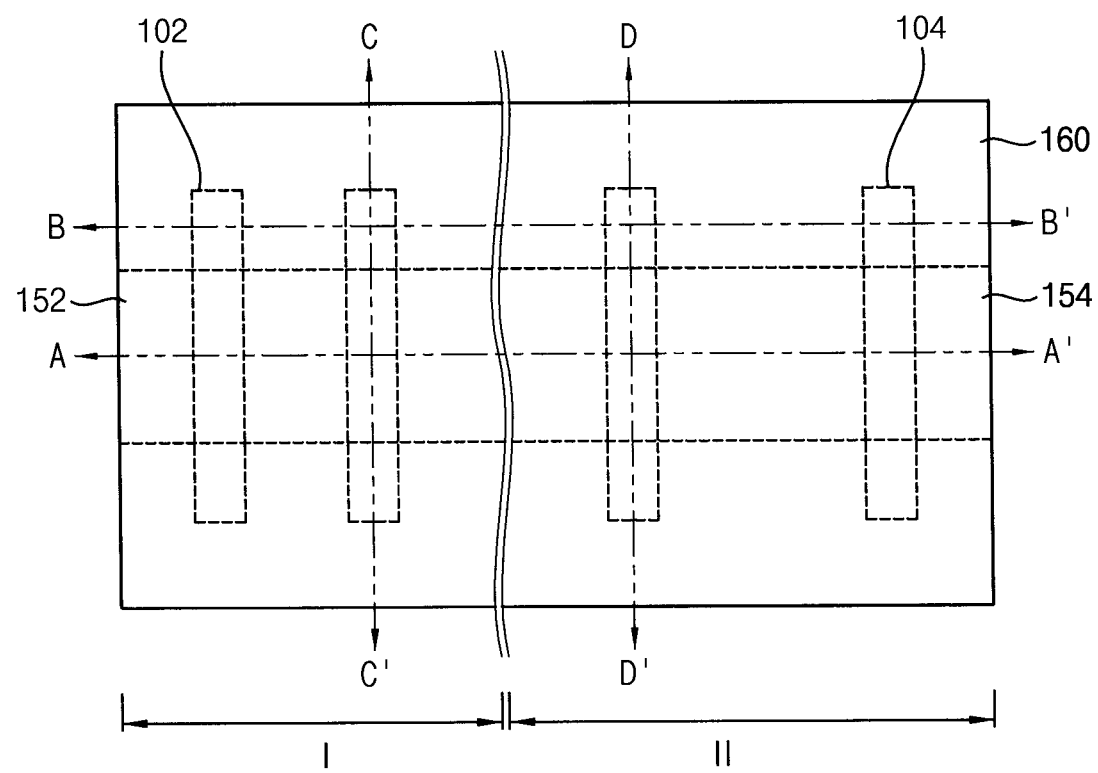
Figure 9:
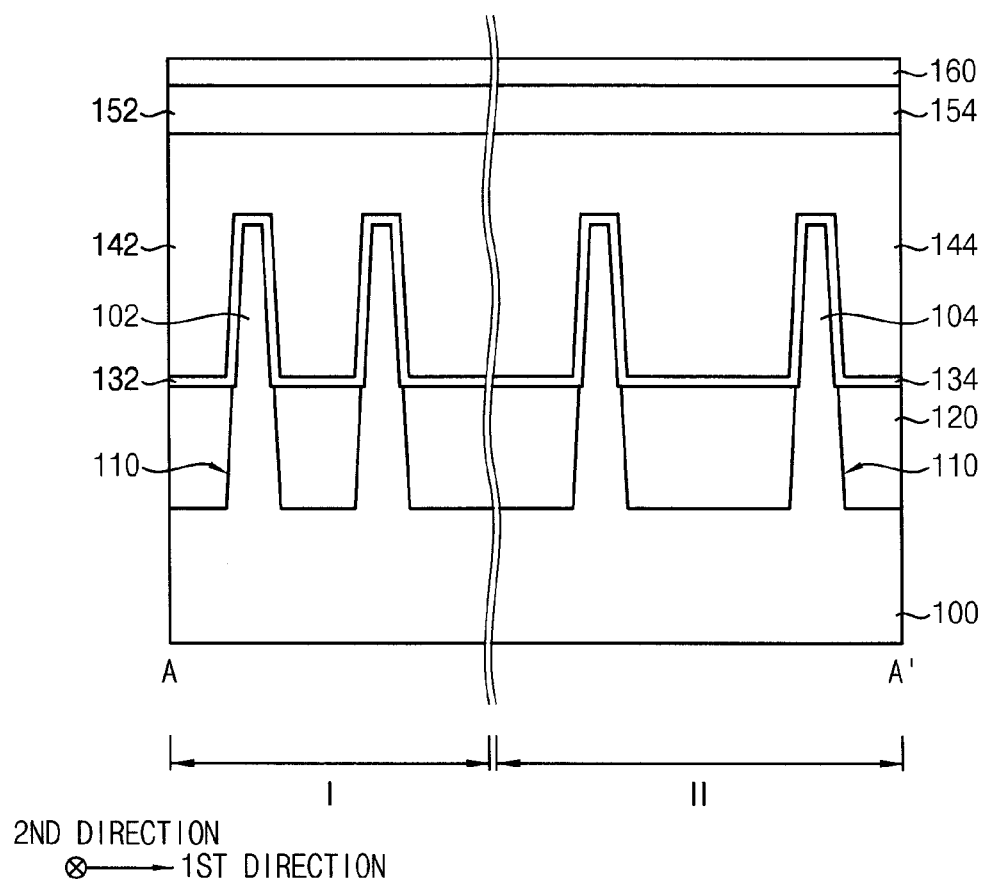
Figure 10:
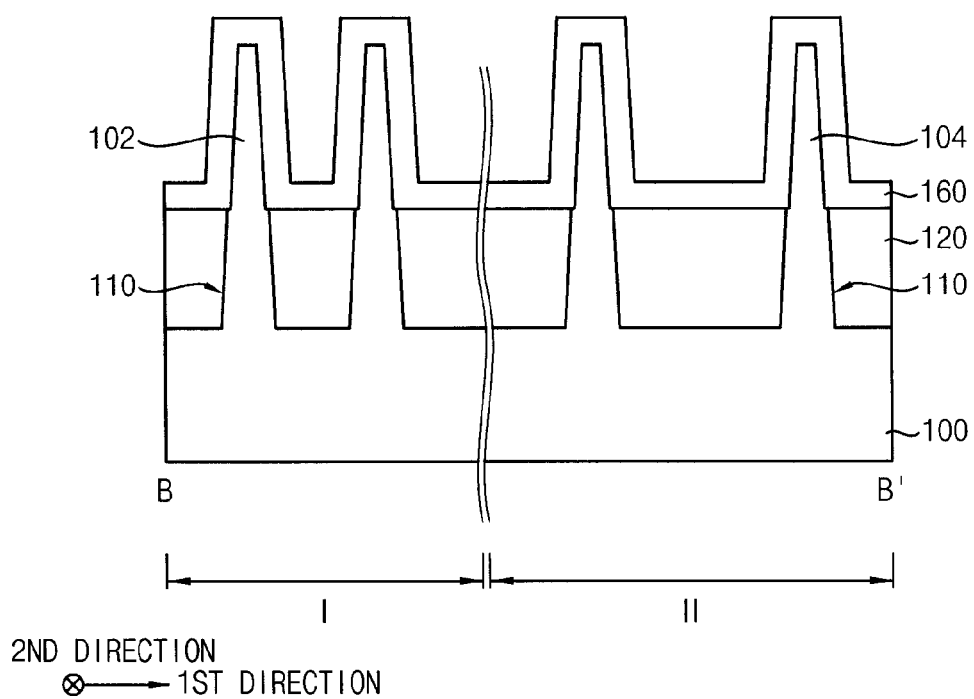
Figure 11:
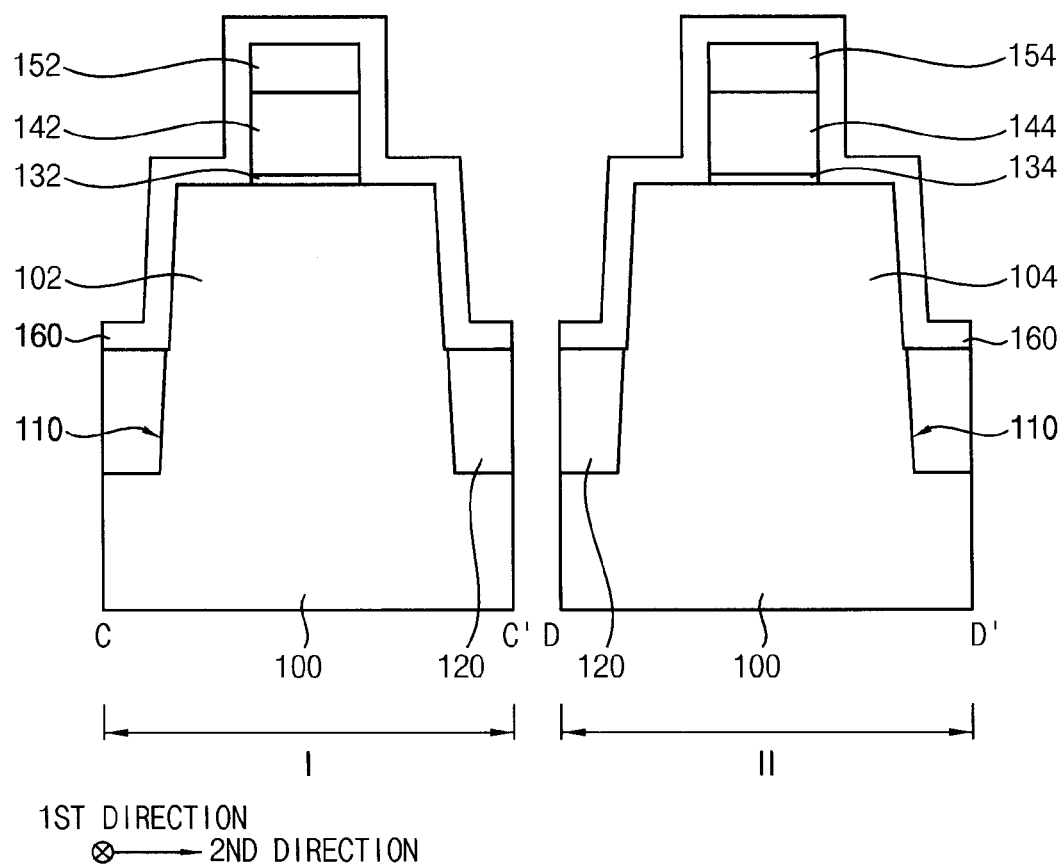
Figure 13:
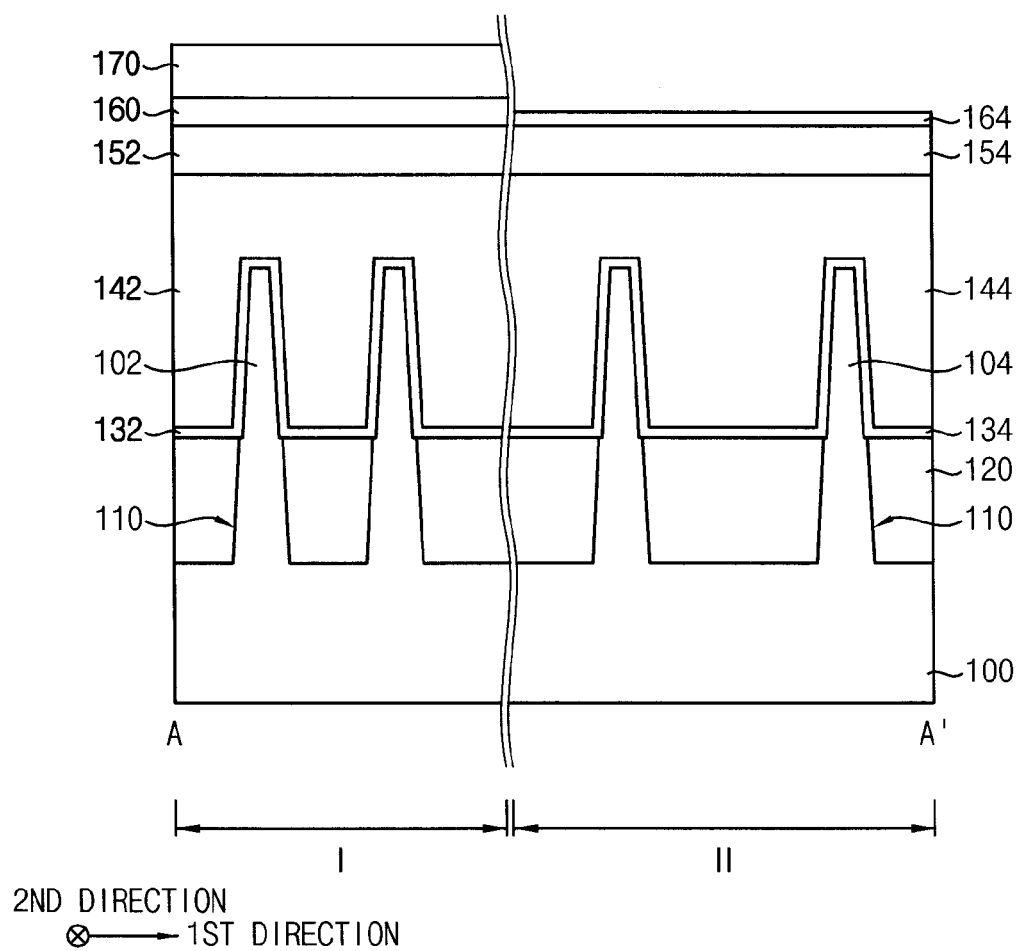
Figure 14:
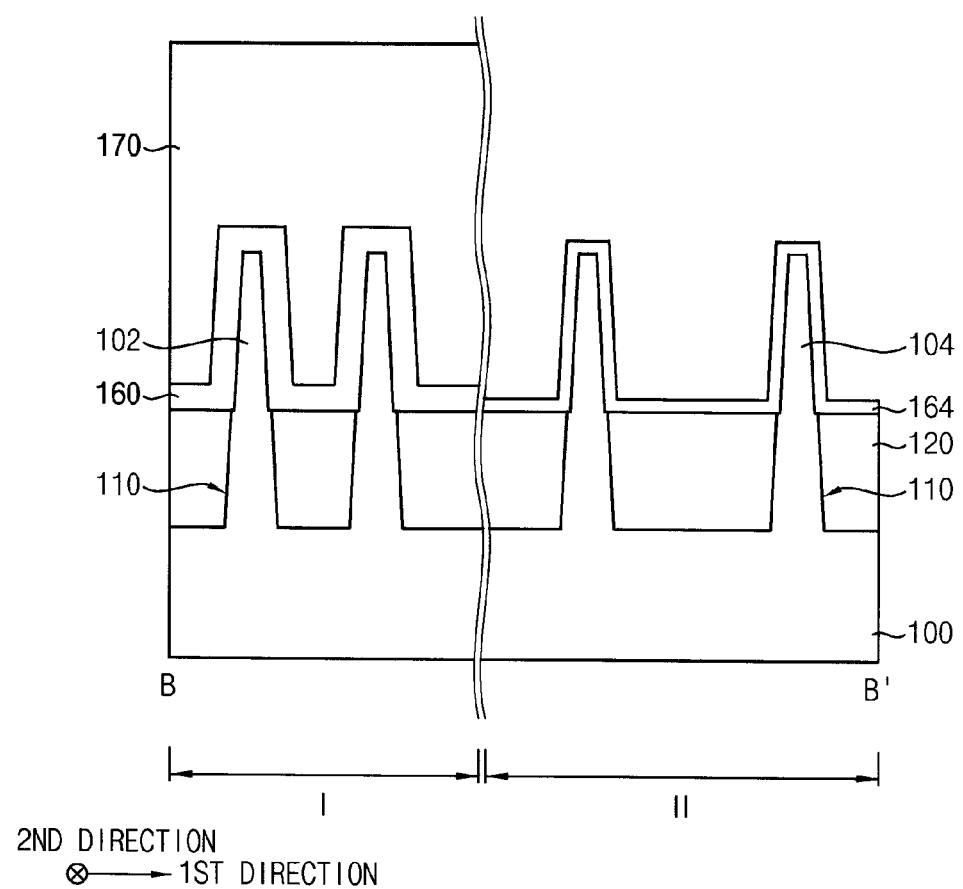
Figure 15:
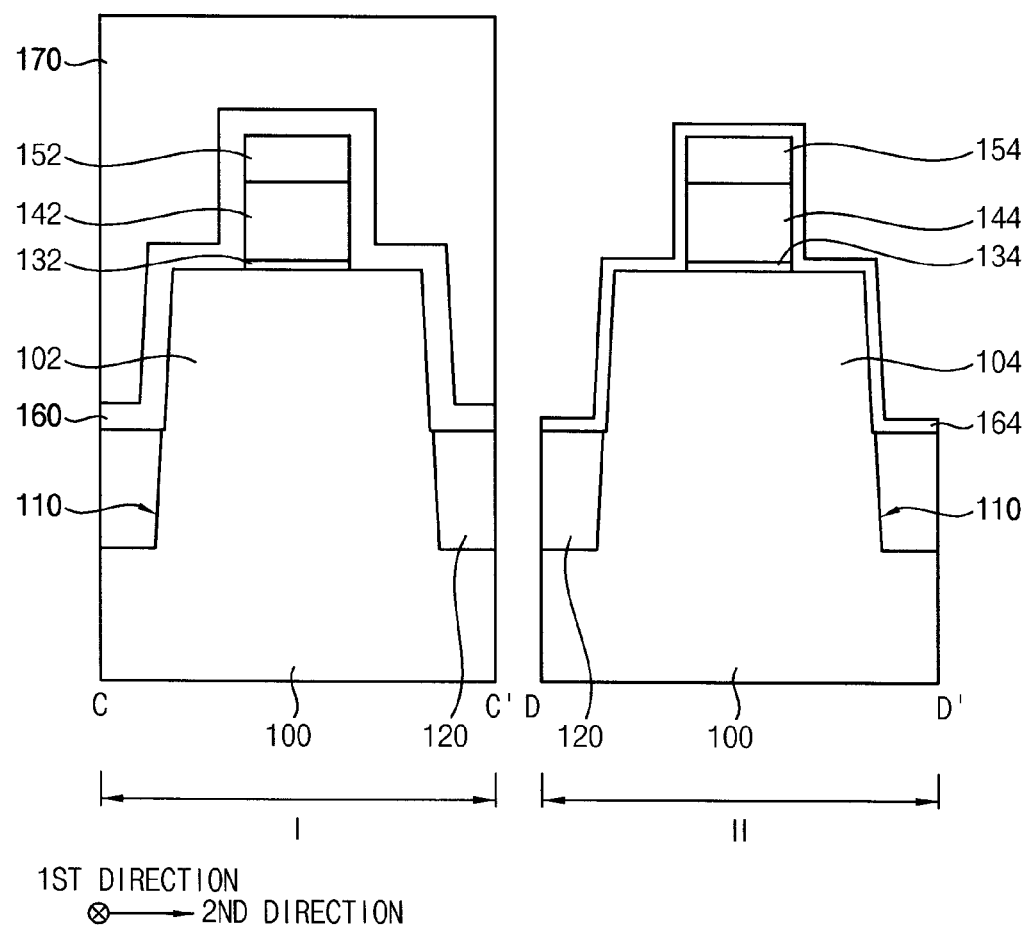

Referring to FIGS. 1 to 3, a substrate 100 may be partially removed to form a trench 110, and an isolation layer 120 may be formed on the substrate 100 to fill the trench 110.

The substrate 100 may be a silicon substrate, a germanium substrate, a silicon-germanium substrate, a silicon-on-insulator (SOI) substrate, a germanium-on-insulator (GOI) substrate, etc. The substrate 100 may include a first region I and a second region II.

The isolation layer 120 may be formed by forming an insulation layer on the substrate 100 to sufficiently fill the trench 110, planarizing the insulation layer until a top surface of the substrate 100 may be exposed, and removing an upper portion of the planarized insulation layer to expose an upper portion of the trench 110 may be exposed. The insulation layer may be formed to include an oxide, e.g., silicon oxide.

According as the isolation layer 120 is formed, a field region of which a top surface is covered by the isolation layer 120 and an active region of which a top surface is not covered by the isolation layer 120 may be defined in the substrate 100. The active region may protrude from the isolation layer 120 and have a fin shape so as to be referred to as an active fin.

When the upper portion of the planarized insulation layer is removed, an upper portion of the substrate 100 may be partially removed also. Thus, the active fin may be formed to include an exposed upper portion having a width smaller than that of a lower portion surrounded by the isolation layer 120.

The active region may extend in a second direction substantially parallel to the top surface of the substrate 100, and a plurality of active regions may be formed in a first direction substantially parallel to the top surface of the substrate 100 and substantially perpendicular to the second direction. Thus, the plurality of active regions may be formed in each of the first region I and the second region II. Hereinafter, the active regions in the first region I may be referred to as first active regions 102, and the active regions in the second region II may be referred to as second active regions 104.

A first gap G1 between the first active regions 102 in the first region I may be smaller than a second gap G2 between the second active regions 104 in the second region II. That is, the first active regions 102 in the first region I may be formed more densely than the second active regions 104 in the second region II.

The first region I of the substrate 100 may be a cell region in which memory cells of a static random access memory (SRAM) device or a dynamic random access memory (DRAM) device may be formed, and the second region II of the substrate 100 may be a peripheral circuit region in which peripheral circuits for driving the memory cells may be formed or a logic region in which logic devices may be formed. However, the inventive concept may not be limited thereto, and a region in which a plurality of active regions may be formed at a relatively small distance from one another may be defined as the first region I, and a region in which a plurality of active regions may be formed at a relatively large distance from one another may be defined as the second region II. For example, even in the same cell region, or in the same peripheral circuit region or logic region, a region in which a plurality of active regions may be formed at a relatively small distance from one another may be defined as the first region I, and a region in which a plurality of active regions may be formed at a relatively large distance from one another may be defined as the second region II.

Referring to FIGS. 4 to 7, first and second dummy gate structures may be formed on the first and second regions I and II, respectively, of the substrate 100.

The first and second dummy gate structures may be formed by sequentially stacking a gate insulation layer, and a dummy gate electrode layer and a gate mask layer on the first and second active regions 102 and 104 of the substrate 100 and the isolation layer 120, patterning the gate mask layer by a photolithography process using a photoresist pattern (not shown) to form first and second gate masks 152 and 154, and sequentially etching the dummy gate electrode layer and the gate insulation layer using the first and second gate masks 152 and 154 as an etching mask. Thus, the first dummy gate structure may be formed to include a first gate insulation layer pattern 132, a first dummy gate electrode 142 and the first gate mask 152 sequentially stacked on the first active region 102 of the substrate 100 and a portion of the isolation layer 120 adjacent to the first active region 102, and the second dummy gate structure may be formed to include a second gate insulation layer pattern 134, a second dummy gate electrode 144 and the second gate mask 154 sequentially stacked on the second active region 104 of the substrate 100 and a portion of the isolation layer 120 adjacent to the second active region 104.

The gate insulation layer may be formed to include an oxide, e.g., silicon oxide, the dummy gate electrode layer may be formed to include, e.g., polysilicon, and the gate mask layer may be formed to include a nitride, e.g., silicon nitride. The gate insulation layer may be formed by a chemical vapor deposition (CVD) process, an atomic layer deposition (ALD) process, etc. Alternatively, the gate insulation layer may be formed by a thermal oxidation process on an upper portion of the substrate 100. The dummy gate electrode layer and the gate mask layer may be also formed by a CVD process, an ALD process, etc.

The first dummy gate structure may be formed to extend in the first direction on the first active region 102 of the substrate 100 and the isolation layer 120, and the second dummy gate structure may be formed to extend in the first direction on the second active region 104 of the substrate 100 and the isolation layer 120. Alternatively, the first and second gate structures may not be formed on the isolation layer 120, but formed only on the first and second active regions 102 and 104, respectively, of the substrate 100.

A plurality of first dummy gate structures may be formed in the second direction, and a plurality of second dummy gate structures may be formed in the second direction. One or a plurality of first dummy gate structures may be formed on the first active regions 102, and one or a plurality of second dummy gate structures may be formed on the second active regions 104.

The first and second dummy gate structures may have widths in the second direction smaller than those of the first and second active regions 102 and 104, respectively. In exemplary embodiments, the first and second dummy gate structures may be formed to cover central portions of the first and second active regions 102 and 104, respectively, and thus edge portions of the first and second active regions 102 and 104 may not be covered by the first and second dummy gate structures, respectively.

Impurity regions (not shown) may be formed at upper portions of the first and second active regions 102 and 104 adjacent to the first and second dummy gate structures, respectively, by an ion implantation process.

Referring to FIGS. 8 to 11, a spacer 160 may be formed on the first and second dummy gate structures, the first and second active regions 102 and 104, and the isolation layer 120. The spacer layer may be formed to include a nitride, e.g., silicon nitride, silicon oxycarbonitride, etc.

Referring to FIGS. 12 to 15, a photoresist pattern 170 covering the first region I of the substrate 100 may be formed on the spacer layer 160, and a portion of the spacer layer 160 in the second region II may be partially etched using the photoresist pattern 170 as an etching mask.

Thus, the portion of the spacer layer 160 in the second region II may be transformed into a second spacer layer pattern 164 having a thickness smaller than that of the spacer layer 160 remaining in the first region I. Due to the difference of thicknesses between the spacer layer 160 and the second spacer layer pattern 164, a difference of heights between top surfaces of first and second spacers 167 and 169 subsequently formed (refer to FIGS. 18 and 19) may be generated, and thus a desired height difference between the top surfaces of the first and second spacers 167 and 169 may be obtained by controlling the process for etching the spacer layer 160.

Figure 17:
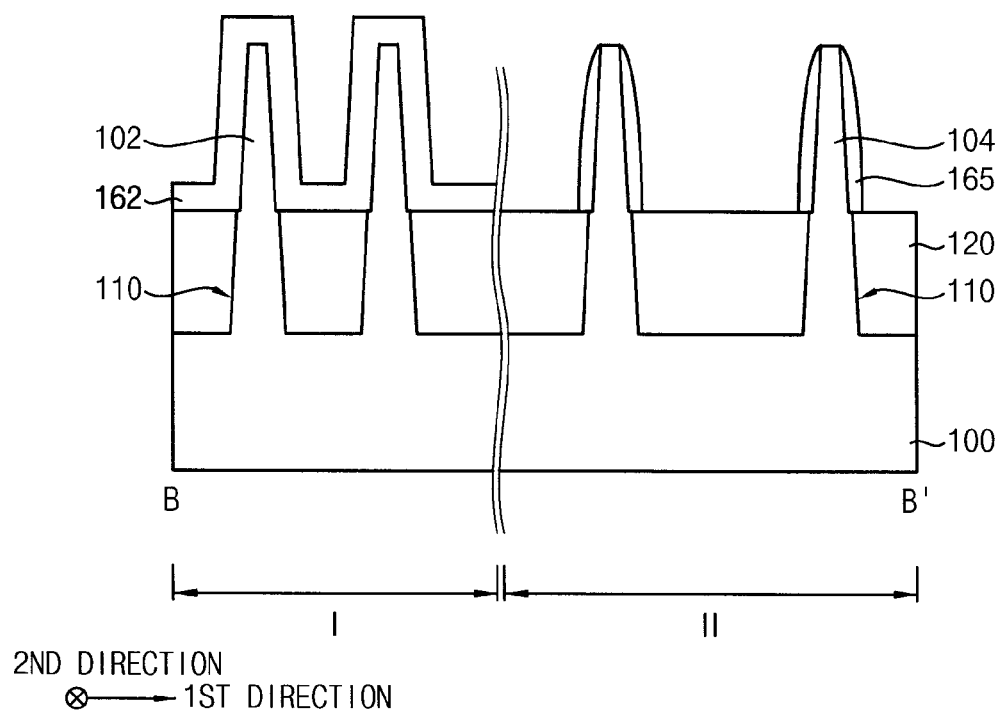

Referring to FIGS. 16 and 17, after removing the photoresist pattern 170, the spacer layer 160 and the second spacer layer pattern 164 may be etched by a first anisotropic etching process to form a first spacer layer pattern 162 and a preliminary second spacer 165, respectively, in the first and second regions I and II, respectively.

The photoresist pattern 170 may be removed by an ashing process and/or a stripping process.

The first anisotropic etching process may be performed until the preliminary second spacer 165 may be formed only on a sidewall of the second active region 104. In this case, the spacer layer 160 remaining in the first region I may have a width greater than that of the second spacer layer pattern 164 in the second region II, so that the first spacer layer pattern 162 may be conformally formed on the first active region 102 and the isolation layer 120 by the first anisotropic etching process.

The preliminary second spacer 165 may be formed on both sidewalls of the second active region 104 in the first direction, and in some cases, may be also formed on both sidewalls of the second active region 104 in the second direction.

By the first anisotropic etching process for the spacer layer 160 and the second spacer layer pattern 164, a second gate spacer 168 may be formed on a sidewall of the second dummy gate structure in the second region II. In exemplary embodiments, the second gate spacer 168 may be formed on both sidewalls of the second dummy gate structure in the second direction.

Figure 19:
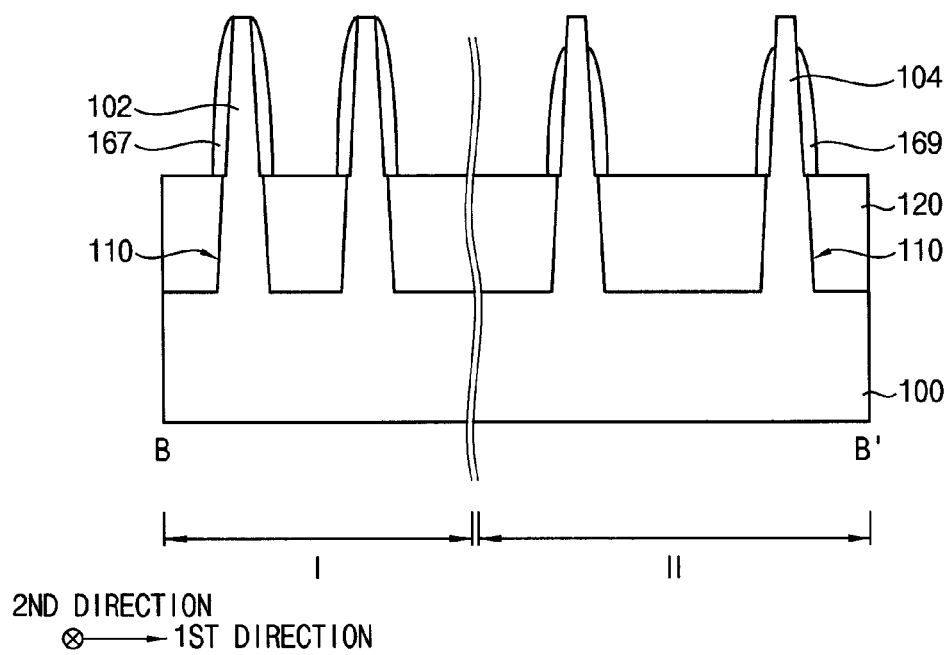
Figure 20:
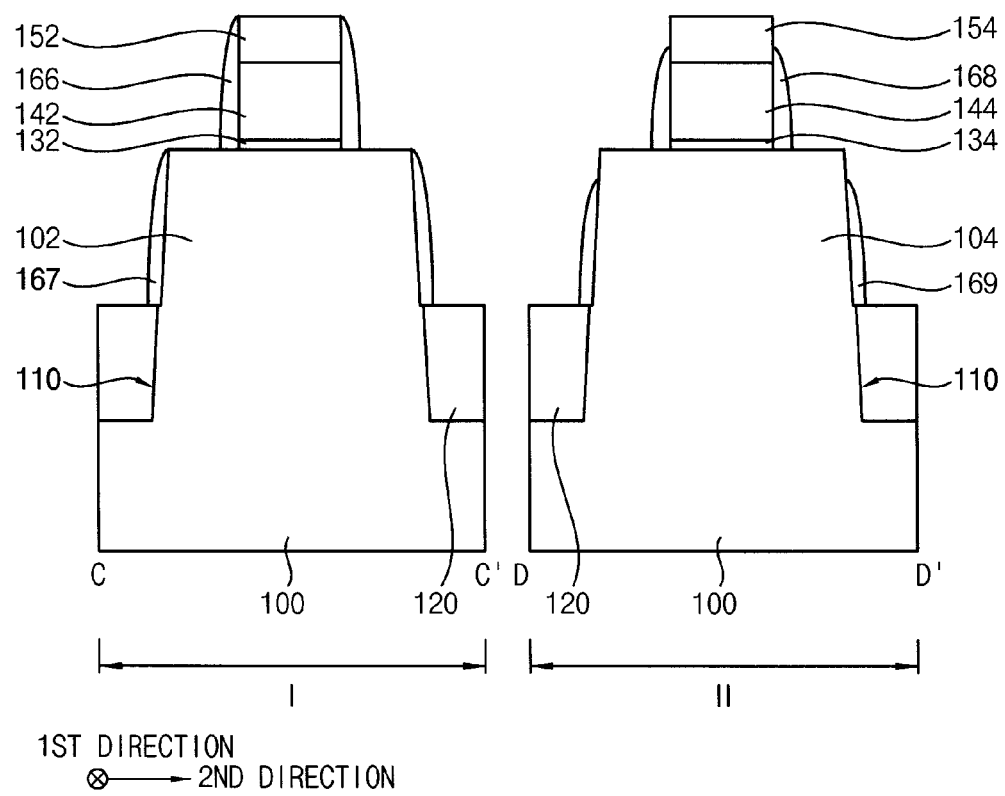

Referring to FIGS. 18 to 20, the first spacer layer pattern 162 and the preliminary second spacer 165 may be etched by a second anisotropic etching process to form the first and second spacers 167 and 169, respectively, in the first and second regions I and II, respectively.

The second anisotropic etching process may be performed until the first spacer 167 may be formed only on a sidewall of the first active region 102. In this case, an upper portion of the preliminary second spacer 165 remaining on the sidewall of the second active region 104 may be etched so that a top surface or portion (hereinafter "a top surface") of the preliminary second spacer 165 may have a reduced height and an upper sidewall of the second active region 104 may not be covered but exposed. Accordingly, a top surface of the second spacer 169 in the second region II may have a height smaller than that of a top surface of the first spacer 167 in the first region I.

The first spacer 167 may be formed on both sidewalls of the first active region 102 in the first direction, and in some cases, may be also formed on both sidewalls of the first active region 102 in the second direction.

The second anisotropic etching process may be performed until the first spacer 167 may not cover the whole sidewall of the first active region 102 but expose an upper sidewall of the first active region 102. In this case, an upper portion of the second spacer 169 may be also etched by the second anisotropic etching process, so that the top surface of the second spacer 169 may have a height smaller than that of the top surface of the first spacer 167.

By the second anisotropic etching process for the first spacer layer pattern 162 and the preliminary second spacer 165, a first gate spacer 166 may be formed on a sidewall of the first dummy gate structure in the first region I. The first gate spacer 166 may be formed on both sidewalls of the first dummy gate structure in the second direction.

Figure 21:
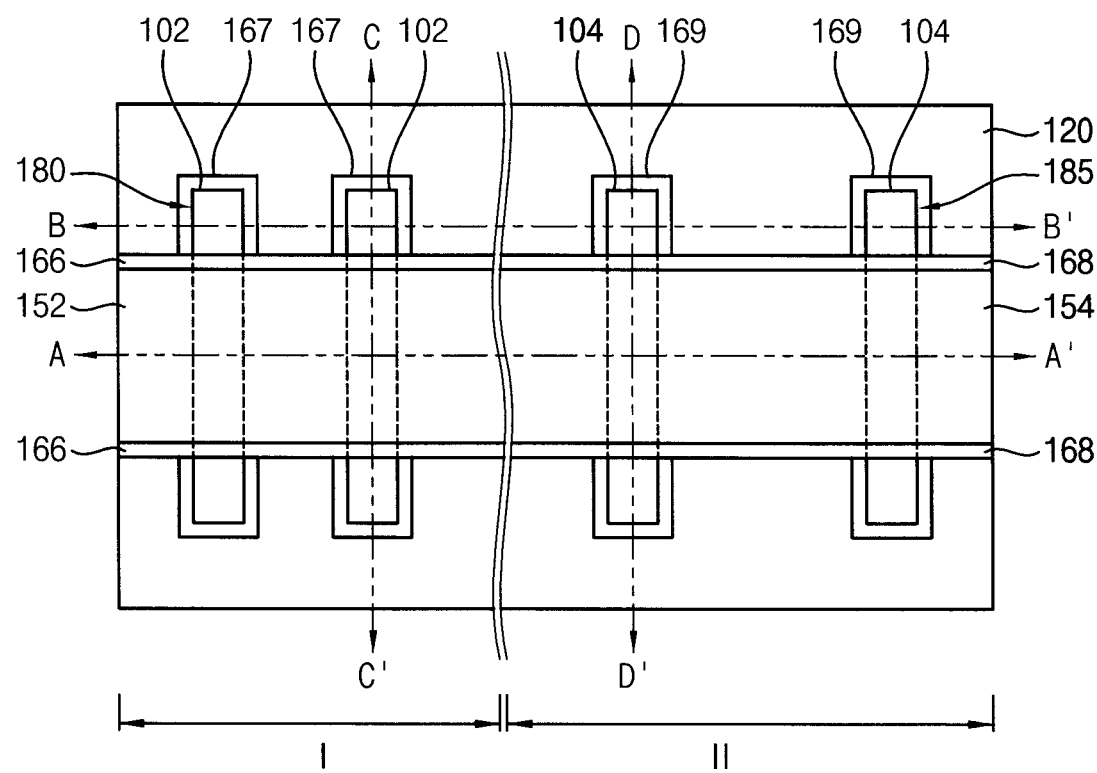
Figure 22:
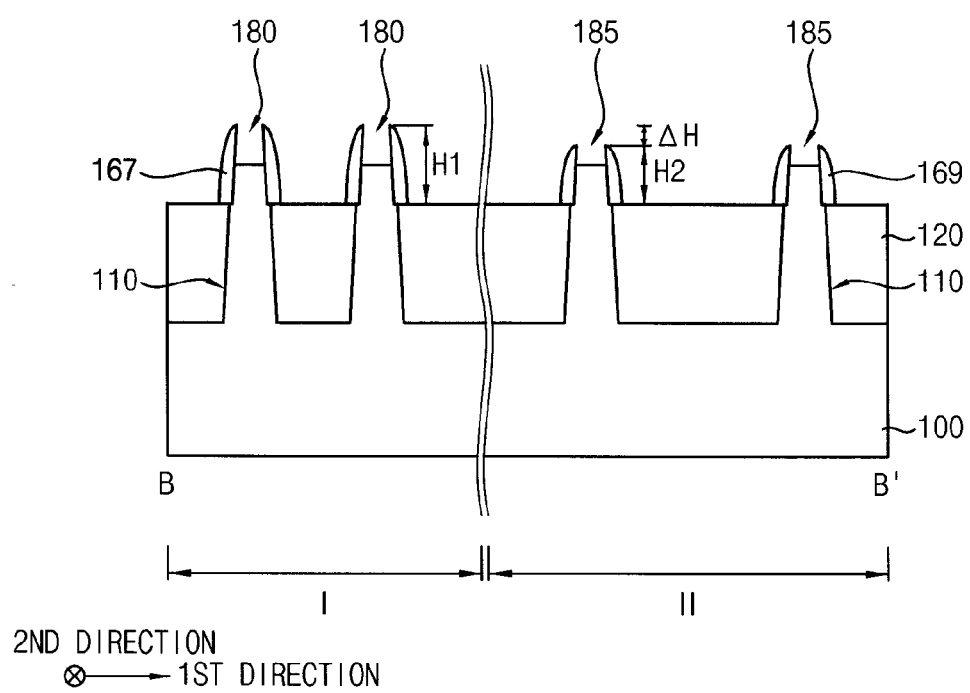
Figure 23:
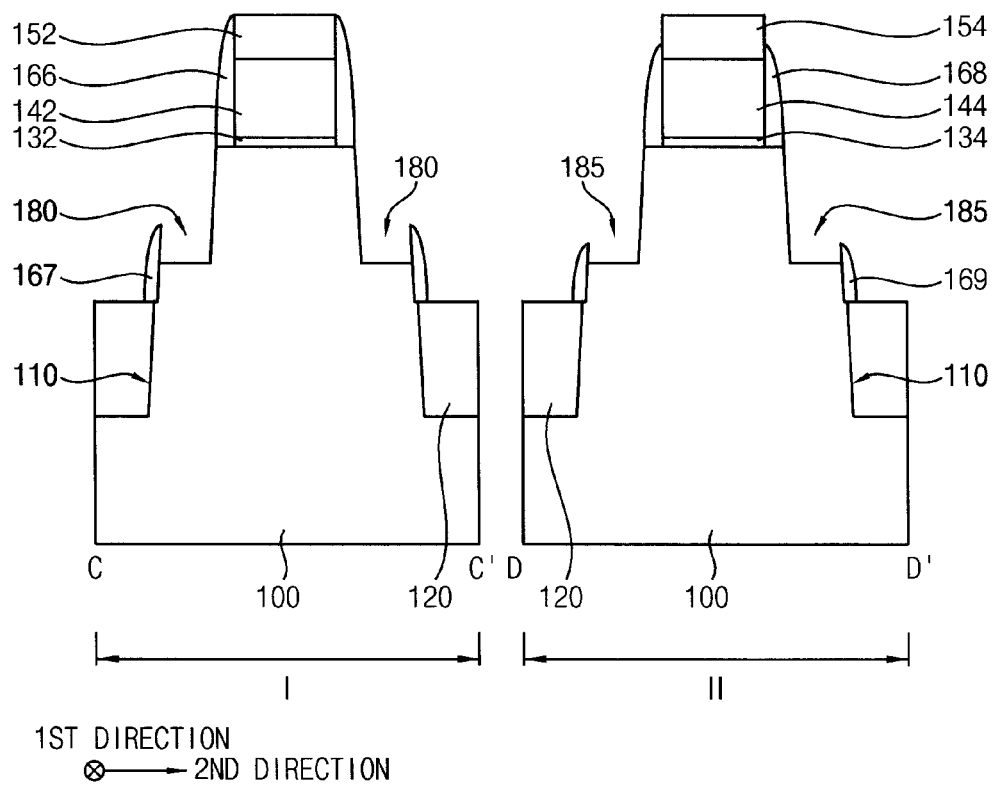

Referring to FIGS. 21 to 23, upper portions of the first and second active regions 102 and 104 not covered by the first and second dummy gate structures and the first and second gate spacers 166 and 168 may be etched to form first and second recesses 180 and 185, respectively. The first and second recesses 180 and 185 may be defined by inner sidewalls of the first and second spacers 167 and 169 on the sidewalls of the first and second active regions 102 and 104, respectively, and top surfaces of the first and second active regions 102 and 104, respectively.

In the etching process, upper portions of the first and second spacers 167 and 169 may be partially removed also, so that the top surfaces of the first and second spacers 167 and 169 may be lowered, however, the difference of heights between the top surfaces of the first and second spacers 167 and 169 may be maintained. That is, the top surfaces of the first and second spacers 167 and 169 may have first and second heights H1 and H2, respectively, from a top surface of the isolation layer 120, and the first height H1 may be greater than the second height H2 by ΔH. Thus, a distance from the top surface of the first active region 102 to the top surface of the first spacer 167, i.e., a depth of the first recess 180 may be greater than a distance from the top surface of the second active region 104 to the top surface of the second spacer 169, i.e., a depth of the second recess 185.

The etching process for forming the first and second recesses 180 and 185 may be performed in-situ with the second anisotropic etching process illustrated with reference to FIGS. 18 to 20.

Figure 24:
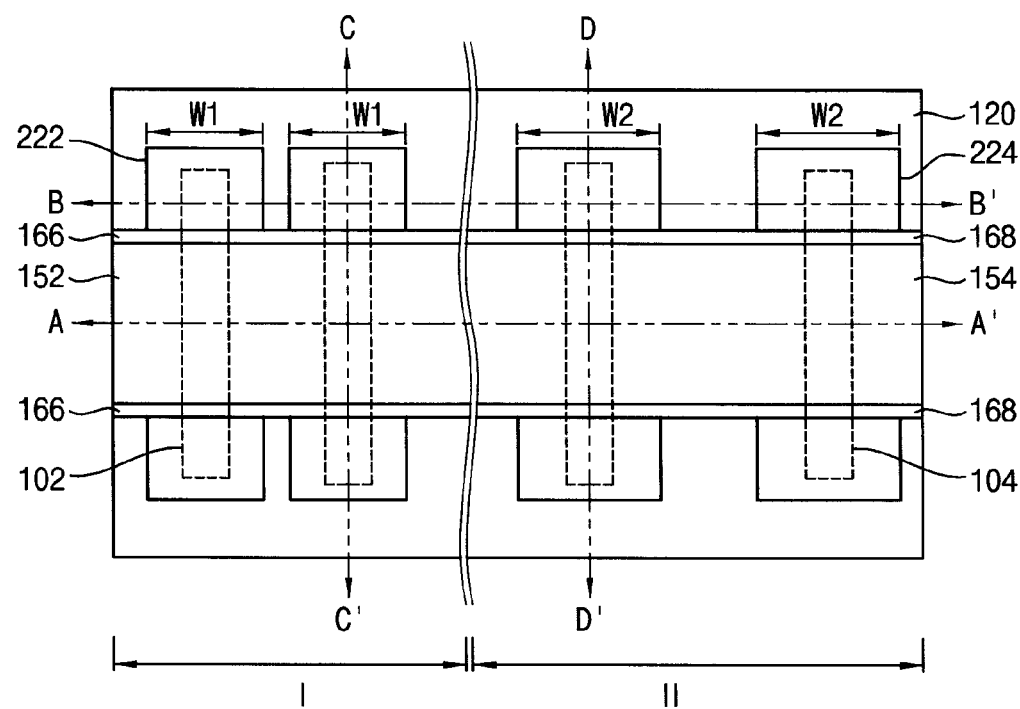
Figure 25:
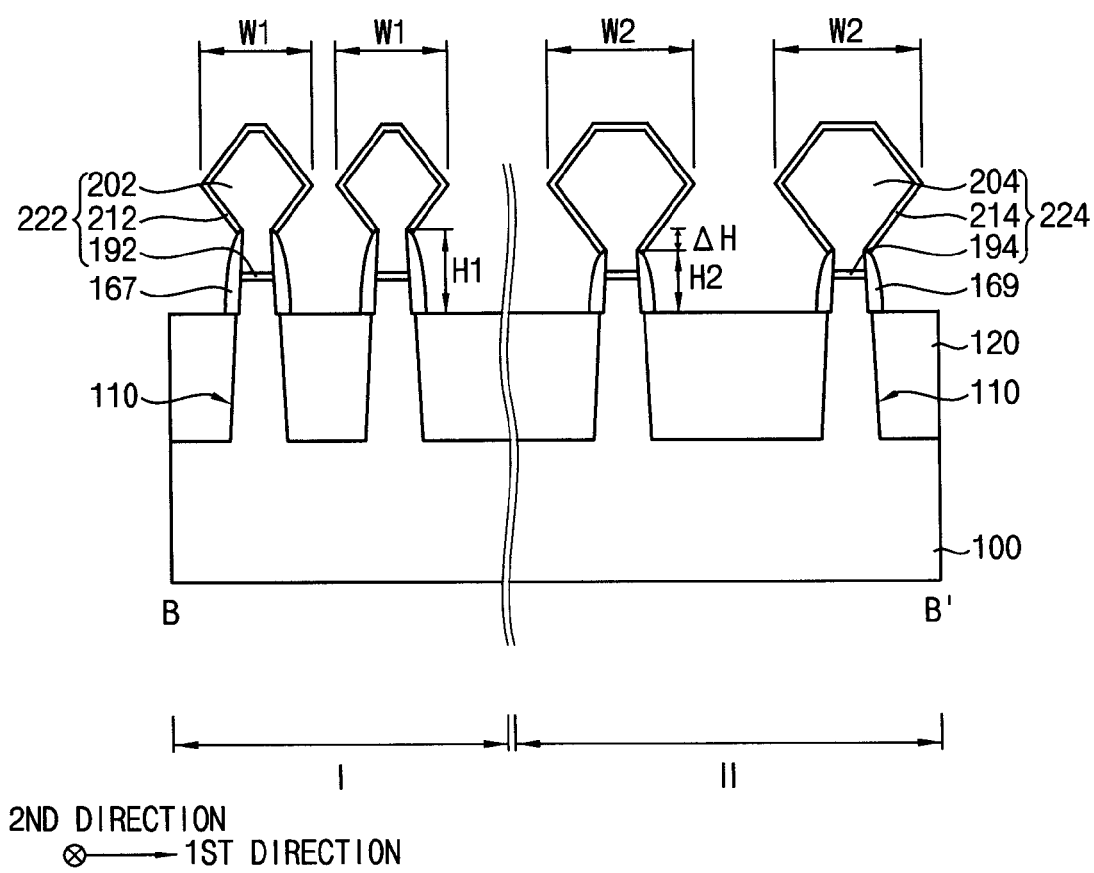
Figure 26:
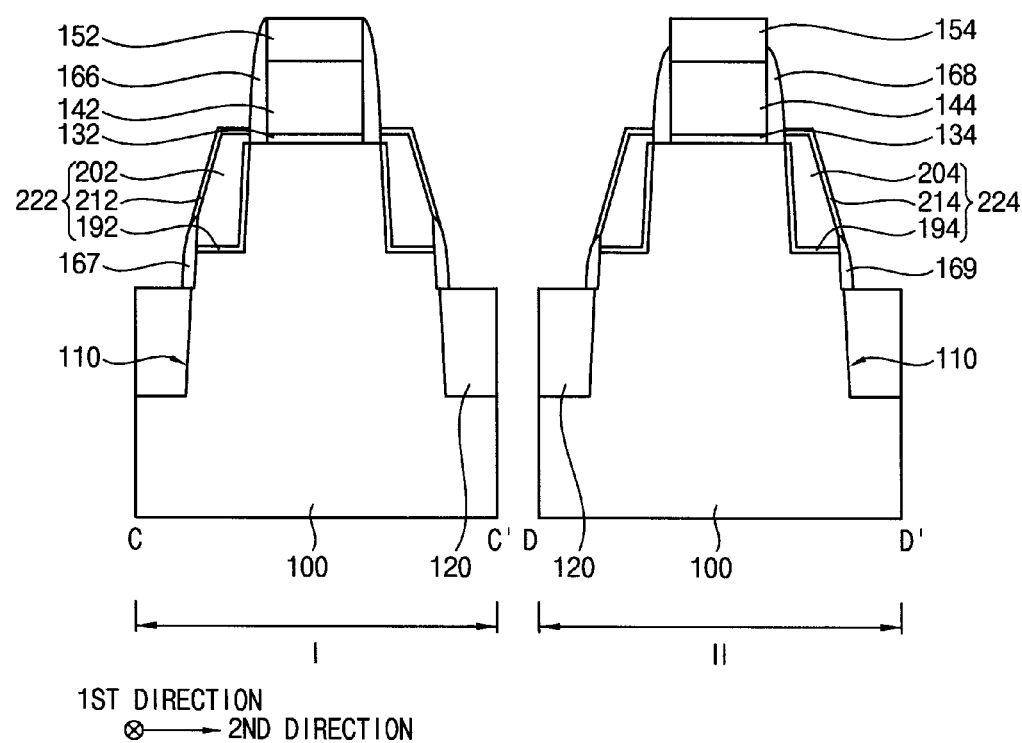

Referring to FIGS. 24 to 26, a first selective epitaxial growth (SEG) process may be performed using upper portions of the first and second active regions 102 and 104 exposed by the first and second recesses 180 and 185, respectively, as a seed to form first and second source/drain layer structures 222 and 224 on the first and second regions 120 and 104, respectively.

The first SEG process may be performed using, e.g., dichlorosilane ($SiH_2Cl_2$) gas, germane ($GeH_4$) gas, etc., as a source gas to form a single crystalline silicon-germanium layer. A p-type impurity source gas, e.g., diborane ($B_2H_6$) gas may be also used to form the single crystalline silicon-germanium layer doped with p-type impurities. Thus, each of the first and second source/drain layer structures 222 and 224 may serve as a source/drain region of a positive-channel metal oxide semiconductor (PMOS) transistor. The first SEG process may be performed further using hydrogen ($H_2$) gas and hydrogen chloride (HCl) gas.

The first source/drain layer structure 222 may be formed to include a first lower buffer layer 192, a first source/drain layer 202 and a first upper buffer layer 212 sequentially stacked on the first active region 102, and the second source/drain layer structure 224 may be formed to include a second lower buffer layer 194, a second source/drain layer 204 and a second upper buffer layer 214 sequentially stacked on the second active region 104.

Flow rates of the source gas and the impurity gas used in the first SEG process may be controlled such that the first and second lower buffer layers 192 and 194 may be formed to have relatively low contents of germanium and p-type impurities, and the first and second source/drain layers 202 and 204 may be formed to have relatively high contents of germanium and p-type impurities. Additionally, the first and second upper buffer layers 212 and 214 may be formed to have no germanium and a relatively low content of p-type impurities.

According as the first and second lower buffer layers 192 and 194 have the relatively low content of germanium, when the substrate 100 is a silicon substrate, the first and second lower buffer layers 192 and 194 may reduce the lattice mismatch between the first and second active regions 102 and 104 and the first and second source/drain layers 202 and 204, respectively. According as the first and second upper buffer layers 192 and 194 have no germanium, when contact holes (not shown) exposing top surfaces of the first and second source/drain layer structures 222 and 224 are formed, the first and second source/drain layer structures 222 and 224 may be prevented from being etched quickly.

The first and second lower buffer layers 192 and 194 may fill lower portions of the first and second recesses 180 and 185, respectively, defined by the inner sidewalls of the first and second spacers 167 and 169 and the top surfaces of the first and second active regions 102 and 104, respectively.

The first and second source/drain layers 202 and 204, which may be single crystalline silicon-germanium layers, may fill upper portions of the first and second recesses 180 and 185, respectively, and further protrude from the first and second spacers 167 and 169, respectively. The first and second source/drain layers 202 and 204 may be grown not only in the vertical direction but also in the horizontal direction, and thus may have a cross-section cut along the first direction of which a shape is pentagon or hexagon.

The first recess 180 may have a width greater than that of the second recess 185 due to the height difference ΔH between the top surfaces of the first and second spacers 167 and 169, and thus a degree to which a horizontal growth of the first source/drain layer 202 may be restricted by the first spacer 167 may be greater than a degree to which a horizontal growth of the second source/drain layer 204 may be restricted by the second spacer 169. Thus, when the first and second source/drain layers 202 and 204 grow to substantially the same height, a first maximum width W1 of the first source/drain layer 202 in the first direction may be smaller than a second maximum width W2 of the second source/drain layer 204 in the first direction.

Accordingly, even though the first gap G1 between the first active regions 102 is smaller than the second gap G2 between the second active regions 104, neighboring first source/drain layer structures 222 may not contact each other so as to prevent an electrical short therebetween.

The second source/drain layer structures 224 on the second active regions 104 disposed at the second gap G2 greater than the first gap G1 may be formed to have relatively large volumes, and thus the transistor including the second source/drain layer structures 224 may have enhanced electrical performance.

That is, by controlling the heights of the spacers 167 and 169 on both sidewalls of the first and second active regions 102 and 104, respectively, the electrical short between transistors on the first active regions 102 disposed at a relatively small distance may be prevented, and simultaneously, transistors on the second active regions 104 disposed at a relatively large distance may have enhanced electrical performance.

The first and second upper buffer layers 212 and 214, which may be single crystalline silicon layers, may be formed on the first and second source/drain layers 202 and 204, respectively, and also on the top surfaces of the first and second spacers 167 and 169, respectively.

Figure 28:
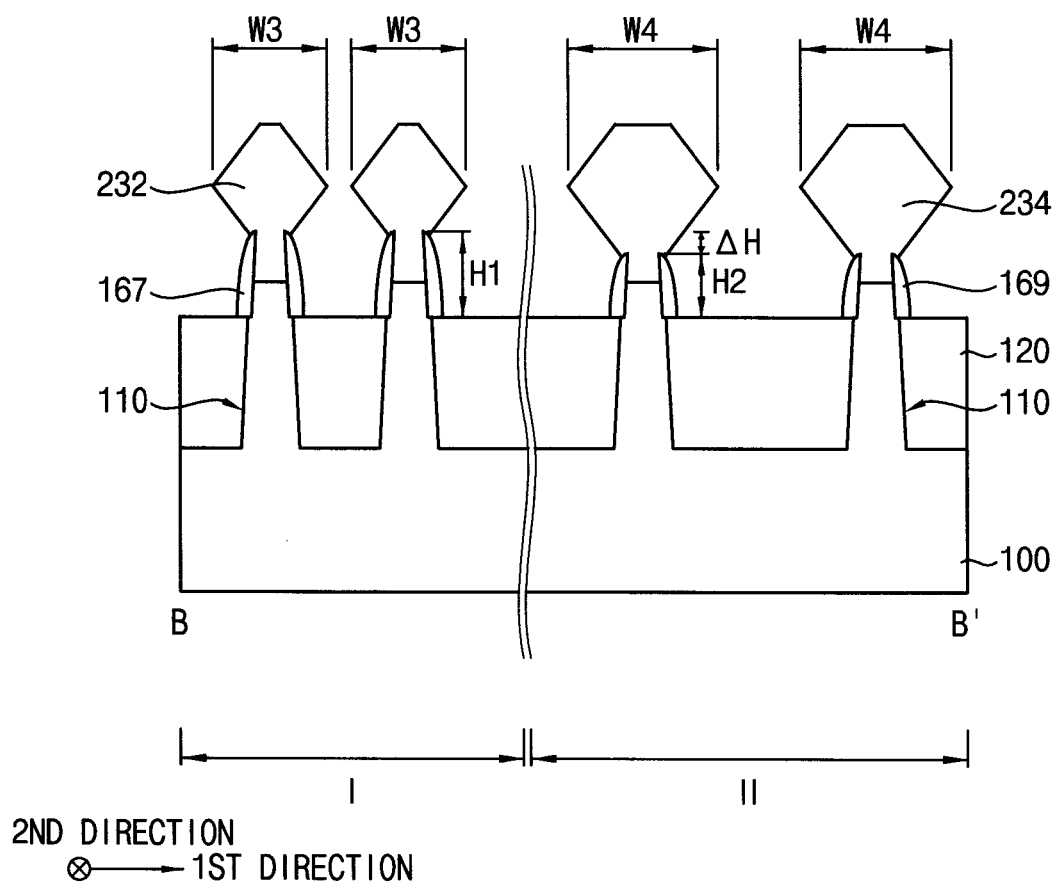
Figure 29:
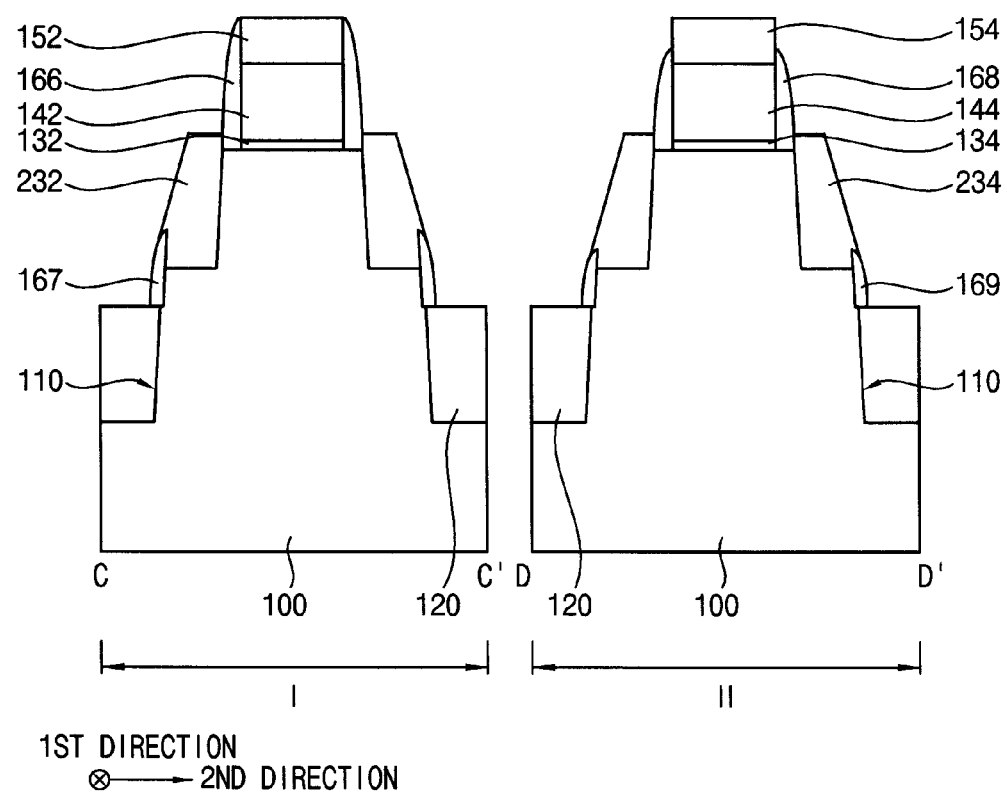

Until now, the first and second source/drain layer structures 222 and 224 serving as source/drain regions of a PMOS transistor have been illustrated, however, third and fourth source/drain layer structures 232 and 234 serving as source/drain regions of a negative-channel metal oxide semiconductor (NMOS) transistor may be also formed, which are shown in FIGS. 27 to 29.

Referring to FIGS. 27 to 29, a second selective epitaxial growth (SEG) process may be performed using upper portions of the first and second active regions 102 and 104 exposed by the first and second recesses 180 and 185, respectively, as a seed to form third and fourth source/drain layer structures 232 and 234 on the first and second regions 120 and 104, respectively.

The second SEG process may be performed using, e.g., dichlorosilane ($SiH_2Cl_2$) gas, methylsilane ($SiH_3CH_3$) gas, etc., as a source gas to form a single crystalline silicon carbide layer. An n-type impurity source gas, e.g., phosphine ($PH_3$) gas may be also used to form the single crystalline silicon carbide layer doped with n-type impurities. Thus, the third and fourth source/drain layer structures 232 and 234 serving as source/drain regions of an NMOS transistor may be formed on the first and second active regions 102 and 104, respectively. Alternatively, the second SEG process may be performed using only the silicon source gas such as dichlorosilane ($SiH_2Cl_2$) gas without using the carbon source gas such as methylsilane ($SiH_3CH_3$) gas so that a single crystalline silicon layer may be formed.

Each of the third and fourth source/drain layer structures 232 and 234 may be formed to have a single layer structure unlike the first and second source/drain layer structures 222 and 224.

The third and fourth source/drain layer structures 232 and 234, each of which may include a single crystalline silicon carbide layer or a single crystalline silicon layer, may fill the first and second recesses 180 and 185, respectively, and further protrude from the first and second spacers 167 and 169, respectively. The third and fourth source/drain layer structures 232 and 234 may be grown not only in the vertical direction but also in the horizontal direction, and thus may have a cross-section cut along the first direction of which a shape is pentagon or hexagon.

Similarly to the first and second source/drain layers 202 and 204, a degree to which a horizontal growth of the third and fourth source/drain layer structures 232 and 234 may be restricted by the first and second spacers 167 and 169, respectively, and a third maximum width W3 of the third source/drain layer structure 232 in the first direction may be smaller than a fourth maximum width W4 of the fourth source/drain layer structure 234 in the first direction due to the height difference ΔH between the first and second spacers 167 and 167. However, unlike the first and second source/drain layers 202 and 204, the third and fourth source/drain layer structures 232 and 234 may be also formed on the top surfaces of the first and second spacers 167 and 169, respectively.

Accordingly, an electrical short between the third source/drain layer structures 232 may be prevented, and a transistor including the fourth source/drain layer structures 234 may have an enhanced electrical performance.

Hereinafter, only the PMOS transistor will be illustrated for the convenience of explanation.

Figure 30:
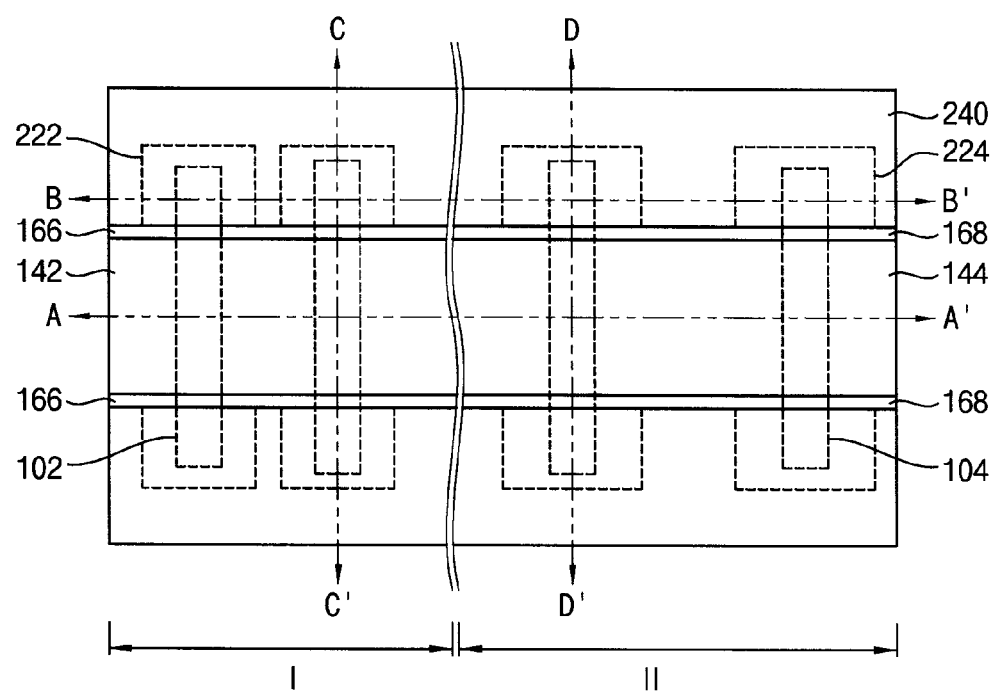
Figure 31:
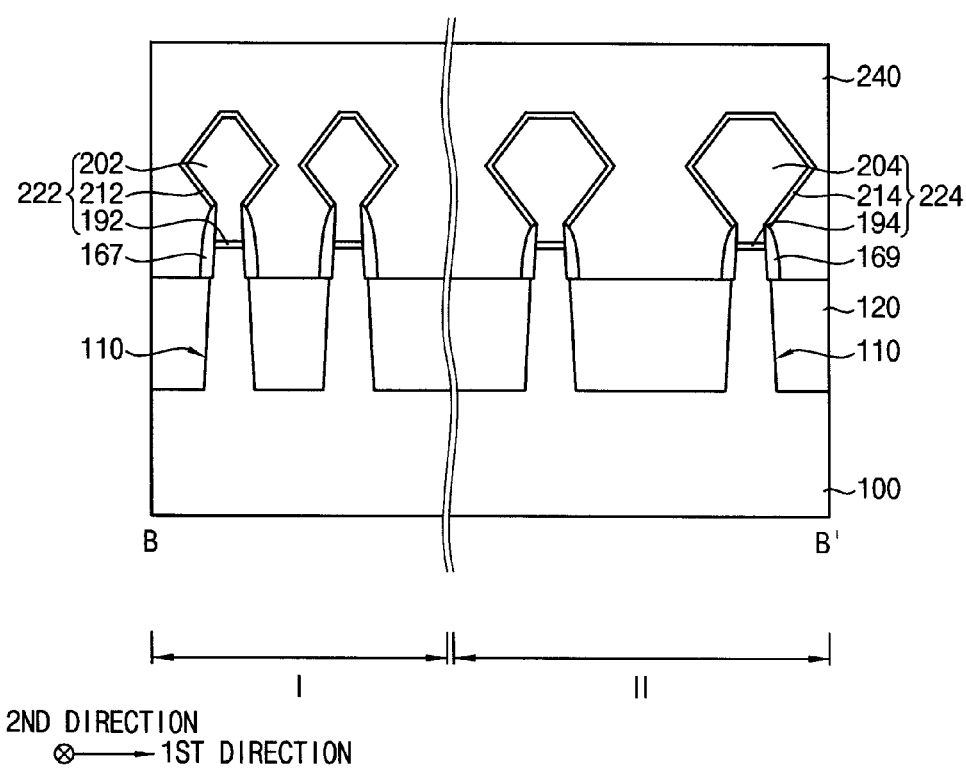
Figure 32:
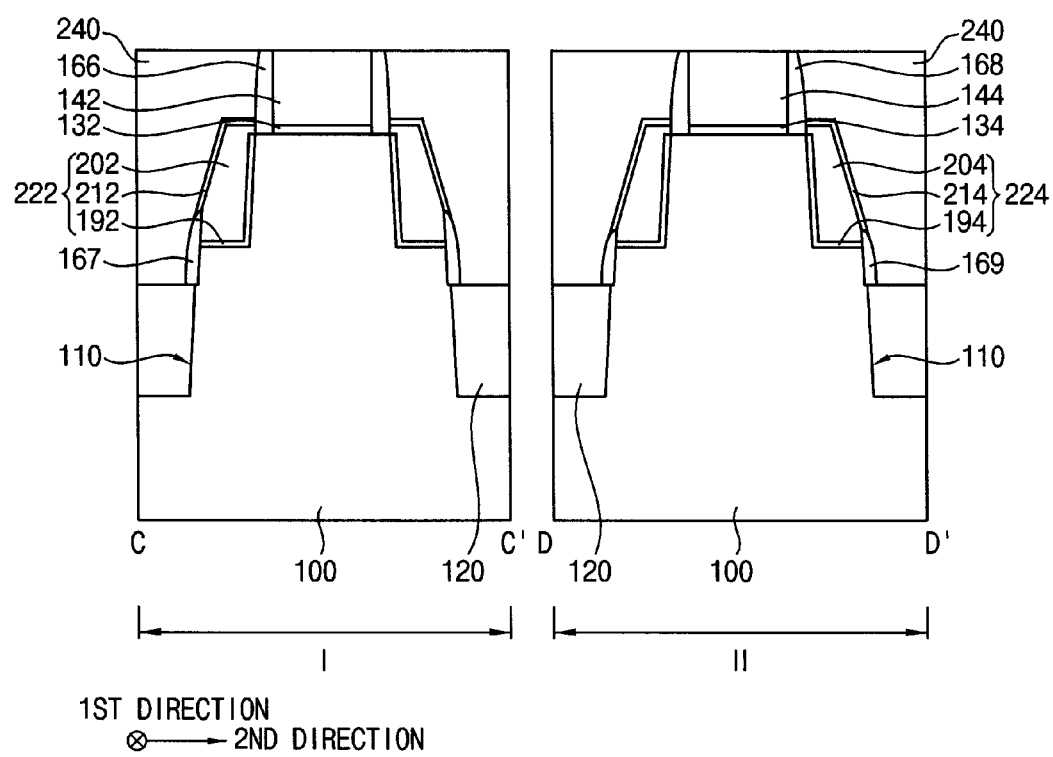
Figure 34:
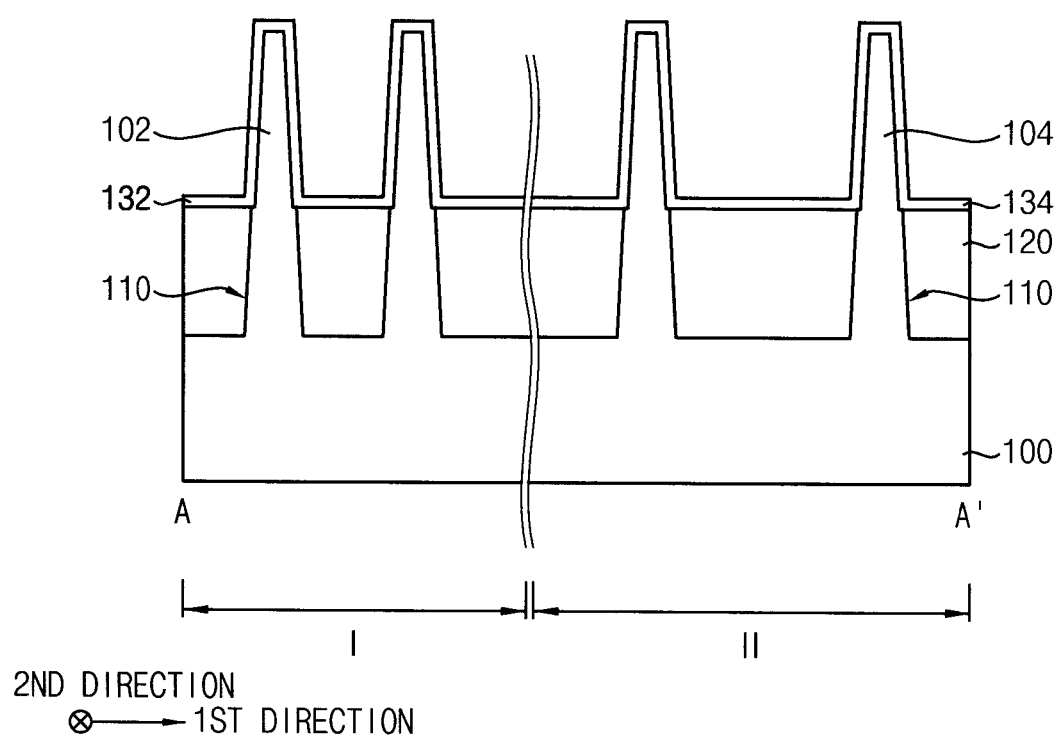

Referring to FIGS. 30 to 32, an insulating interlayer 240 covering the first and second dummy gate structures, the first and second gate spacers 166 and 168, the first and second source/drain layer structures 222 and 224, the first and second spacers 167 and 169, and the isolation layer 120 may be formed to a sufficient height on the substrate 100, and the insulating interlayer 240 may be planarized until top surfaces of the first and second dummy gate electrodes 142 and 144 of the first and second dummy gate structures, respectively, may be exposed. During the planarization process, the first and second gate masks 152 and 154 of the first and second dummy gate structures, respectively, and upper portions of the first and second gate spacers 166 and 168 may be also removed. In exemplary embodiments, the planarization process may be performed by a chemical mechanical polishing (CMP) process and/or an etching process.

Referring to FIGS. 33 to 36, the exposed first and second dummy gate electrodes 142 and 144 may be removed to form first and second openings 250 and 255 exposing top surfaces of the first and second gate insulation layer patterns 132 and 134, respectively.

The first and second dummy gate electrodes 142 and 144 may be sufficiently removed by performing a dry etch process and performing a wet etch process. The wet etch process may be performed using, e.g., hydrofluoric acid (HF) as an etching solution.

Figure 35:
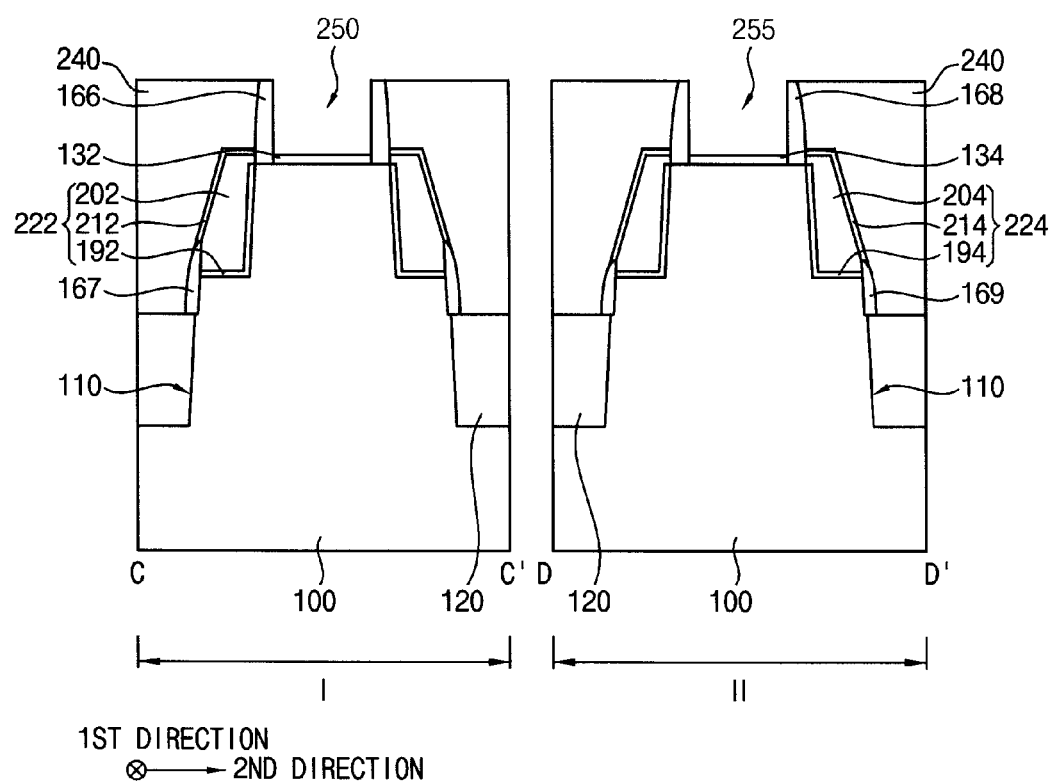
Figure 37:
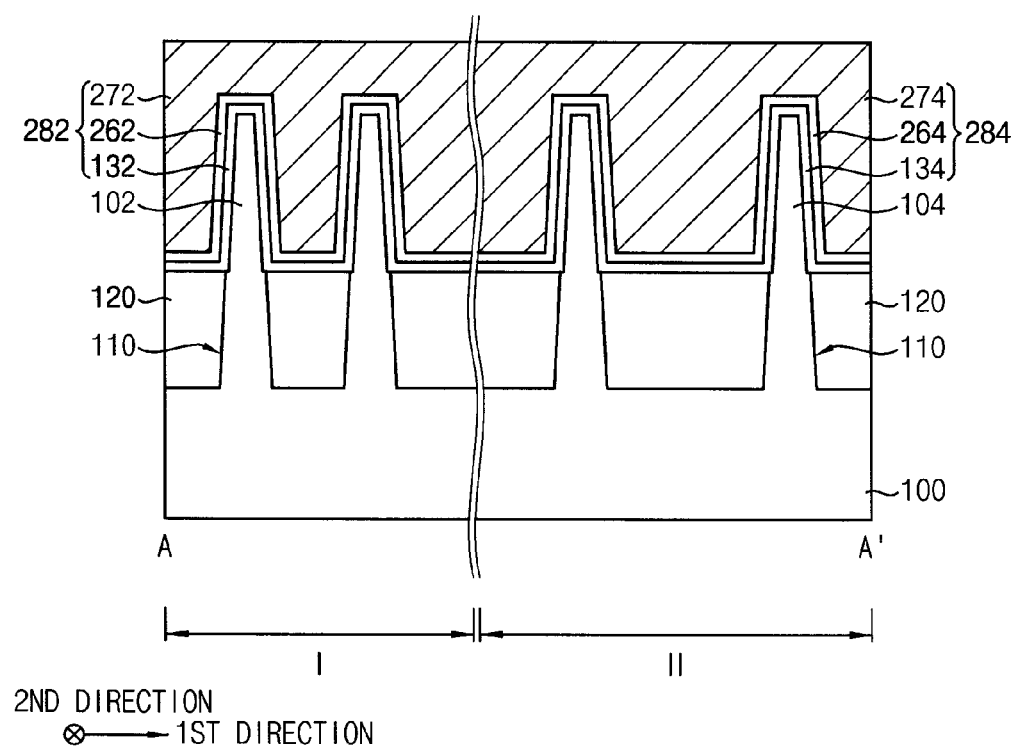
Figure 38:
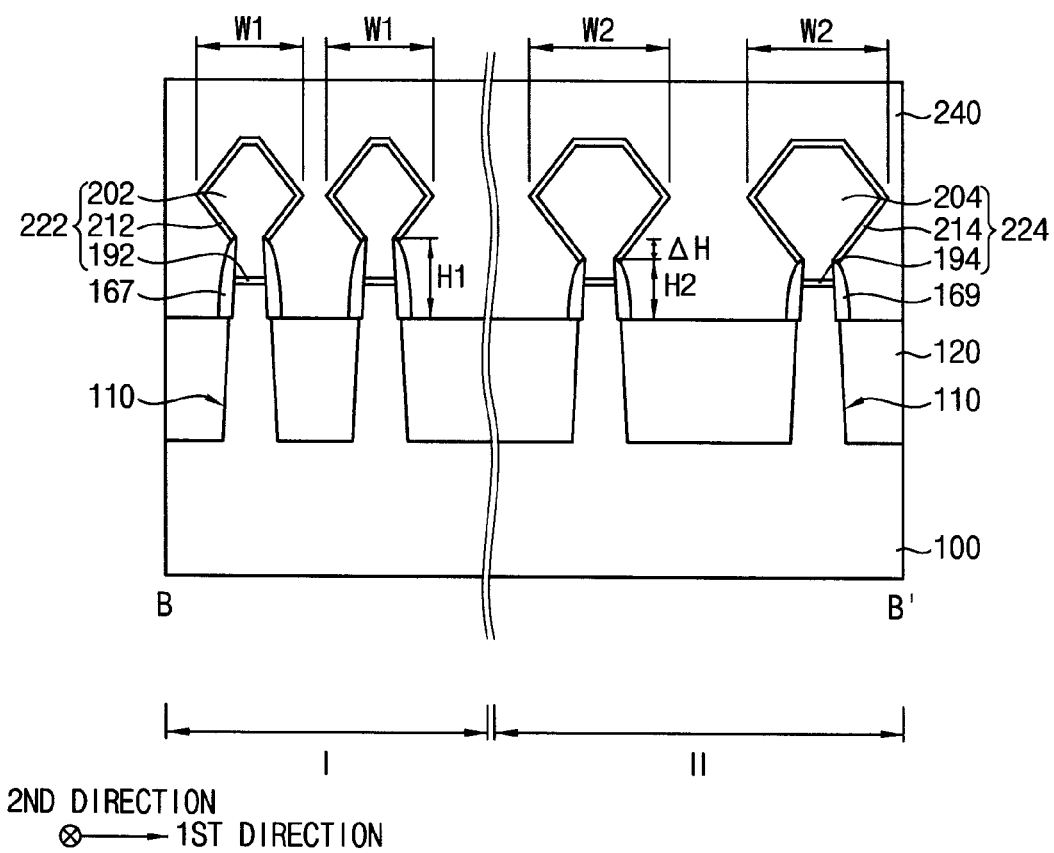
Figure 39:
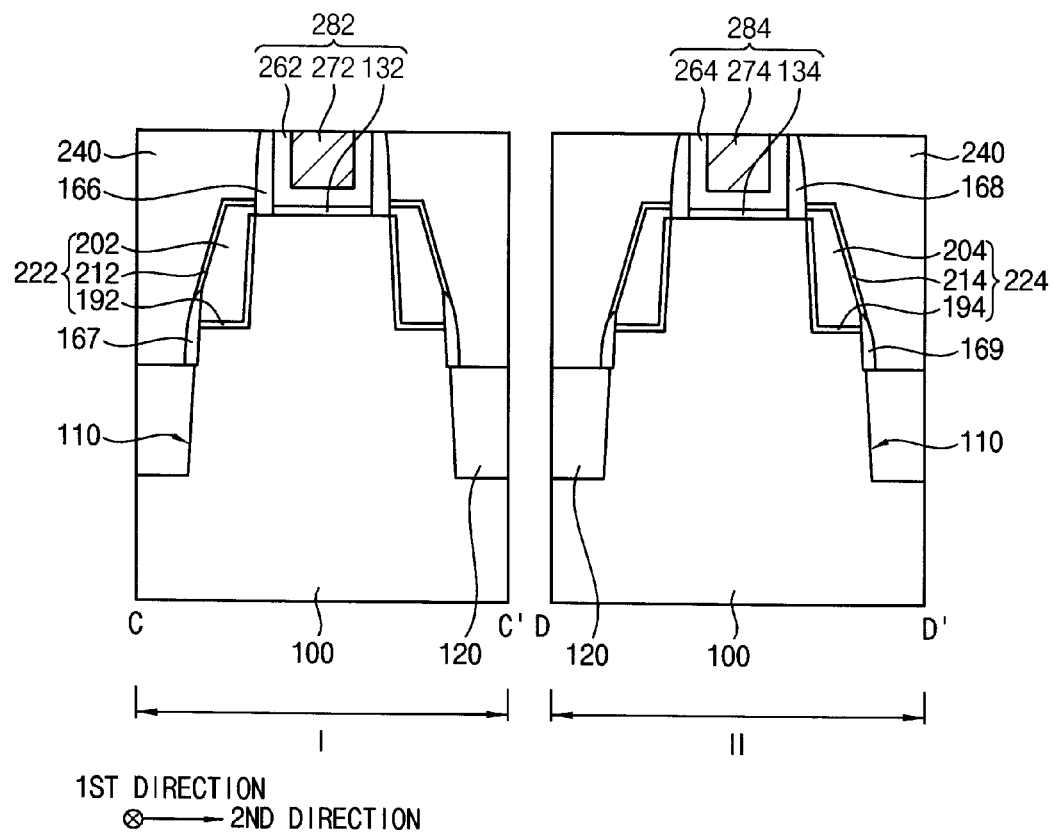

Referring to FIGS. 36 to 39, a first high-k dielectric layer pattern 262 and a first gate electrode 272 may be formed to fill the first opening 250 (FIG. 35), and a second high-k dielectric layer pattern 264 and a second gate electrode 274 may be formed to fill the second opening 255 (FIG. 35).

Particularly, a high-k dielectric layer may be formed on the exposed top surfaces of the first and second gate insulation layer patterns 132 and 134, sidewalls of the first and second openings 250 and 255, and a top surface of the insulating interlayer 240, and a gate electrode layer may be formed on the high-k dielectric layer to sufficiently fill remaining portions of the first and second openings 250 and 255.

The high-k dielectric layer may be formed to include a metal oxide having a high dielectric constant, e.g., hafnium oxide, tantalum oxide, zirconium oxide, etc. The gate electrode layer may be formed to include a material having a low resistance, e.g., a metal such as aluminum, copper, tantalum, etc., or a metal nitride thereof by an ALD process, a physical vapor deposition (PVD) process, etc. A heat treatment process, e.g., a rapid thermal annealing (RTA) process, a spike rapid thermal annealing (spike RTA) process, a flash rapid thermal annealing (flash RTA) process or a laser annealing process may be further performed. Alternatively, the gate electrode layer may be formed to include doped polysilicon.

The gate electrode layer and the high-k dielectric layer may be planarized until the top surface of the insulating interlayer 240 may be exposed to form the first and second high-k dielectric layer patterns 262 and 264 on the top surfaces of the first and second gate insulation layer patterns 132 and 134 and the sidewalls of the first and second openings 250 and 255, respectively, and the first and second gate electrodes 272 and 274 filling the remaining portions of the first and second openings 250 and 255 on the first and second high-k dielectric layer patterns 262 and 264, respectively. Thus, bottoms and sidewalls of the first and second gate electrodes 272 and 274 may be covered by the first and second high-k dielectric layer patterns 262 and 264, respectively. The planarization process may be performed by a CMP process and/or an etch back process.

The first gate insulation layer pattern 132, the first high-k dielectric layer pattern 262 and the first gate electrode 272 sequentially stacked may form a first gate structure 282, and the second gate insulation layer pattern 134, the second high-k dielectric layer pattern 264 and the second gate electrode 274 sequentially stacked may form a second gate structure 284.

The first gate structure 282 and the first source/drain layer structure 222 adjacent thereto may form a PMOS transistor, and the second gate structure 284 and the second source/drain layer structure 224 adjacent thereto may also form a PMOS transistor.

An insulating interlayer (not shown) covering the transistors may be formed, and a contact plug (not shown) may be further formed through the insulating interlayer to be electrically connected to the first and second source/drain layer structures 222 and 224 or the first and second gate structures 282 and 284.

The semiconductor device manufactured by the above processes may include the substrate 100 having the field region on which the isolation layer 120 is formed and the first and second active regions 102 and 104 protruding from the isolation layer 120, the first and second gate structures 282 and 284 on the first and second active regions 102 and 104, respectively, the first and second spacers 167 and 169 on the sidewalls of the first and second active regions 102 and 104, respectively, having the top surfaces formed to be higher than those of the first and second active regions 102 and 104, respectively, and heights of the first and second spacers 167 and 169 being different from each other, and the first and second source/drain layer structures 222 and 224 being adjacent to the first and second gate structures 282 and 284 and contacting the first and second spacers 167 and 169, respectively, on the first and second active regions 102 and 104, respectively.

According as the first and second spacers 167 and 169 on the sidewalls of the first and second active regions 102 and 104 may have the heights different from each other, the horizontal growth of the first source/drain layer structures 222 that may be formed by an SEG process on the first active regions 102 disposed at a relatively small distance from each other may be much restricted by the first spacer 167 having a relatively high top surface to have a relatively narrow width, so that an electrical short between the first source/drain layer structures 222 may be prevented. However, the horizontal growth of the second source/drain layer structures 224 that may be formed by the SEG process on the second active regions 104 disposed at a relatively large distance from each other may be little restricted by the second spacer 169 having a relatively low top surface to have a relatively wide width, so that the transistor including the second source/drain layer structures 224 may have an enhanced electrical performance.

In the above exemplary embodiments, the relatively narrow width of the first source/drain layer structure 222 is achieved by the relatively high top surfaces of the first spacers 167. However, the inventive concept is not limited to the relatively high top surfaces of the first spacers 167 to achieve this relatively narrow width of the first source/drain layer structure 222.

Figure 40:
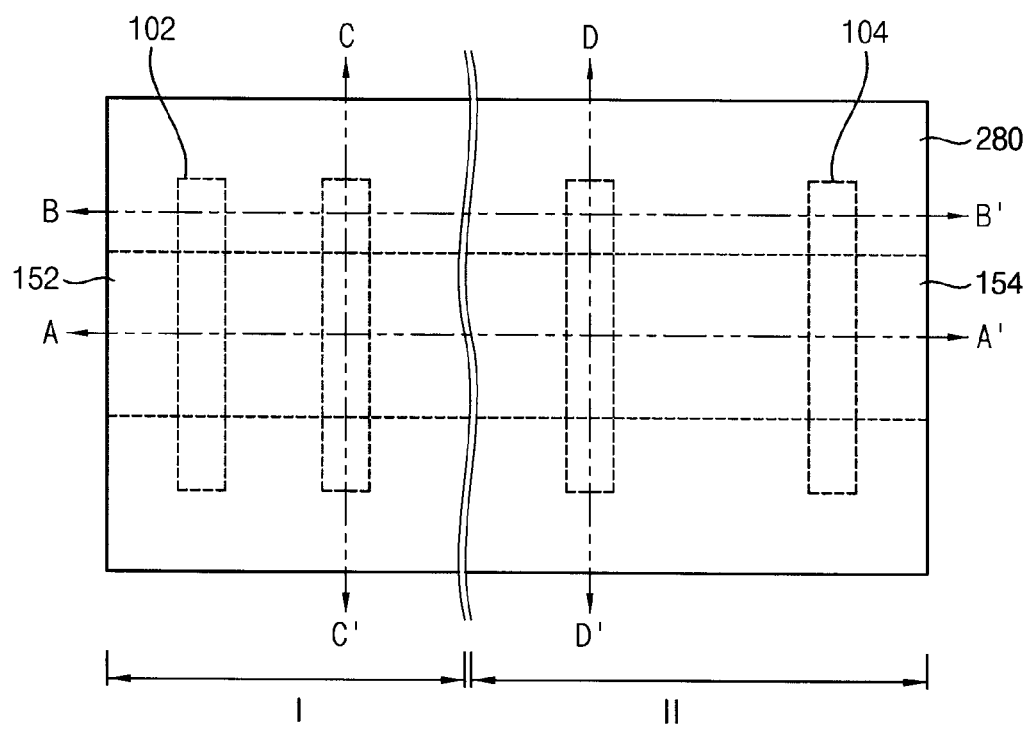

FIGS. 40 to 50 are plan views and cross-sectional views illustrating stages of a method of manufacturing a semiconductor device in accordance with exemplary embodiments. Particularly, FIGS. 40 and 44 are plan views, and FIGS. 41-43 and 45-50 are cross-sectional views.

Figure 41:
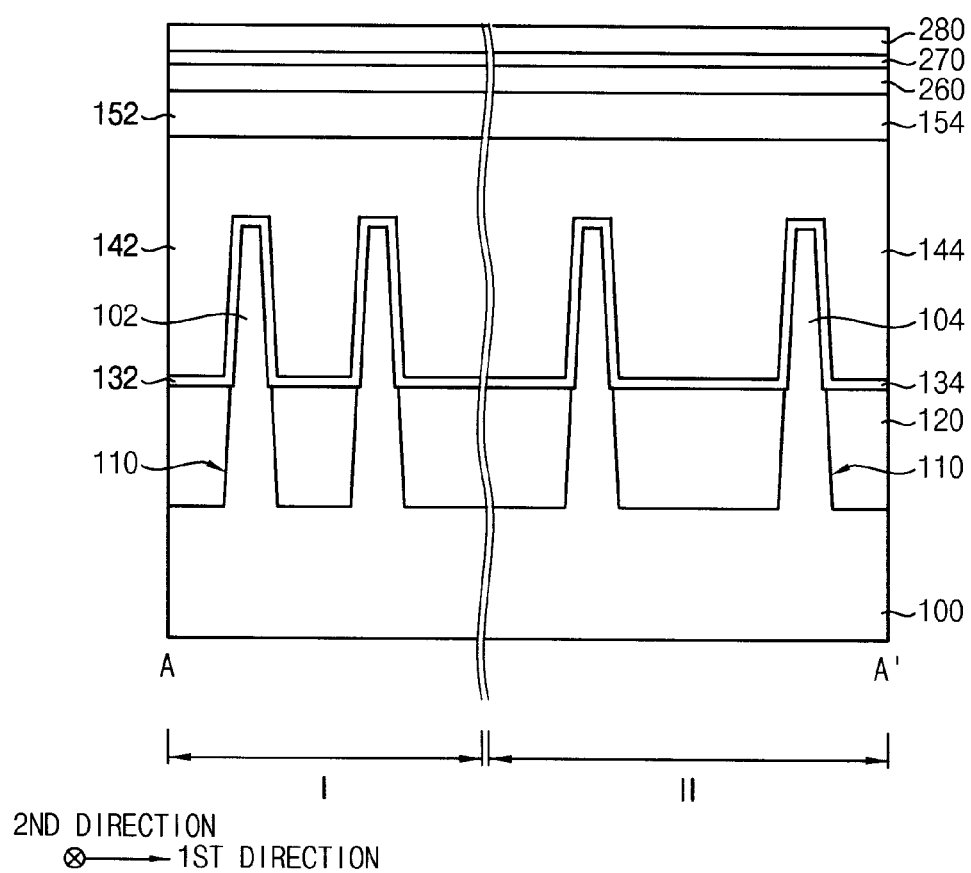
Figure 42:
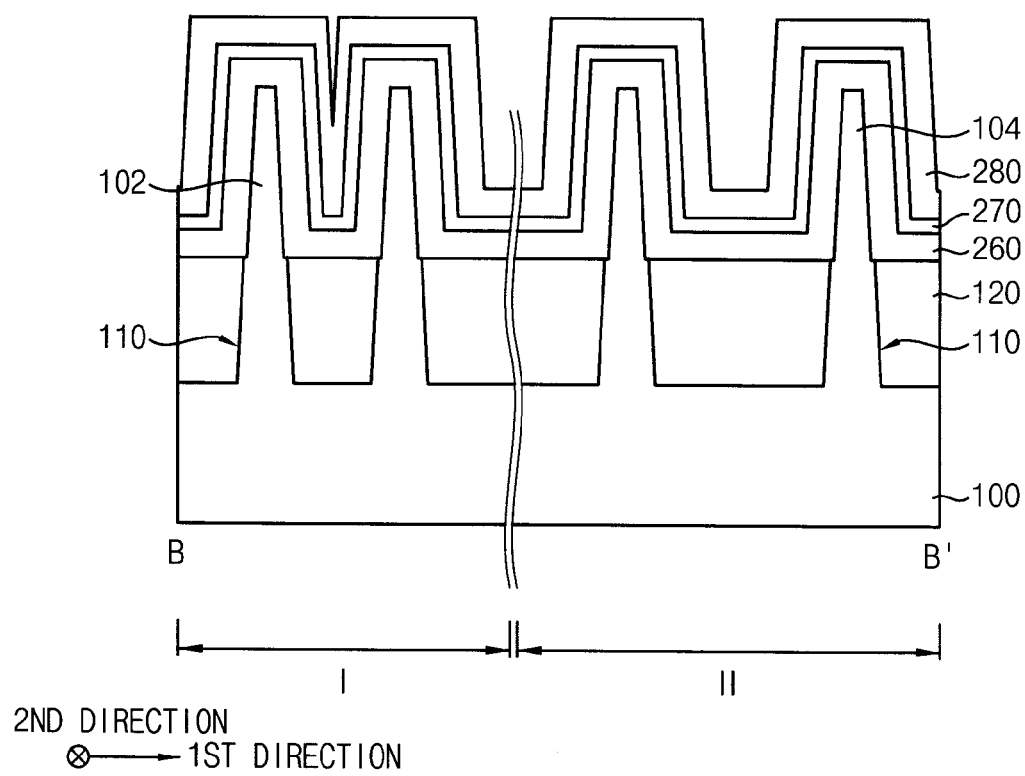
Figure 43:
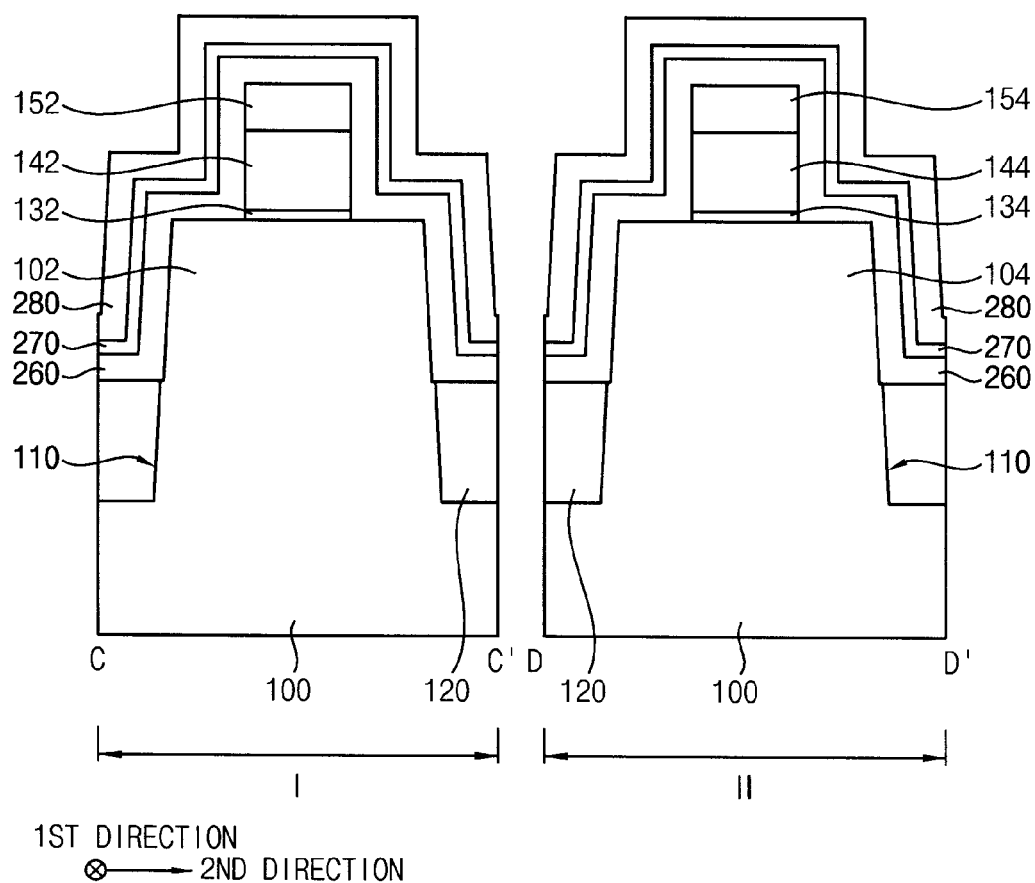
Figure 45:
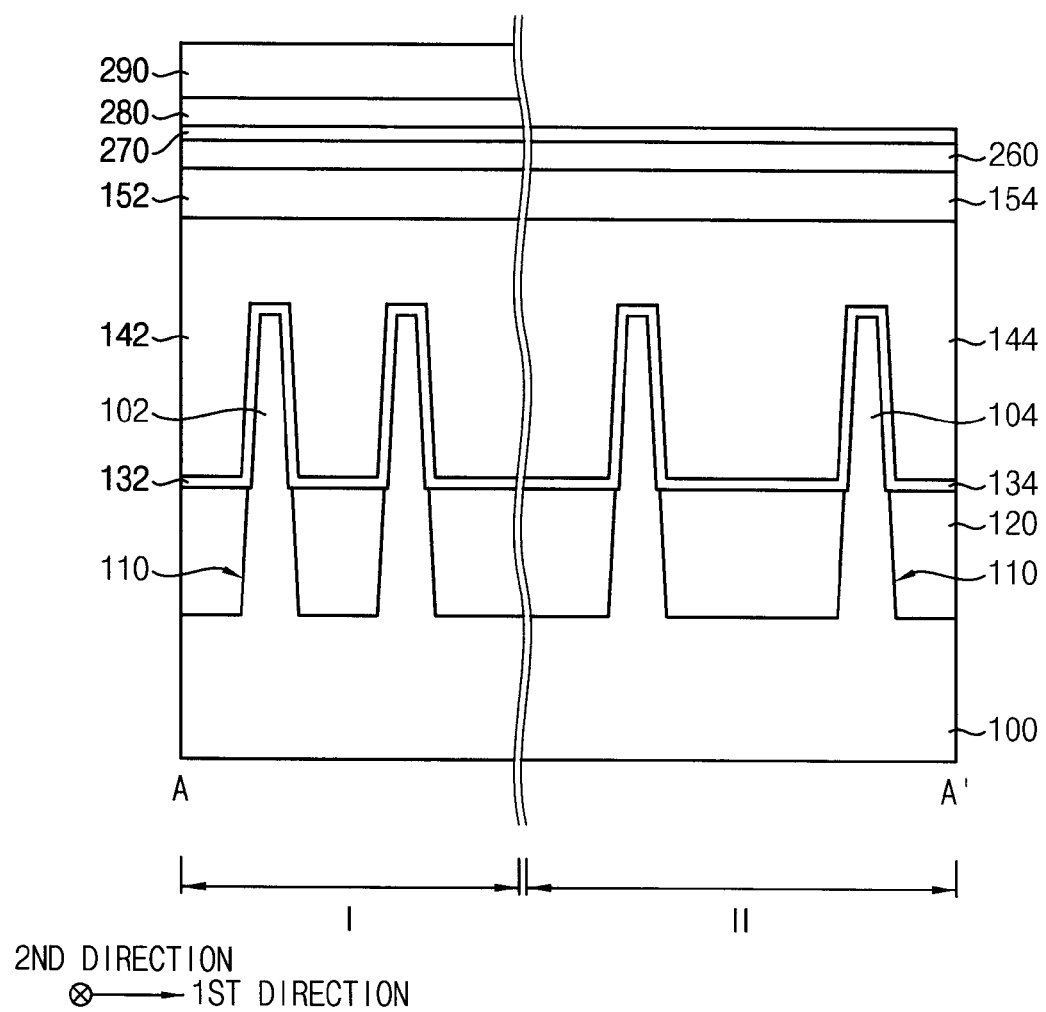
Figure 46:
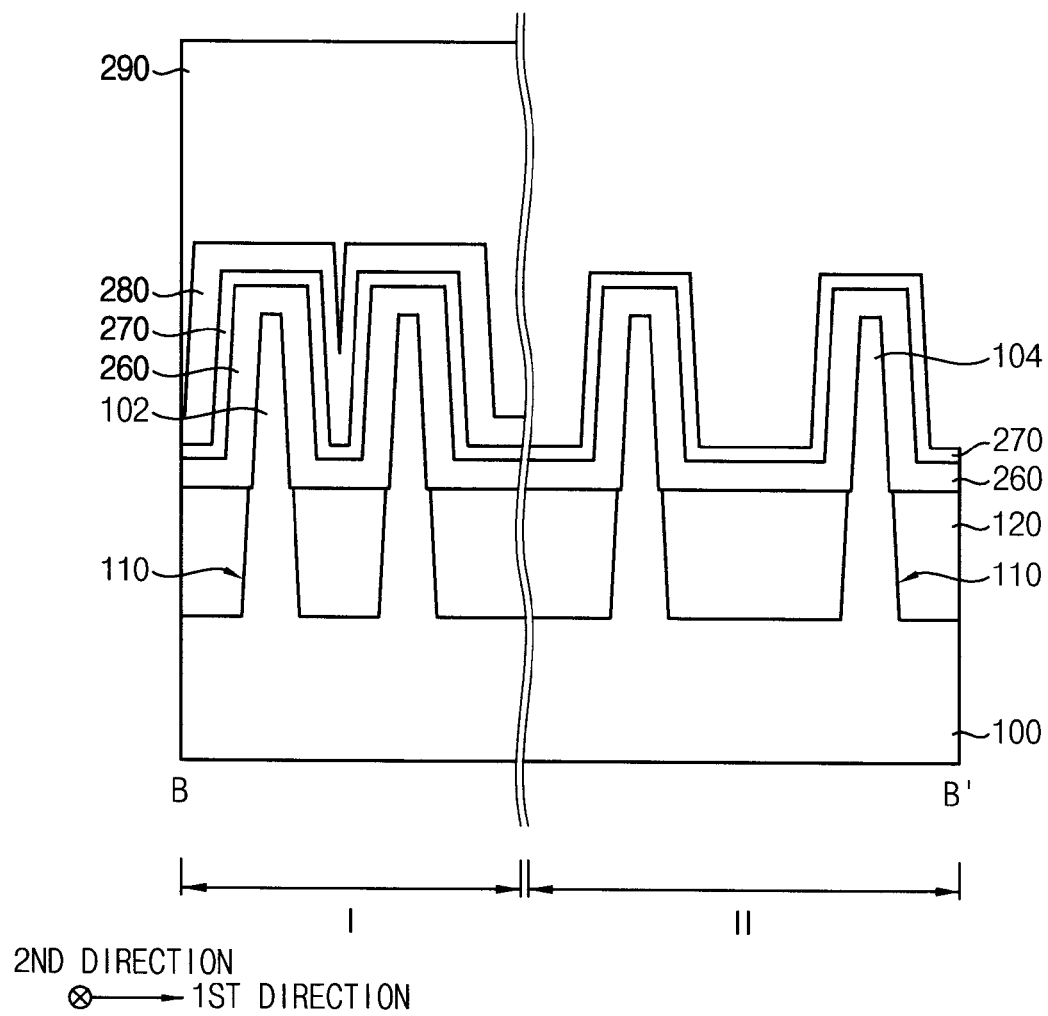
Figure 47:
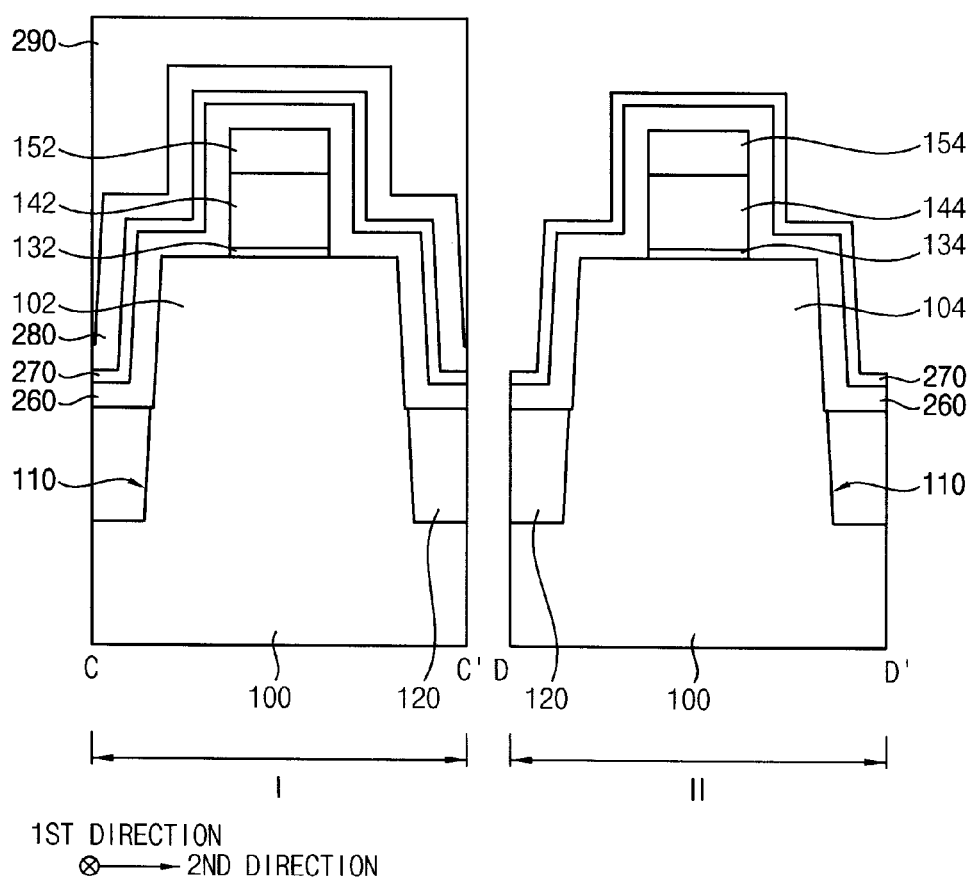

FIGS. 41 and 45 are cross-sectional views cut along a line A-A' of corresponding plan views, FIGS. 42, 46, 48, 49 and 50 are cross-sectional views cut along a line B-B' of corresponding plan views, and FIGS. 43 and 47 are cross-sectional views cut along a line C-C' and a line D-D' of corresponding plan views.

This method may include processes substantially the same as or similar to those illustrated with reference to FIGS. 1 to 39, and thus like reference numerals refer to like elements, and detailed descriptions thereon are omitted herein.

First, processes substantially the same as or similar to those illustrated with reference to FIGS. 1 to 7 may be performed.

Referring to FIGS. 40 to 43, a process substantially the same as or similar to that illustrated with reference to FIGS. 8 to 11 may be performed.

That is, a spacer structure including a lower spacer layer 260, an etch stop layer 270 and an upper spacer layer 280 sequentially stacked may be formed on the first and second dummy gate structures, the first and second active regions 102 and 104 and the isolation layer 120. The lower and upper spacer layers 260 and 280 may be formed to have substantially the same thickness. The lower and upper spacer layers 260 and 280 may be formed to include a nitride, e.g., silicon nitride, silicon oxycarbonitride, etc., and the etch stop layer 270 may be formed to include a material having a high etching selectivity with respect to the lower and upper spacer layers 260 and 280, e.g., an oxide such as silicon oxide.

Referring to FIGS. 44 to 47, a process substantially the same as or similar to that illustrated with reference to FIGS. 12 to 15 may be performed.

That is, a photoresist pattern 290 covering the first region I of the substrate 100 may be formed on the upper spacer layer 280, and a portion of the upper spacer layer 280 in the second region II may be partially etched using the photoresist pattern 290 as an etching mask. A time at which the etching process may be stopped may be exactly controlled by the etch stop layer 270 on the lower spacer layer 260.

That is, in the etching process illustrated with reference to FIGS. 12 to 15, a time for performing the etching process may be controlled such that an amount of a portion of the spacer layer 160 removed from the second region II may be controlled, and thus the second spacer layer pattern 164 remaining in the second region II may be formed to have a desired thickness. However, in the etching process illustrated with reference to FIGS. 44 to 47, the lower spacer layer 260 may be formed to have a desired thickness in the second region II, and the etch stop layer 270 and the upper spacer layer 280 may be sequentially formed on the lower spacer layer 260. Then, the upper spacer layer 280 in the second region II may be removed so that the lower spacer layer 260 may be formed to have an exactly desired thickness in the second region II. Accordingly, the height difference between top surfaces of the first and second spacers 267 and 269 (refer to FIG. 50) in the first and second regions I and II may be exactly realized.

Figure 48:
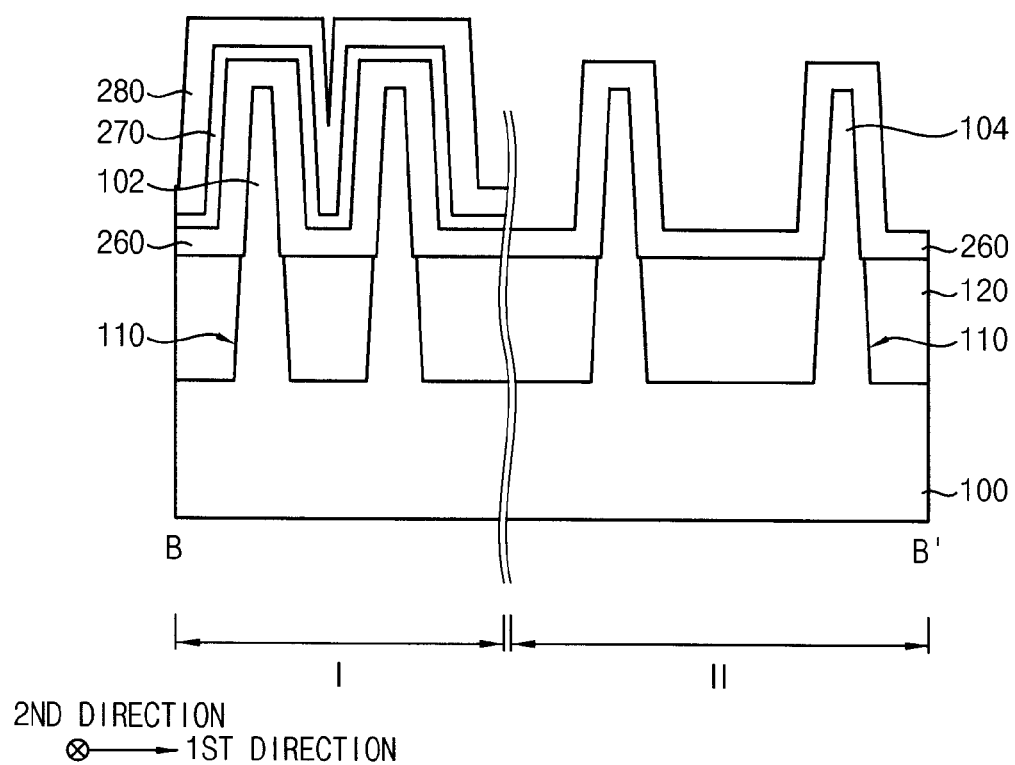

Referring to FIG. 48, after removing the photoresist pattern 290, the etch stop layer 270 remaining in the second region II may be removed.

The photoresist pattern 290 may be removed by an ashing process and/or a stripping process, and the etch stop layer 270 may be removed by a wet etching process or a dry etching process.

Figure 49:
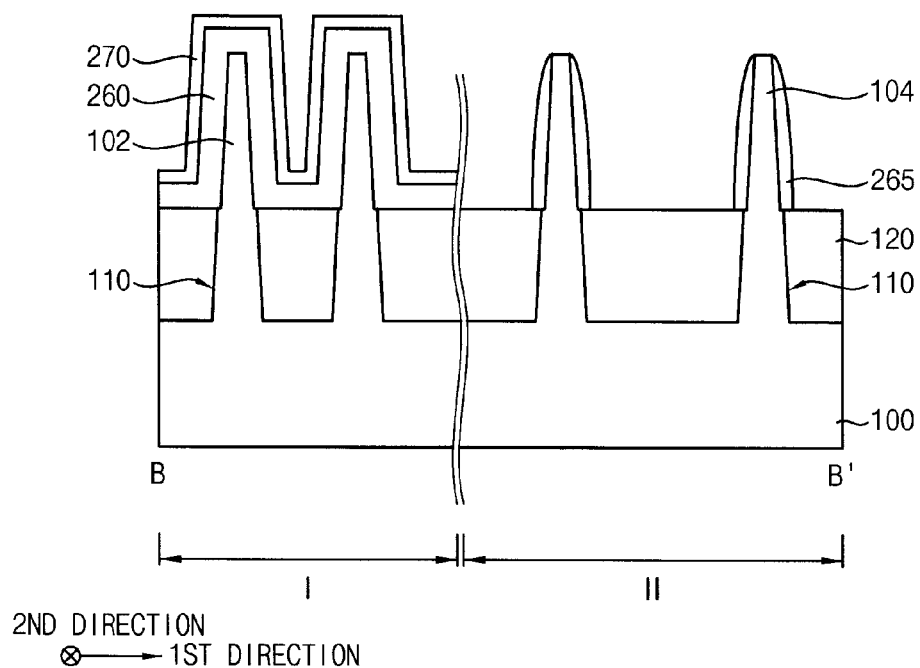

Referring to FIG. 49, a process substantially the same as or similar to that illustrated with reference to FIGS. 16 and 17 may be performed.

That is, the upper spacer layer 280 and the lower spacer layer 260 remaining in the first and second regions I and II, respectively, may be etched by a first anisotropic etching process to remove the upper spacer layer 280 and transform the lower spacer layer 260 into a preliminary second spacer 265.

The first anisotropic etching process may be performed until the preliminary second spacer 265 may be formed only on a sidewall of the second active region 104. In this case, the upper spacer layer 280 remaining in the first region I may be removed from the first region I of the substrate 100 by the first anisotropic etching process.

The preliminary second spacer 265 may be formed on both sidewalls of the second active region 104 in the first direction, and in some cases, may be also formed on both sidewalls of the second active region 104 in the second direction.

Figure 50:
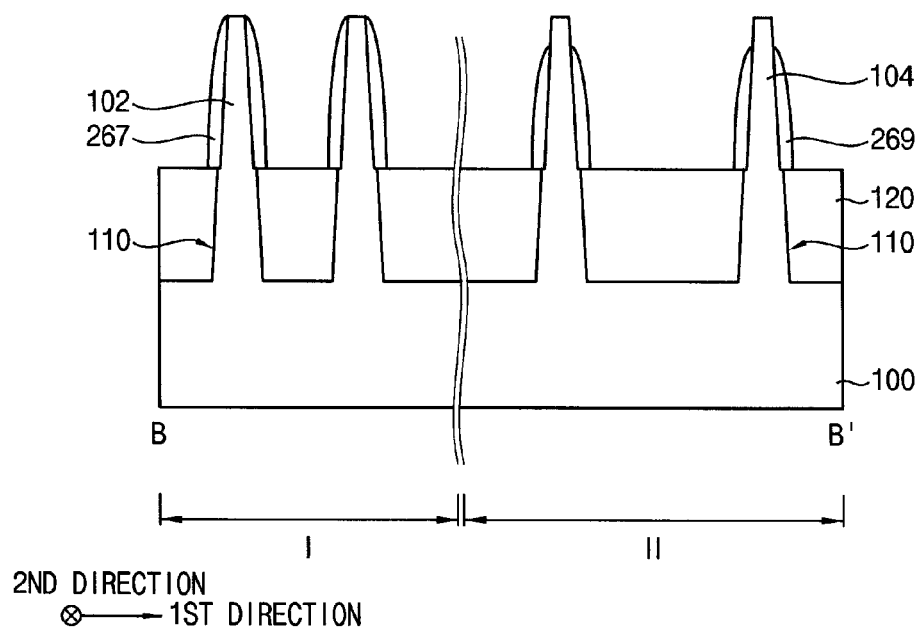

Referring to FIG. 50, after removing the etch stop layer 270 remaining in the first region I of the substrate 100, a process substantially the same as or similar to that illustrated with reference to FIGS. 18 to 20 may be performed.

That is, the lower spacer layer 260 remaining in the first region I of the substrate 100 and the preliminary second spacer 265 in the second region II of the substrate 100 may be etched by a second anisotropic etching process to form the first and second spacers 267 and 269, respectively, in the first and second regions I and II, respectively.

The second anisotropic etching process may be performed until the first spacer 267 may be formed only on a sidewall of the first active region 102. In this case, an upper portion of the preliminary second spacer 265 remaining on the sidewall of the second active region 104 may be etched so that a top surface of the preliminary second spacer 265 may have a reduced height and an upper sidewall of the second active region 104 may not be covered but exposed. Accordingly, a top surface of the second spacer 269 in the second region II may have a height smaller than that of a top surface of the first spacer 267 in the first region I.

The first spacer 267 may be formed on both sidewalls of the first active region 102 in the first direction, and in some cases, may be also formed on both sidewalls of the first active region 102 in the second direction.

The second anisotropic etching process may be performed until the first spacer 267 may not cover the whole sidewall of the first active region 102 but expose an upper sidewall of the first active region 102. In this case, an upper portion of the second spacer 269 may be also etched by the second anisotropic etching process, so that the top surface of the second spacer 269 may have a height smaller than that of the top surface of the first spacer 267.

Processes substantially the same as or similar to those illustrated with reference to FIGS. 21 to 39 may be performed to complete manufacturing the semiconductor device.

FIGS. 51 to 76 are plan views and cross-sectional views illustrating stages of a method of manufacturing a semiconductor device in accordance with exemplary embodiments. Particularly, FIGS. 51, 54, 59, 63, 68 and 72 are plan views, and FIGS. 52-53, 55-58, 60-62, 64-67, 69-71 and 73-76 are cross-sectional views.

FIGS. 52, 55, 64, 69 and 73 are cross-sectional views cut along a line J-J' of corresponding plan views, FIGS. 56, 60, 65, 70 and 74 are cross-sectional views cut along a line K-K' of corresponding plan views, FIGS. 53, 57, 61, 66, 71 and 75 are cross-sectional views cut along a line L-L' and a line M-M' of corresponding plan views, and FIGS. 58, 62, 67 and 76 are cross-sectional views cut along a line N-N' and a line O-O' of corresponding plan views.

Figure 51:
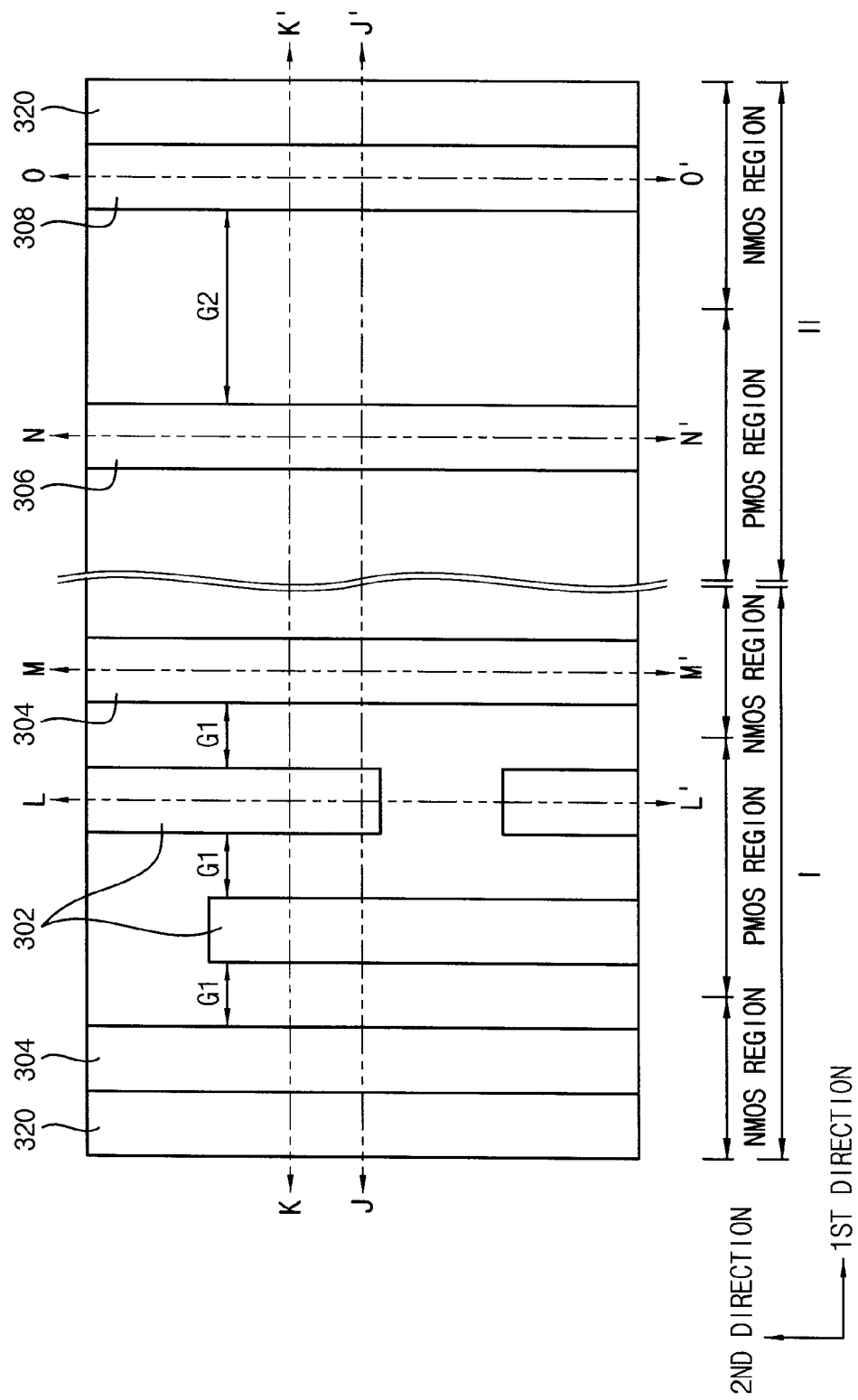
Figure 52:
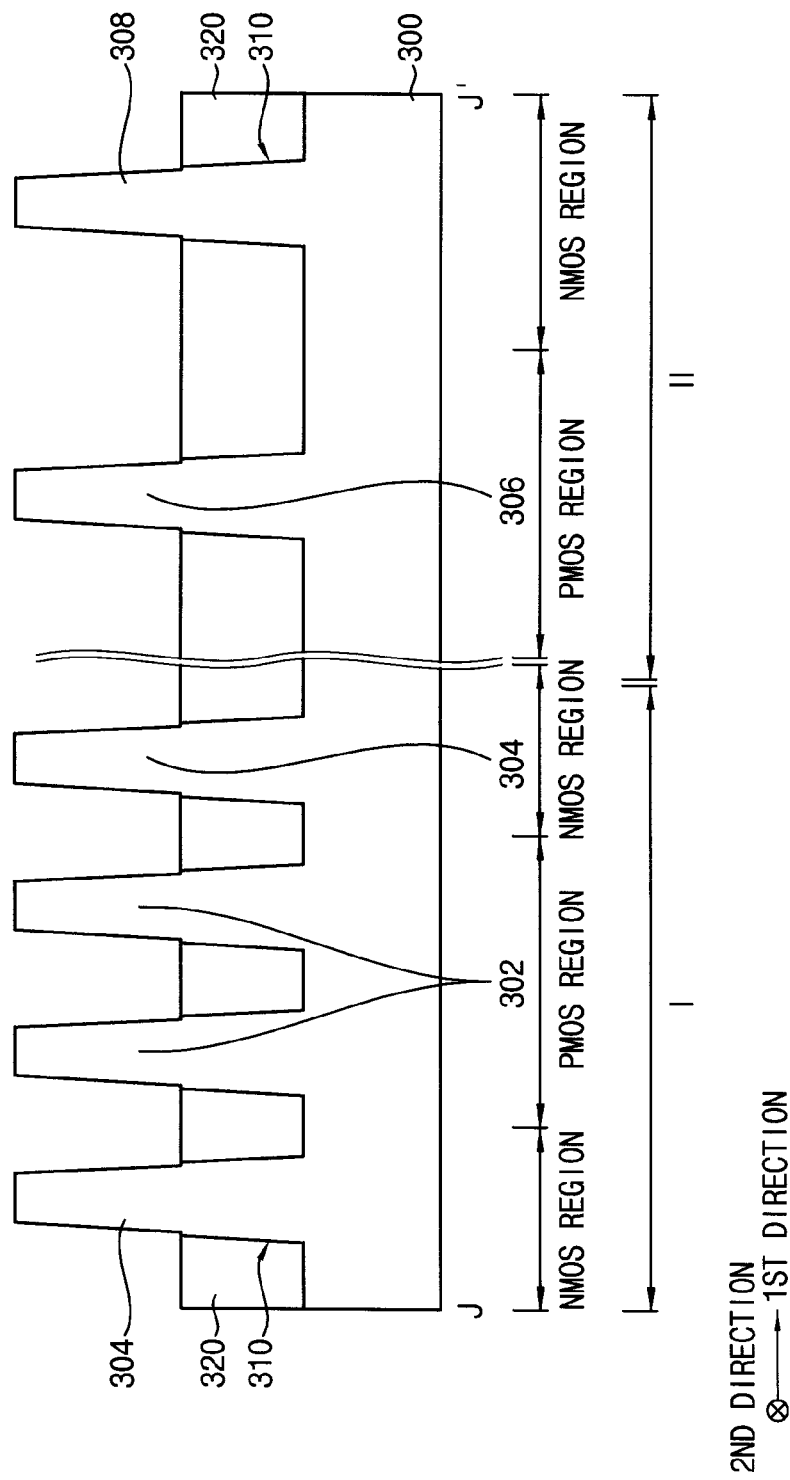
Figure 53:
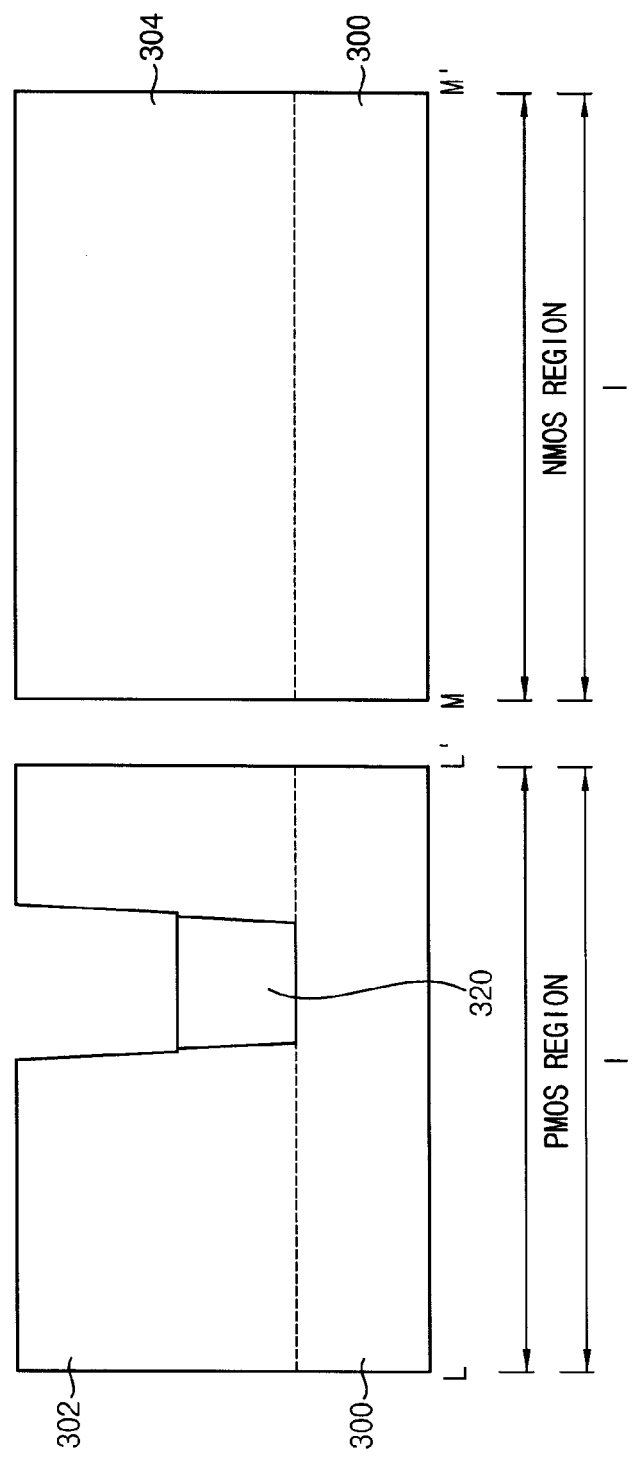
Figure 54:
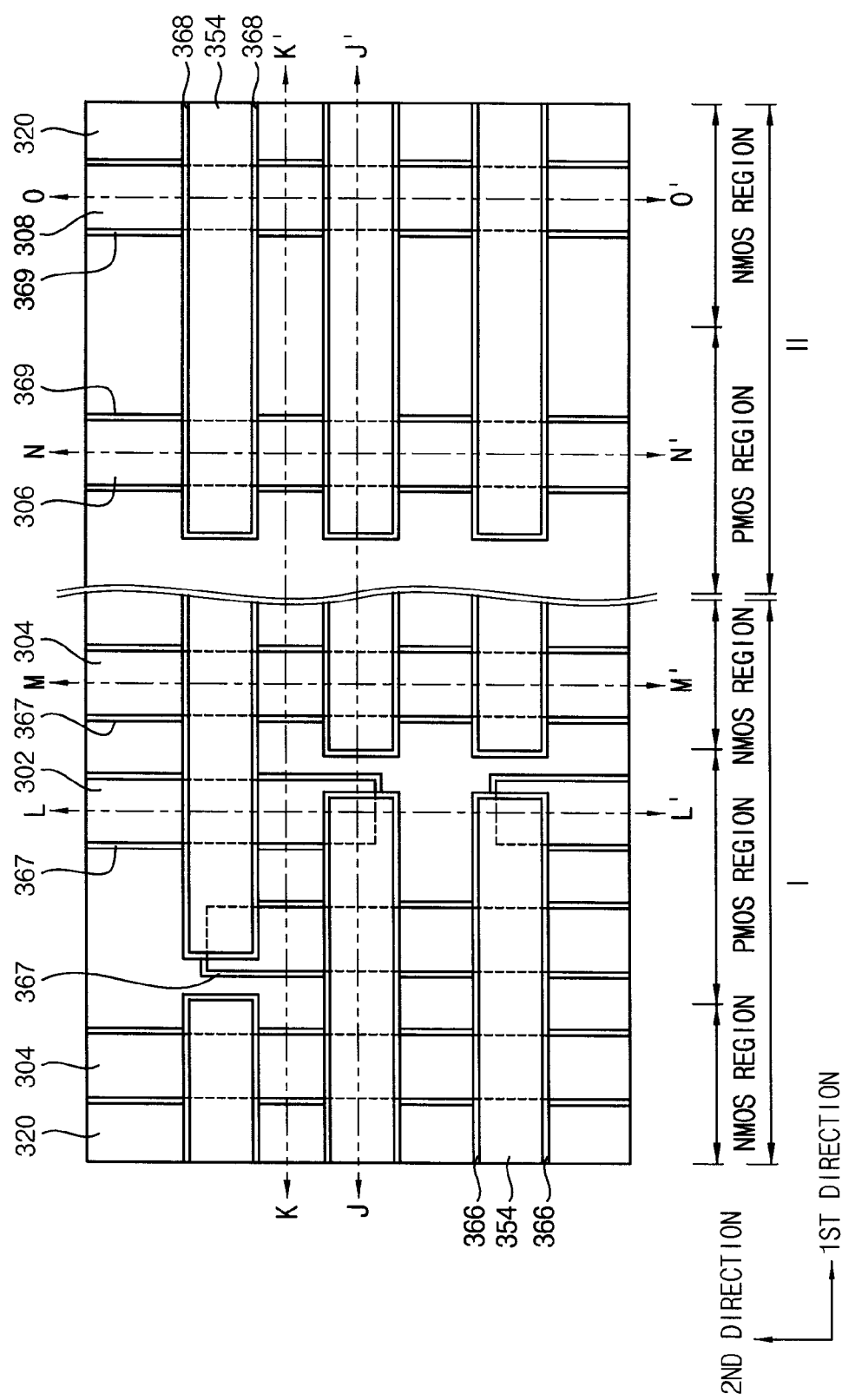
Figure 55:
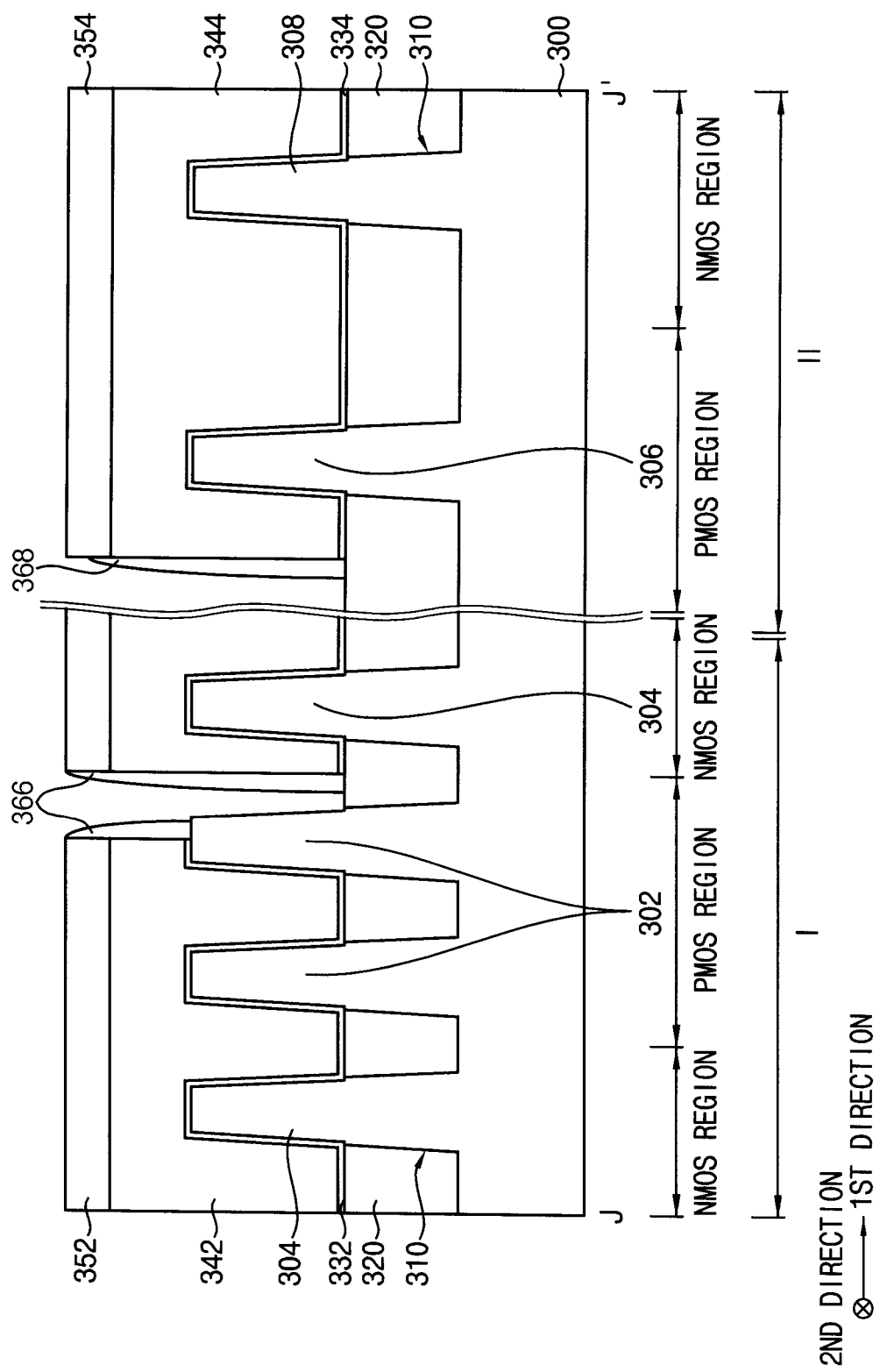
Figure 56:
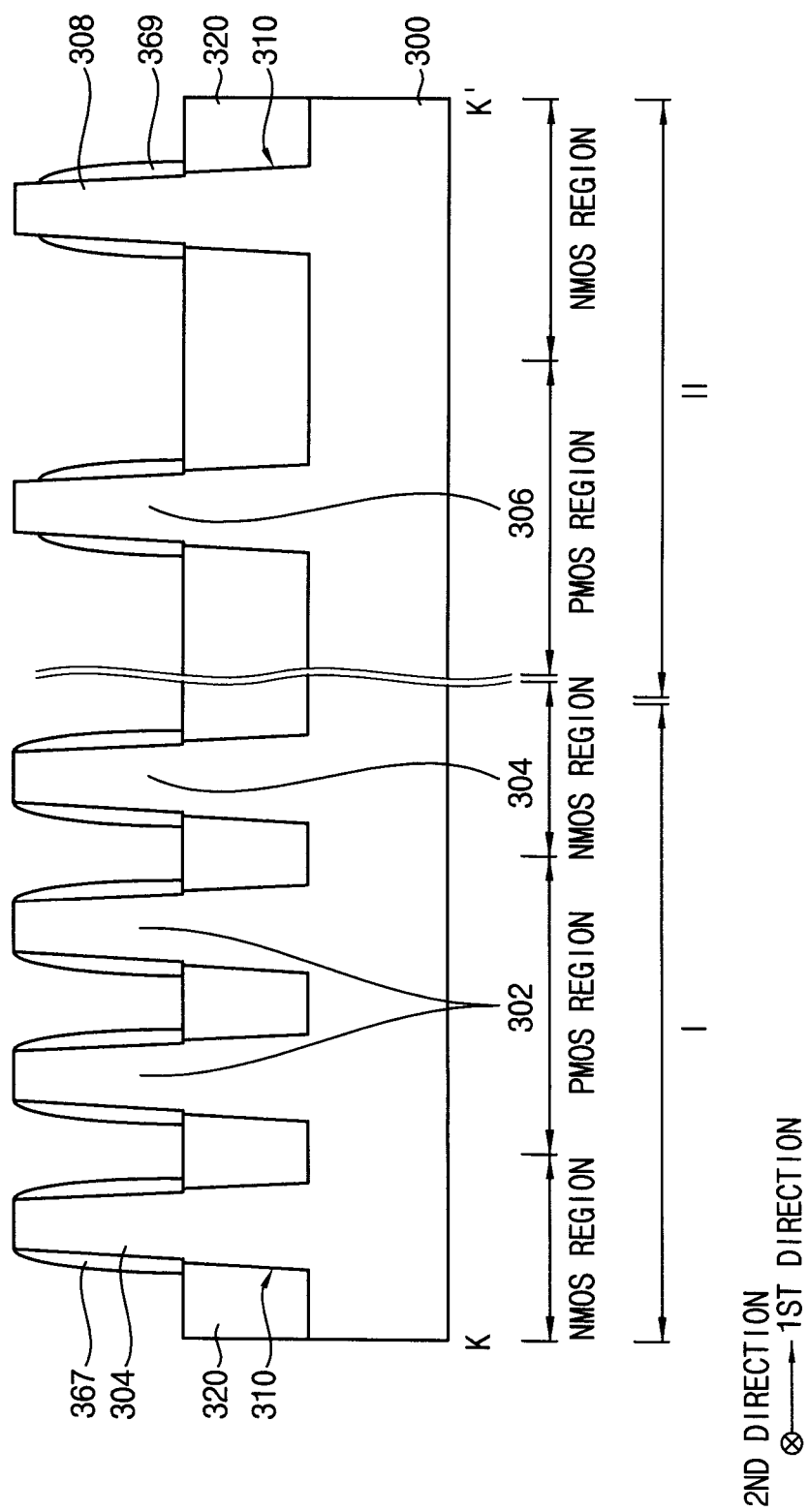
Figure 57:
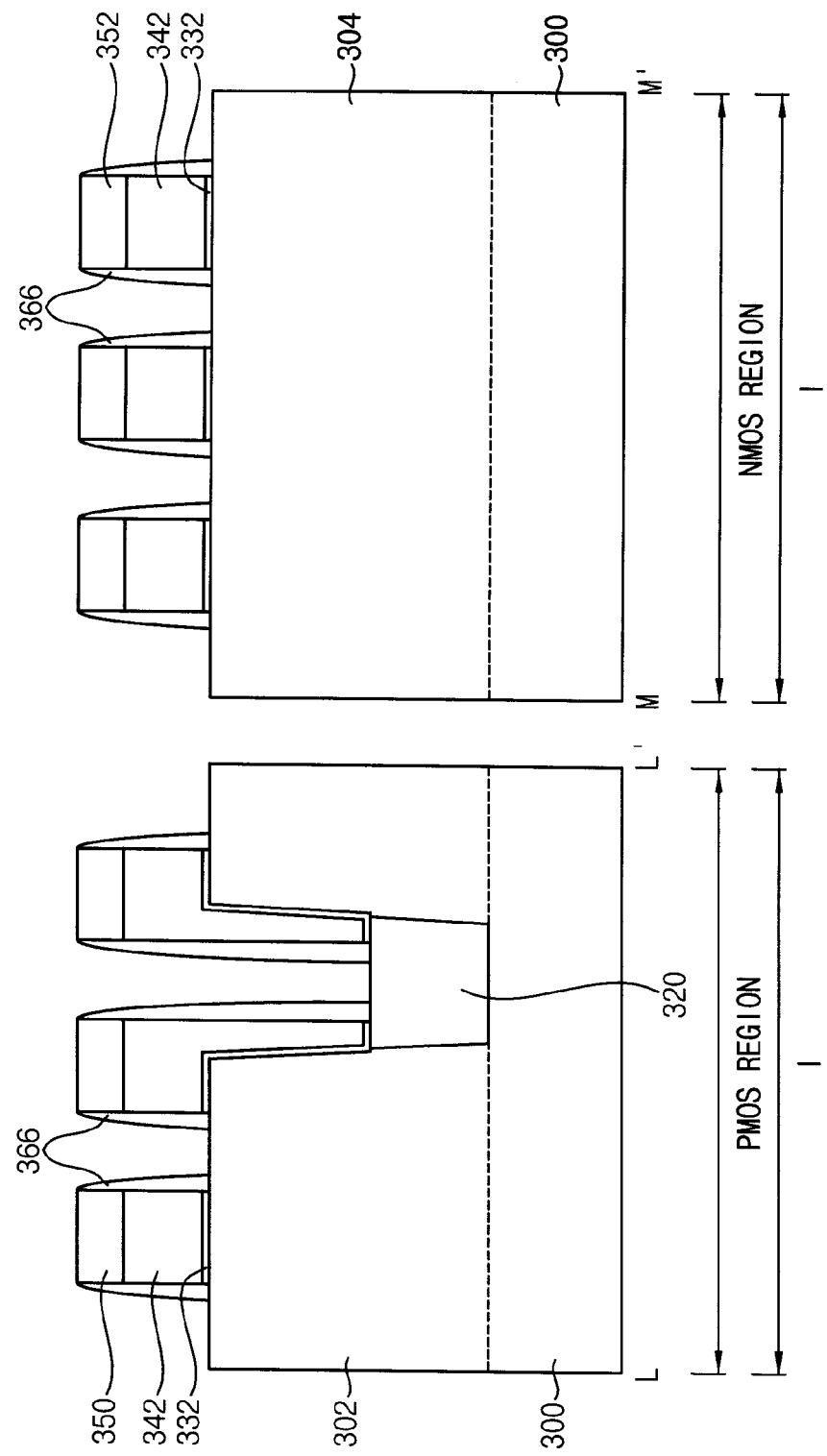
Figure 58:
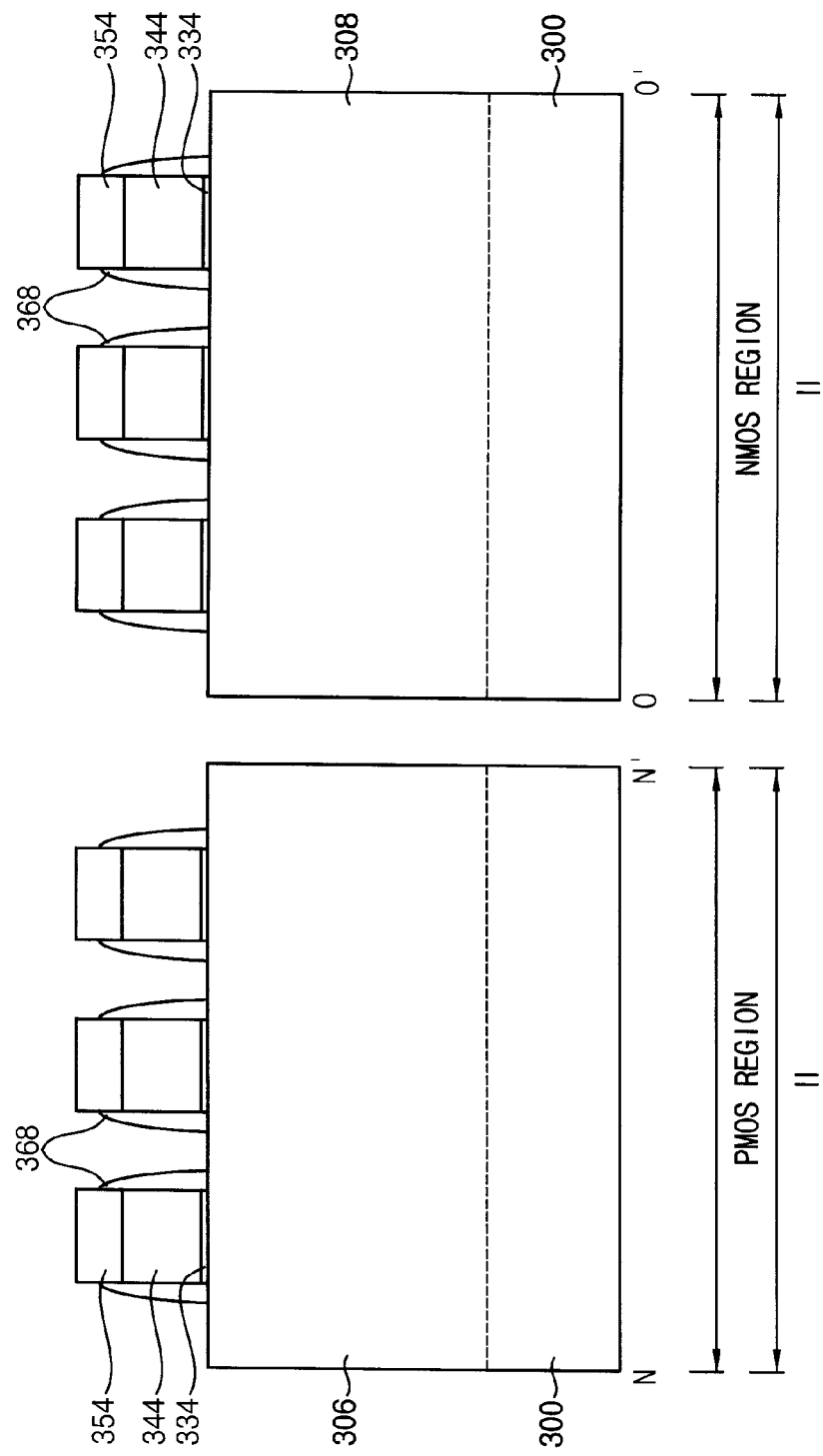
Figure 59:
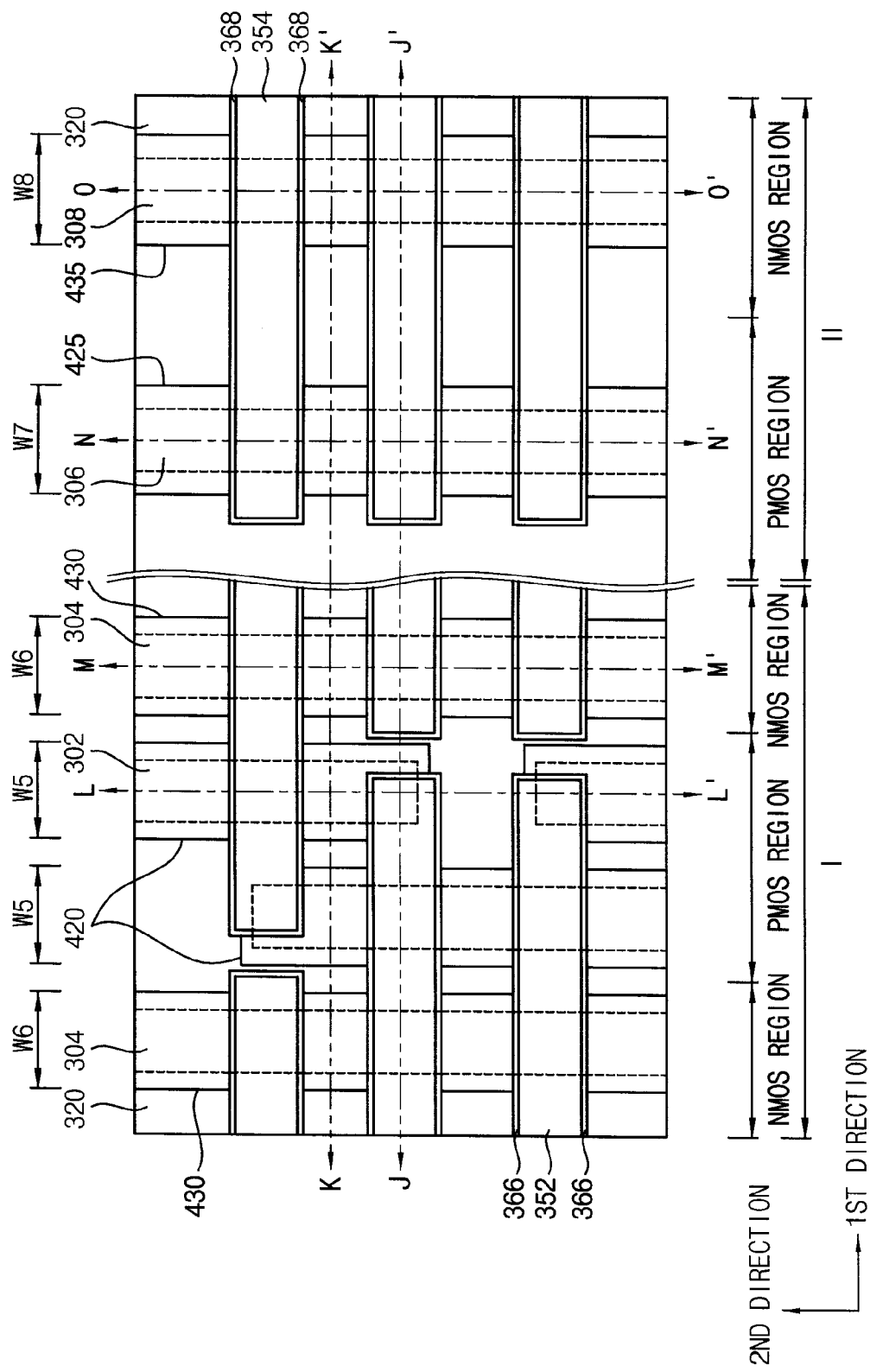
Figure 60:
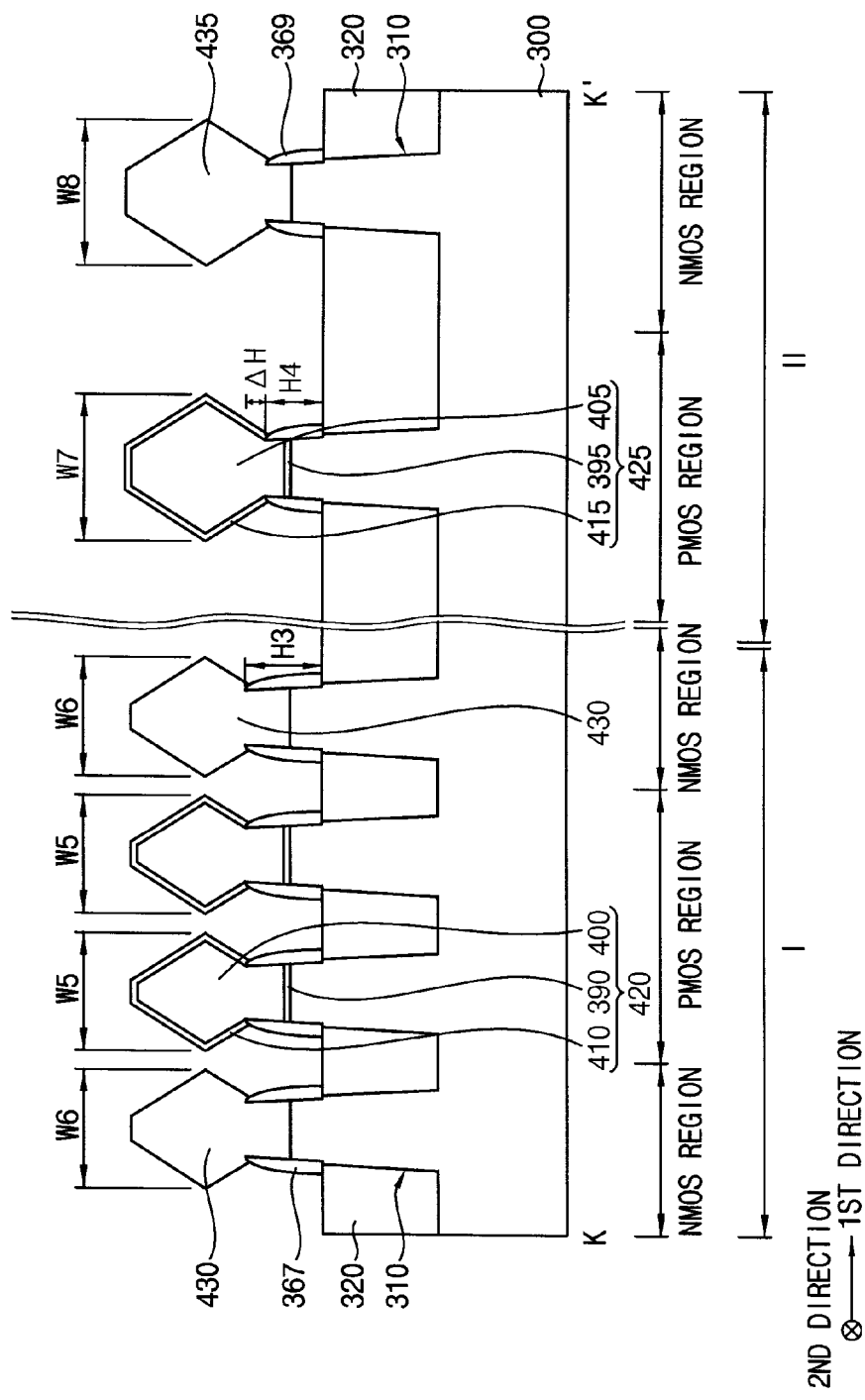
Figure 61:
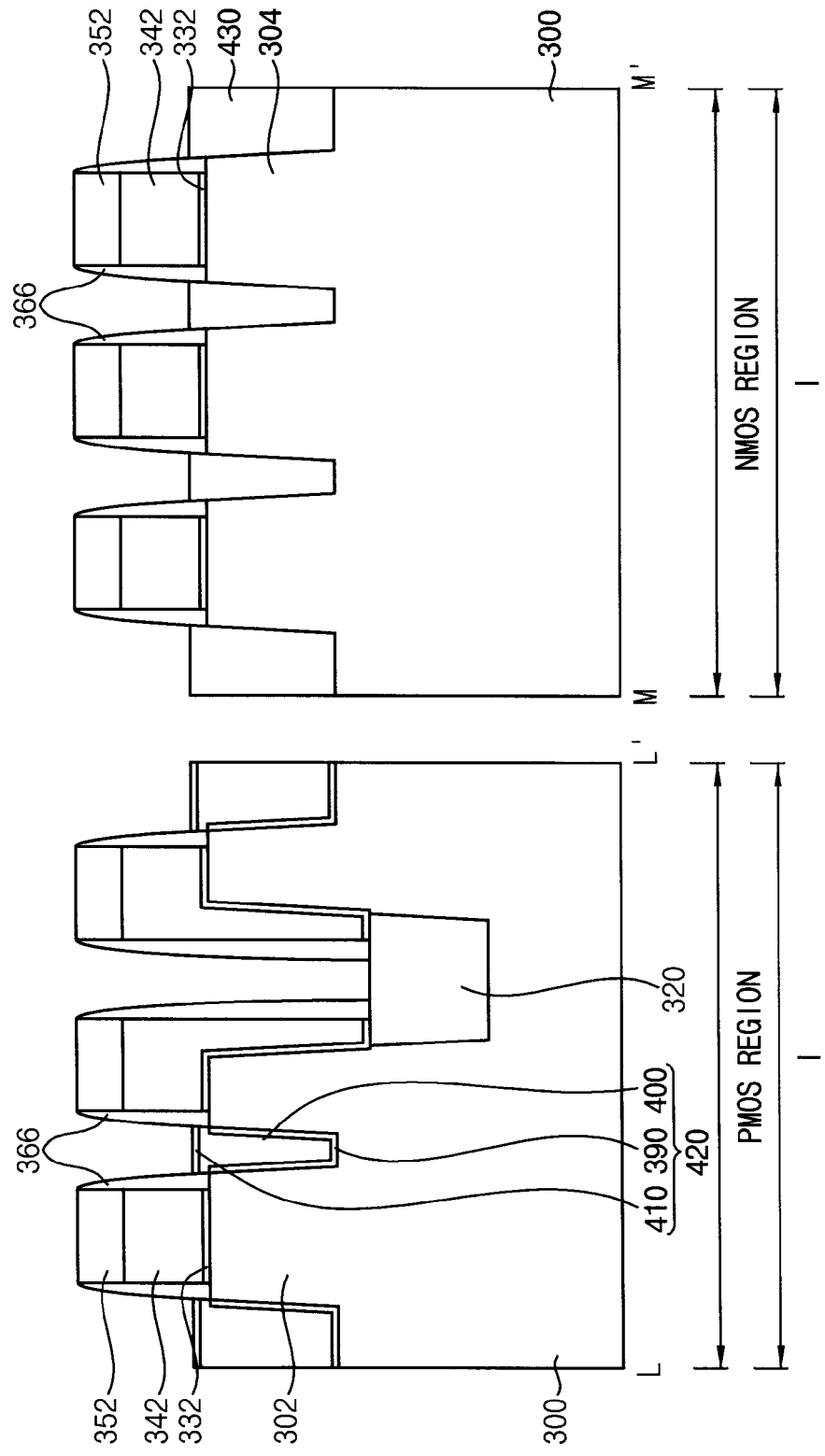
Figure 62:
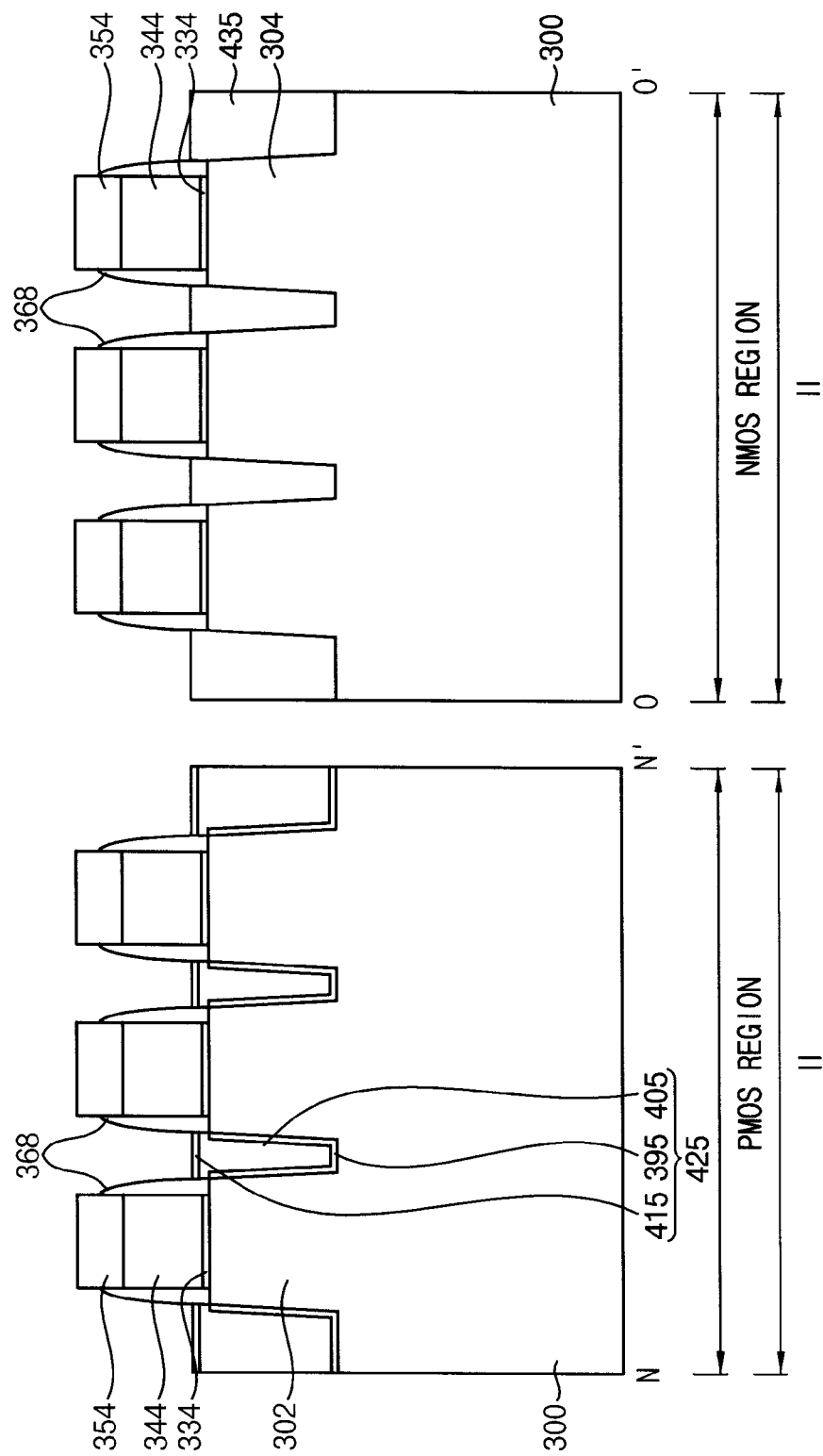
Figure 63:
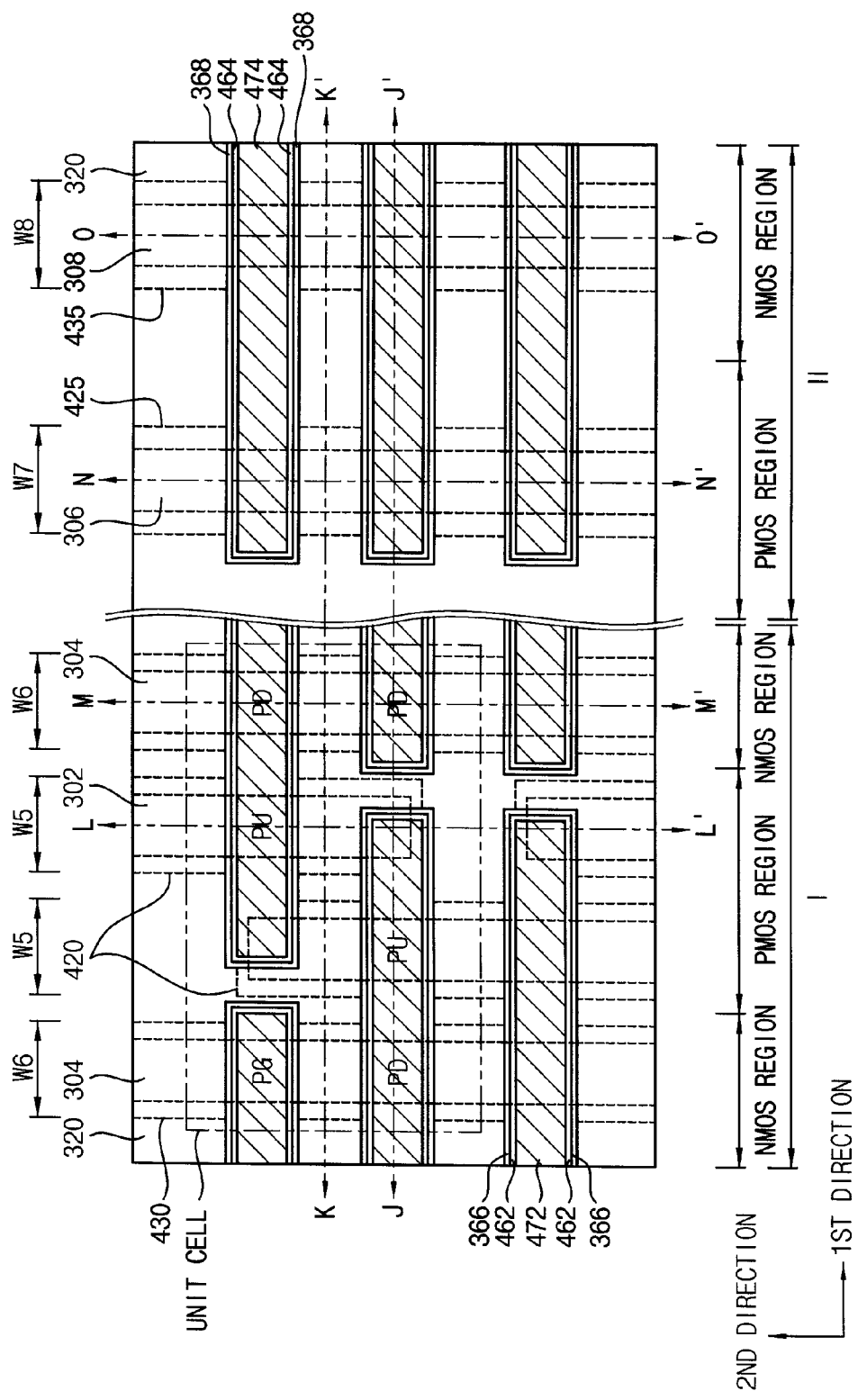
Figure 64:
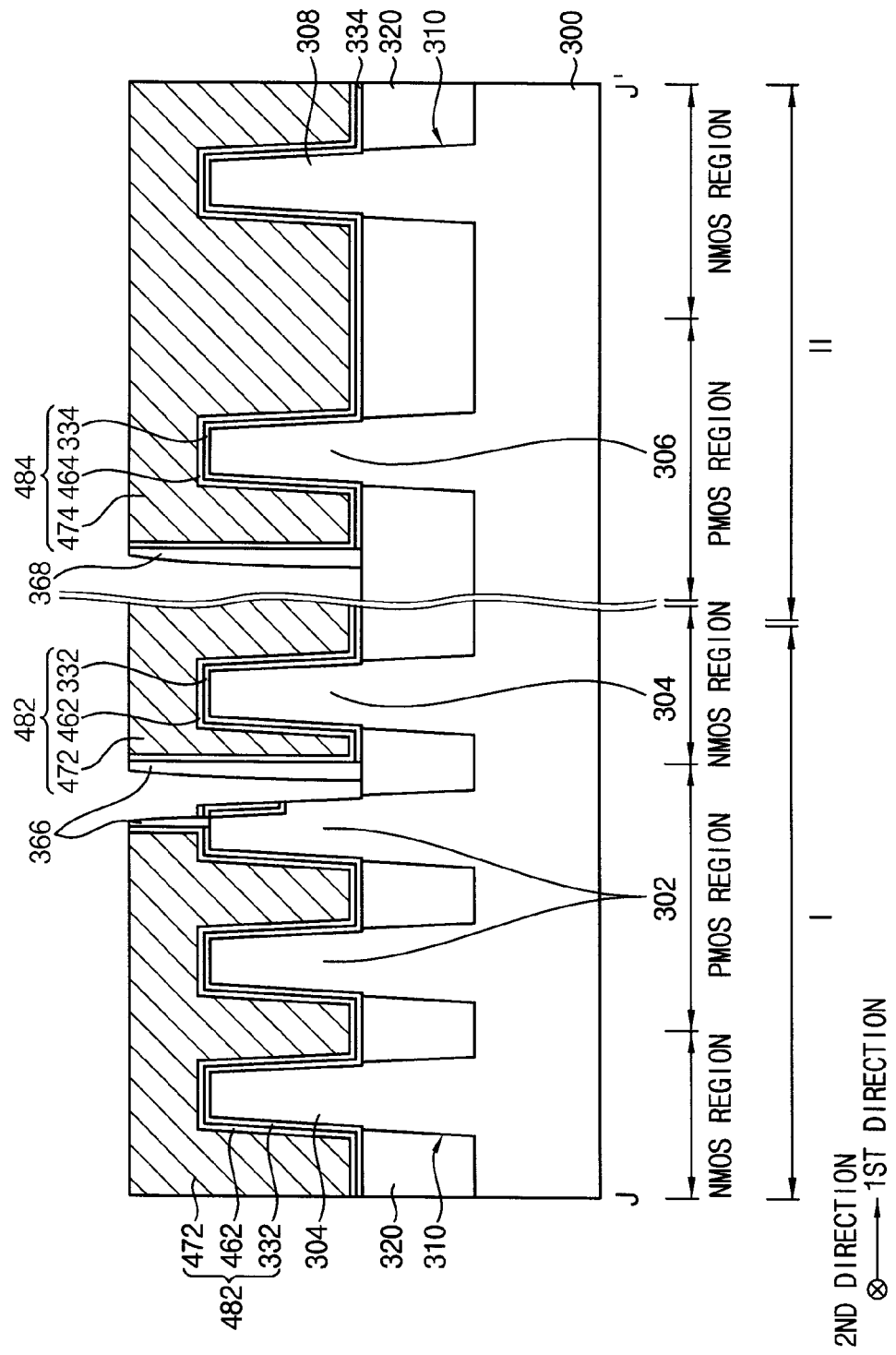
Figure 65:
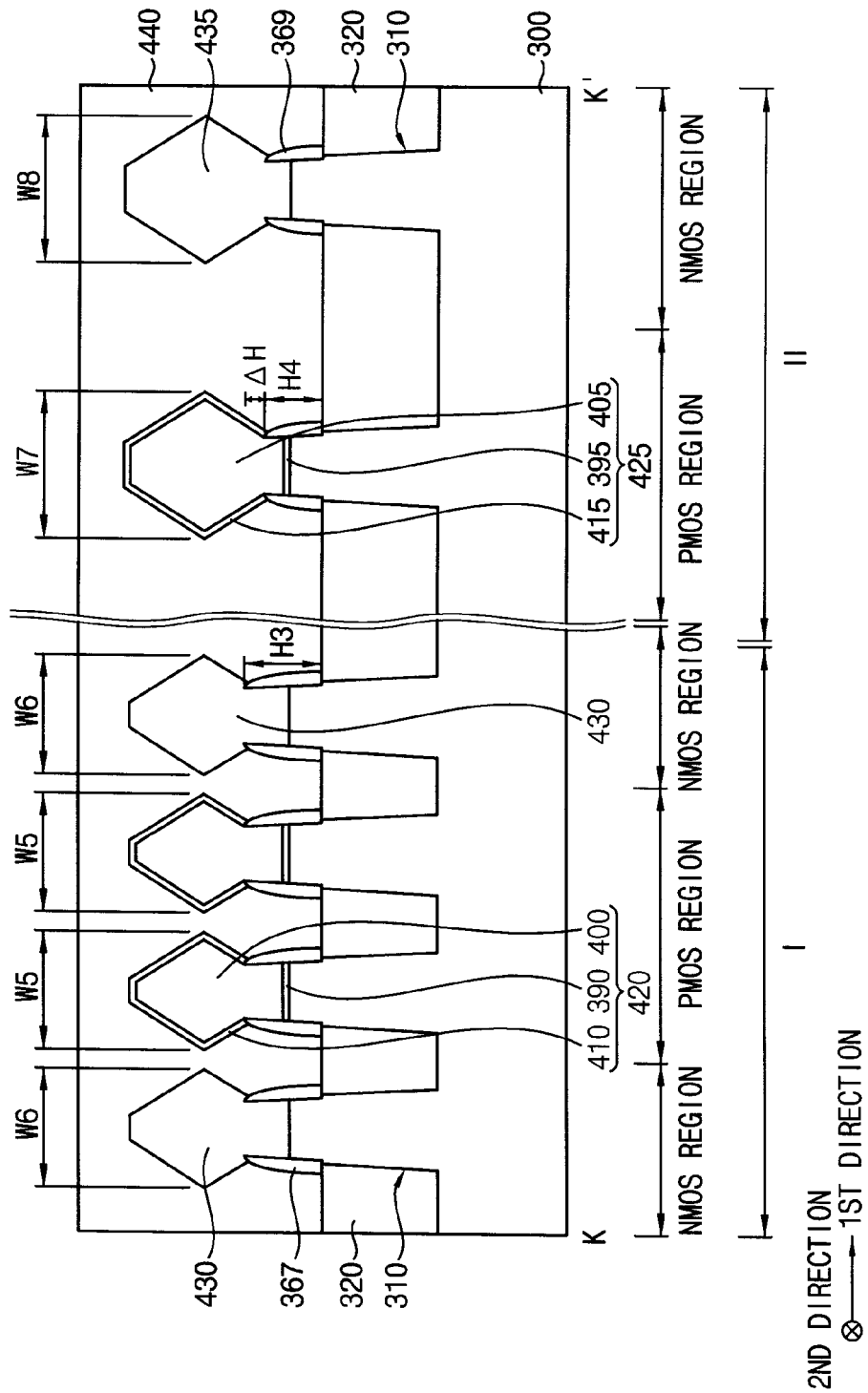
Figure 66:
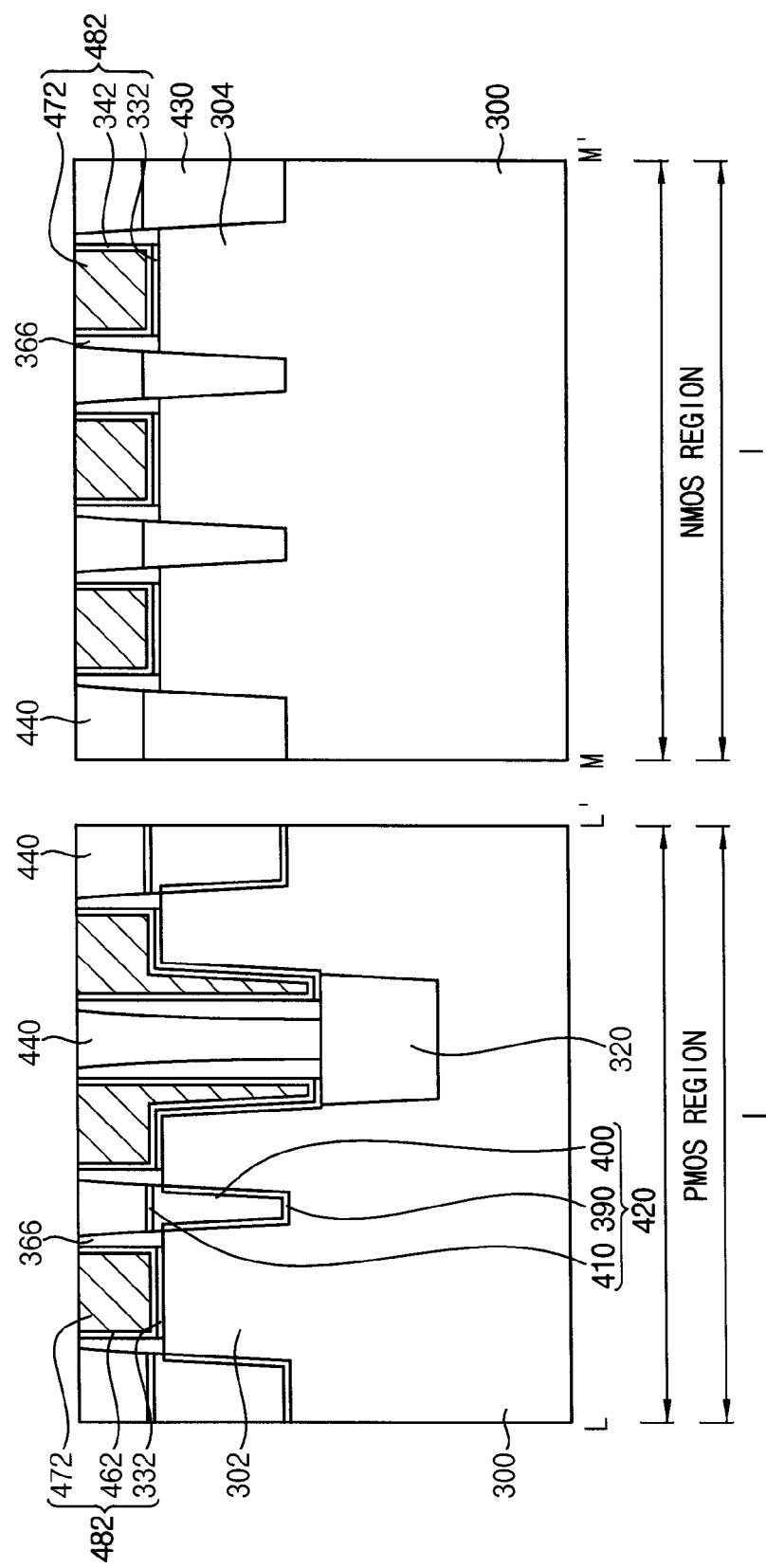
Figure 67:
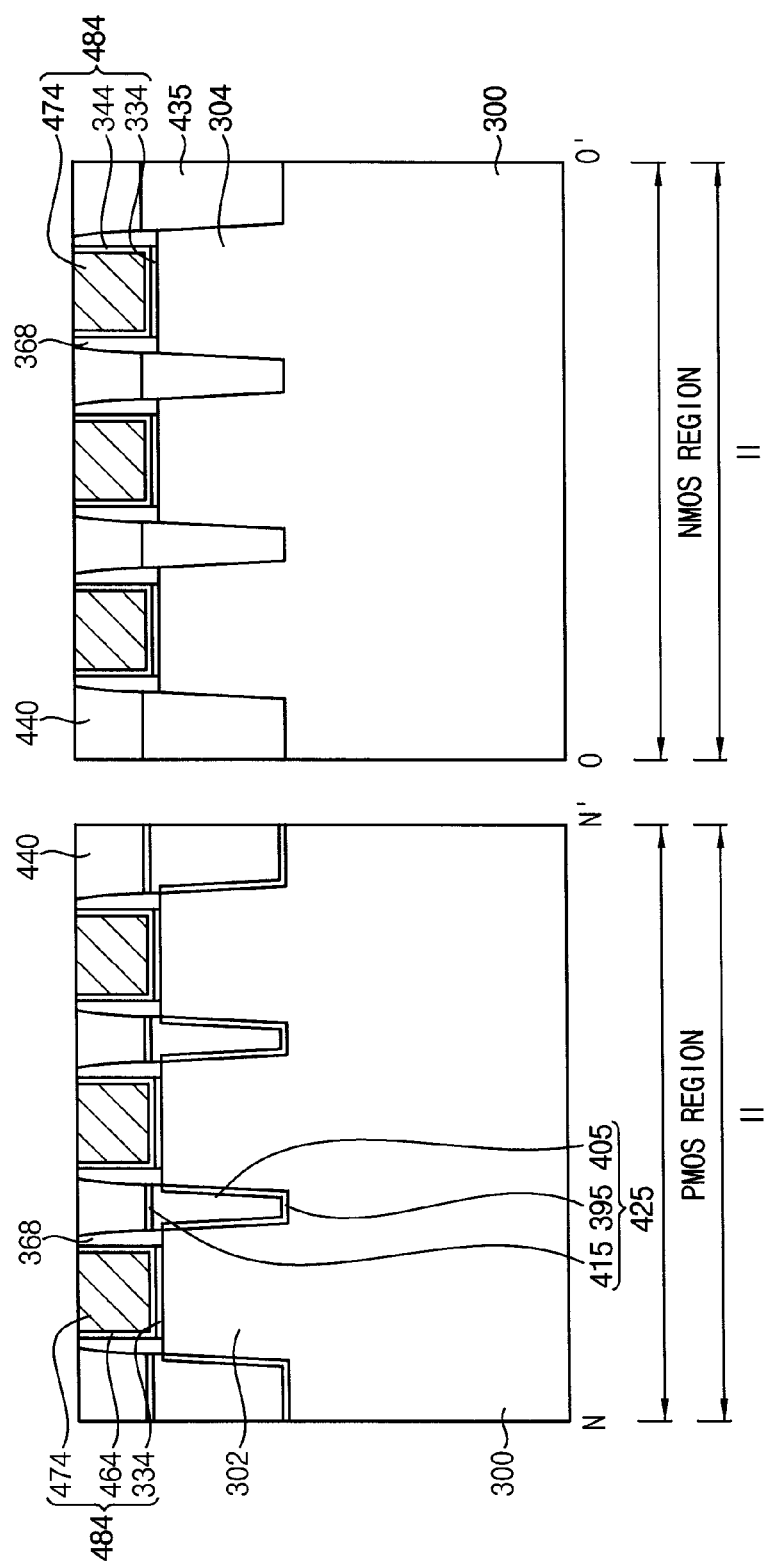
Figure 68:
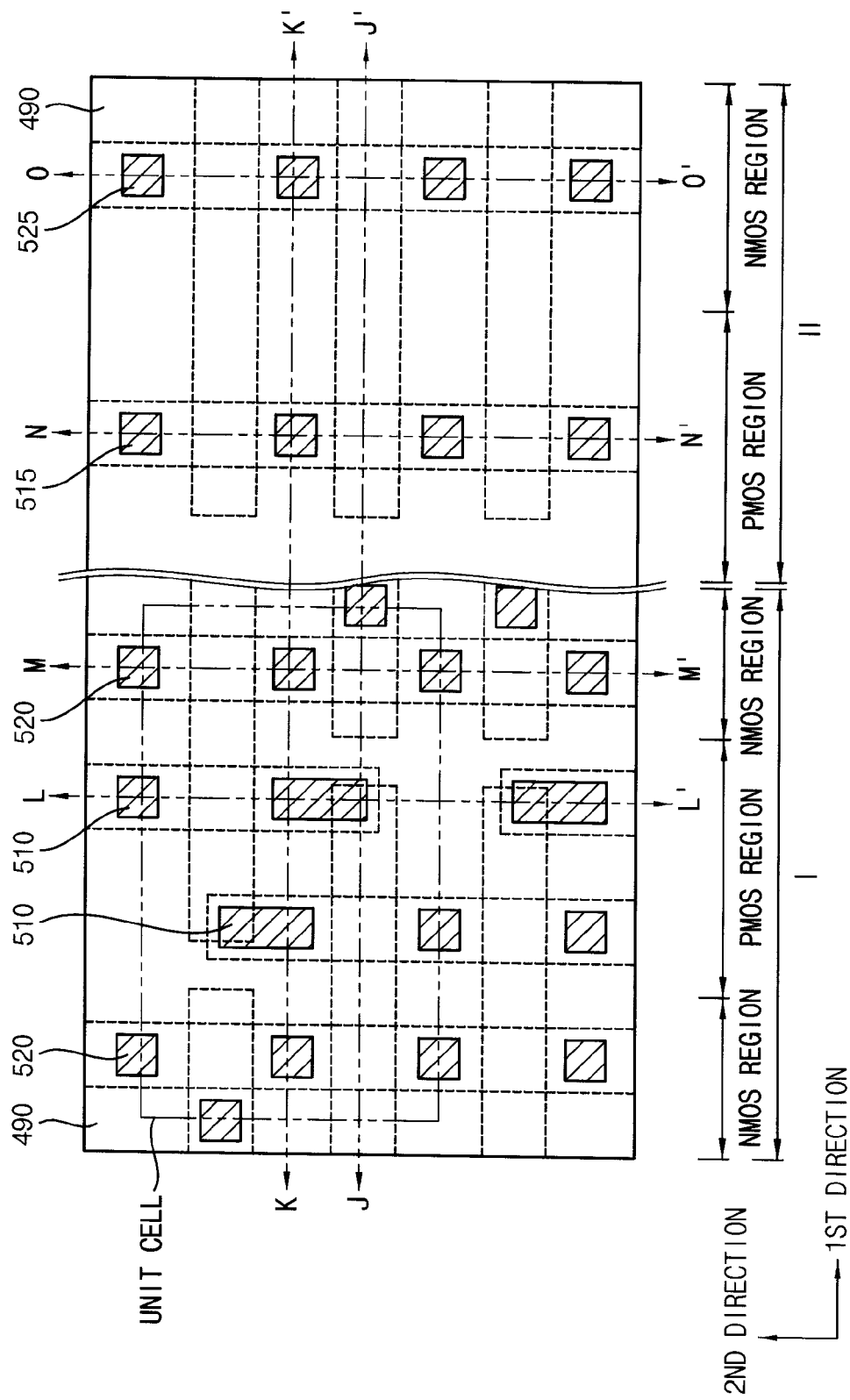
Figure 69:
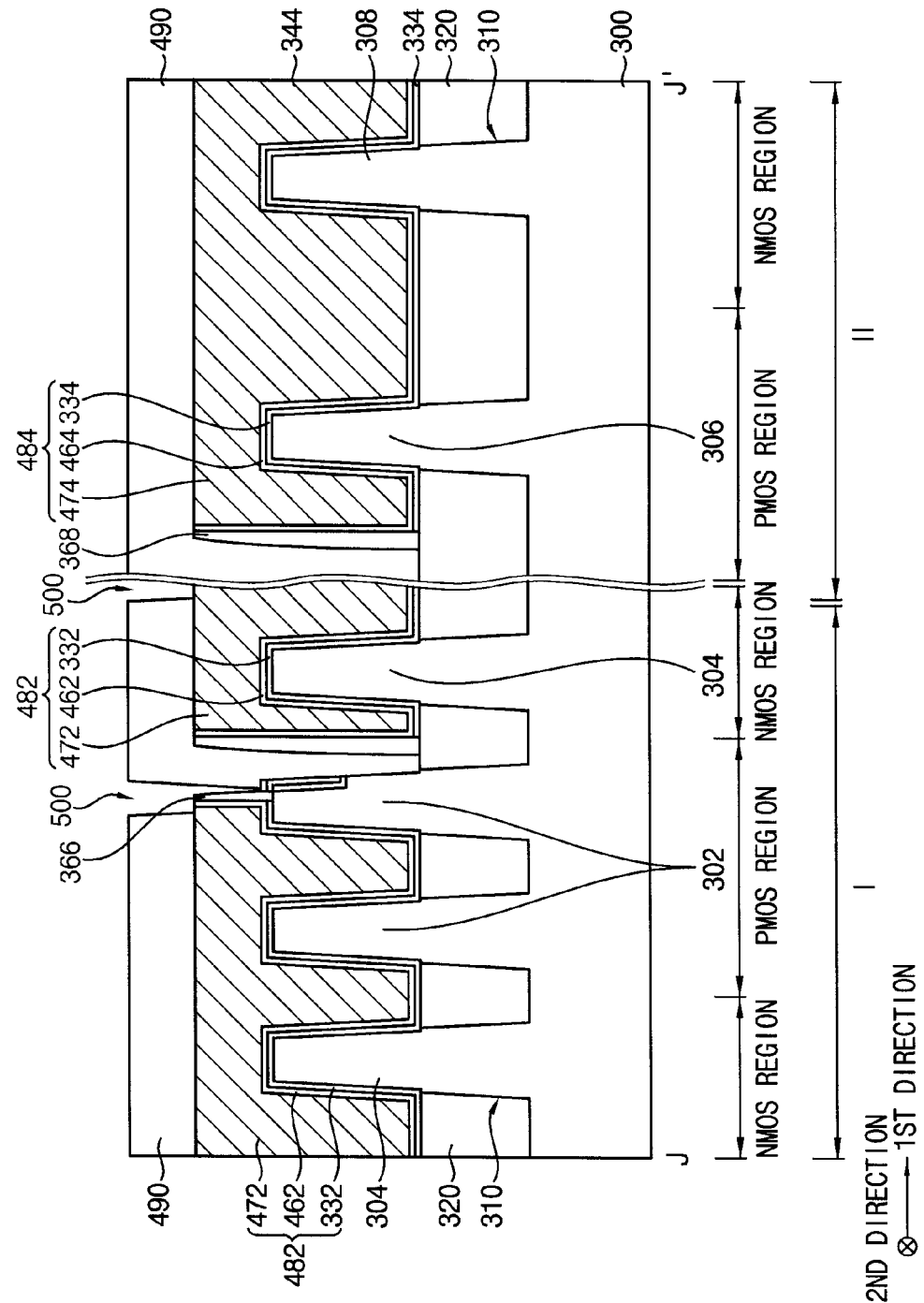
Figure 70:
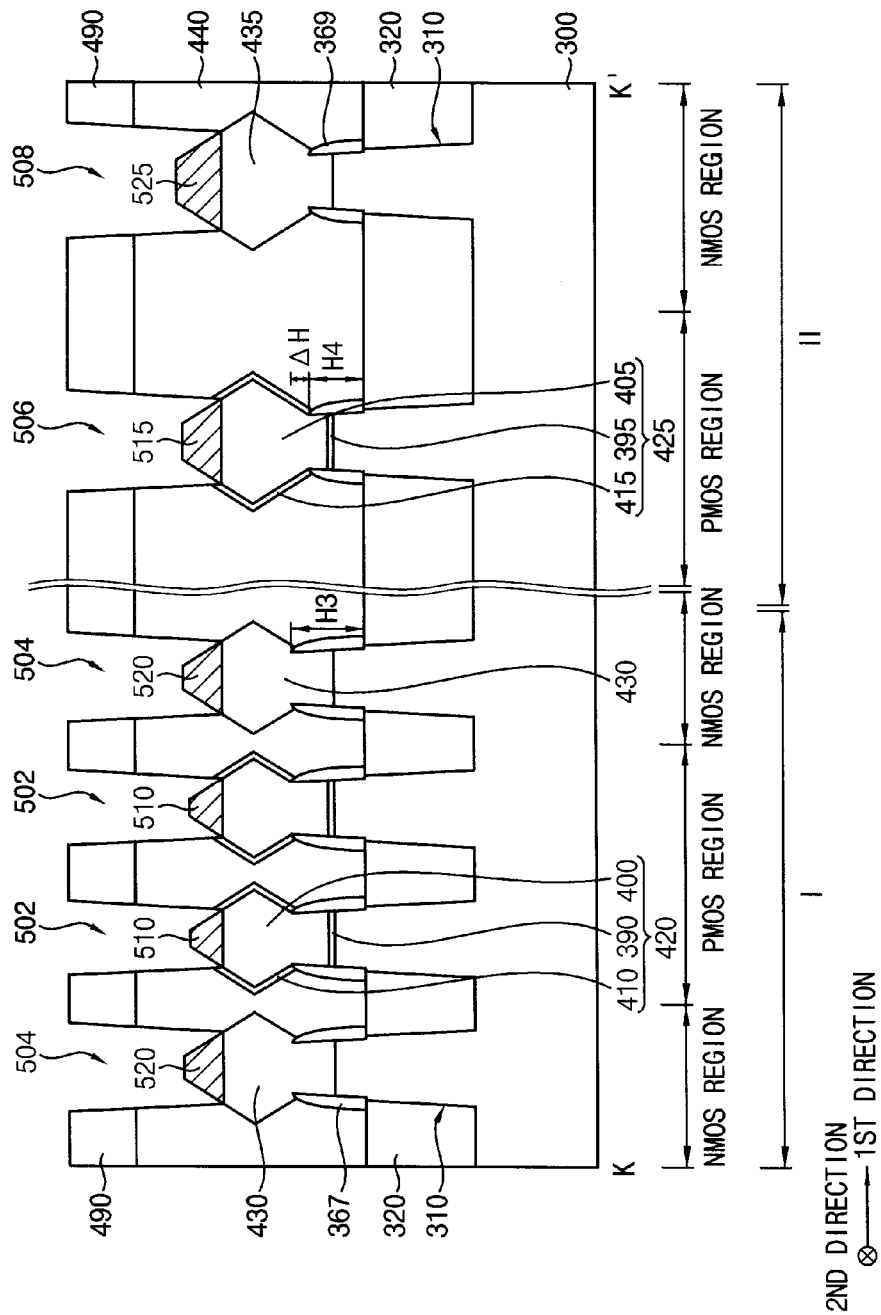
Figure 71:
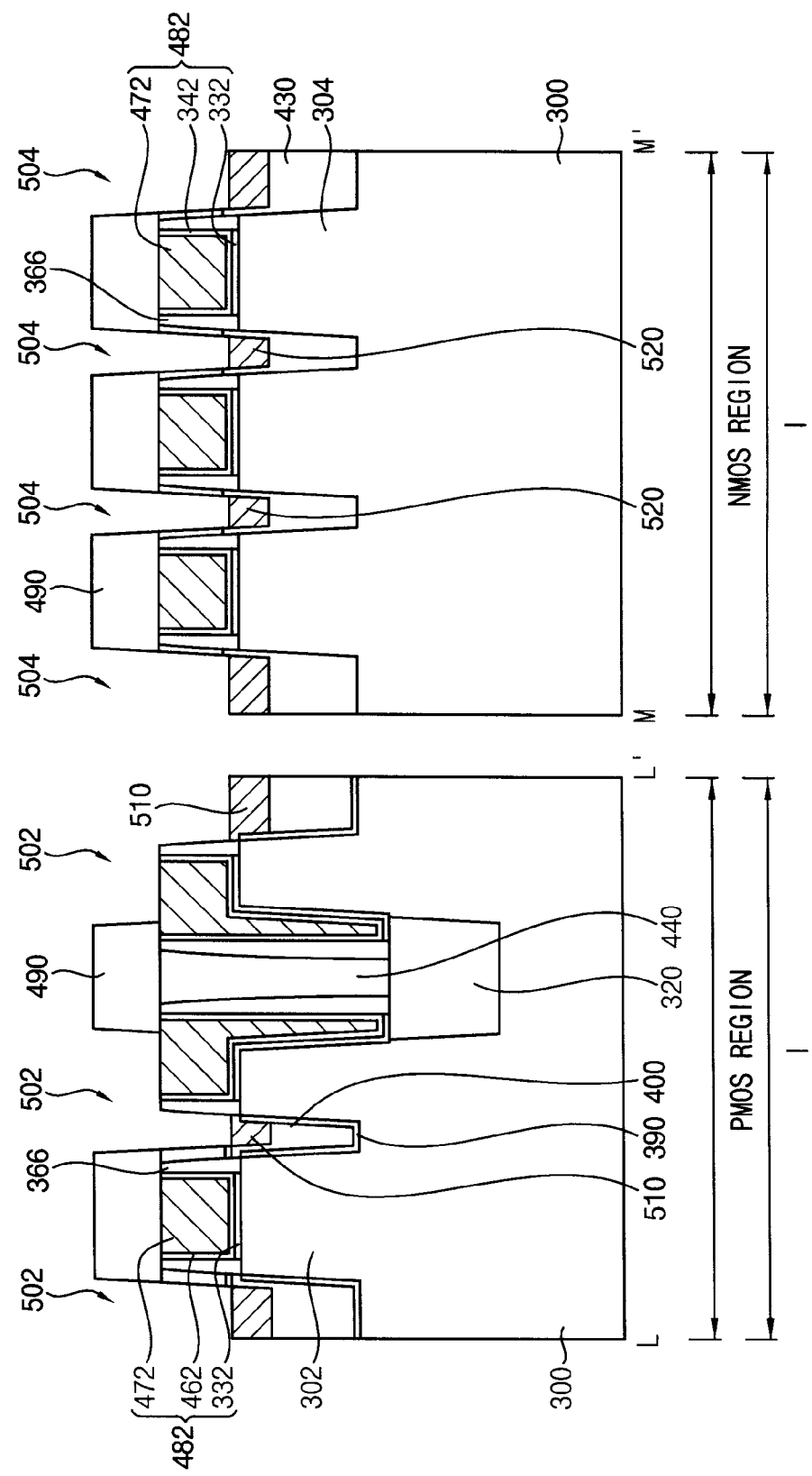
Figure 72:
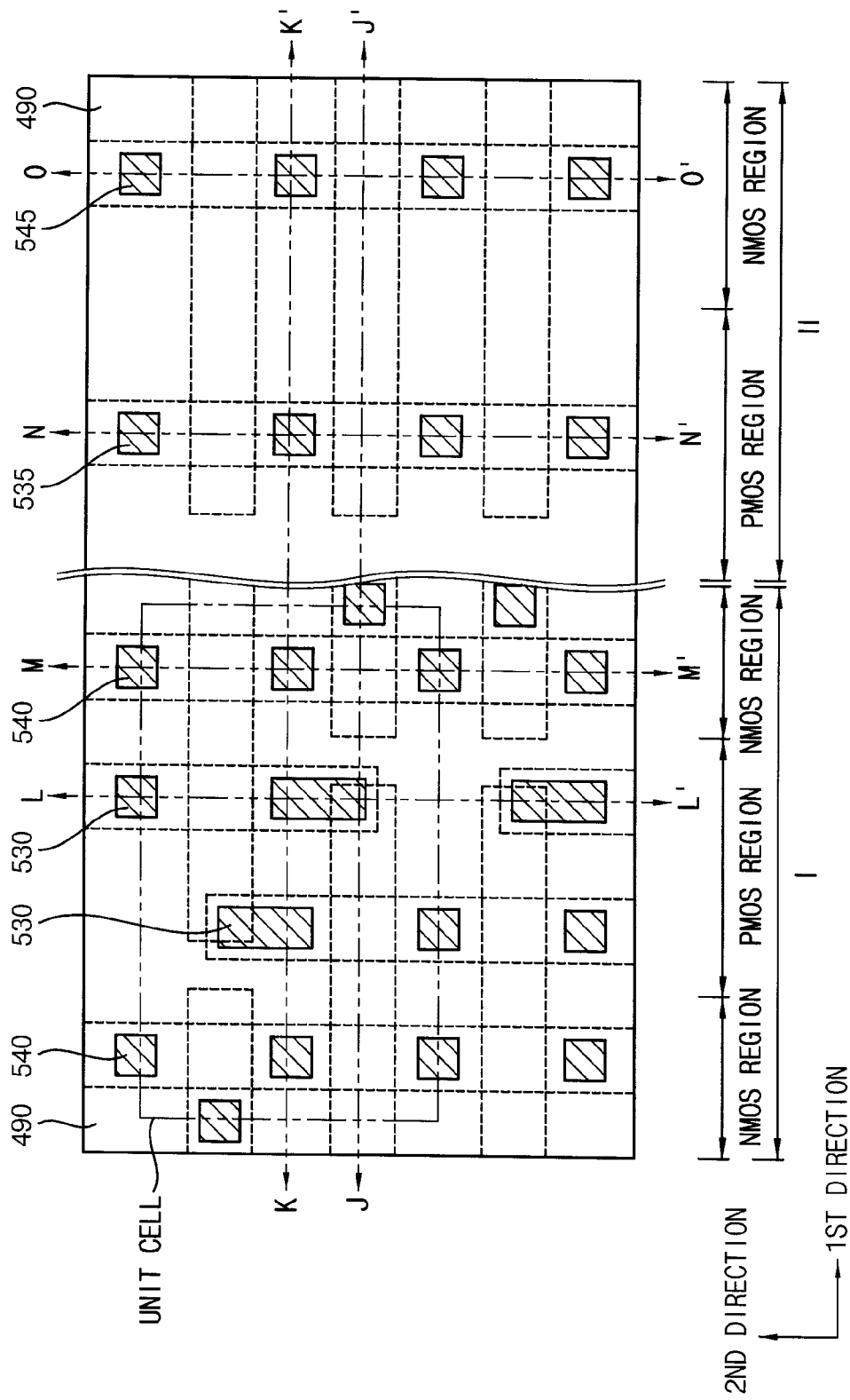
Figure 73:
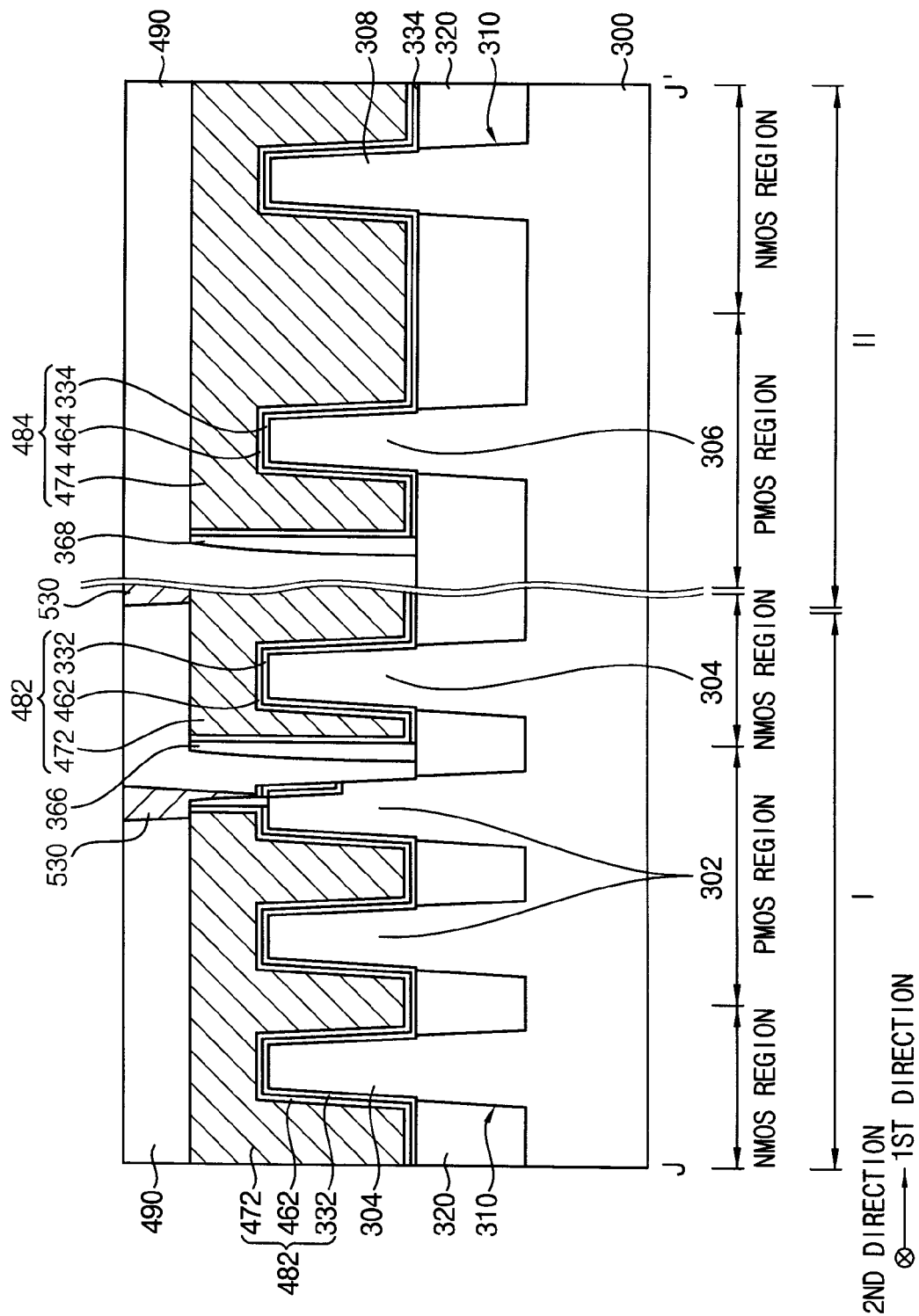
Figure 74:
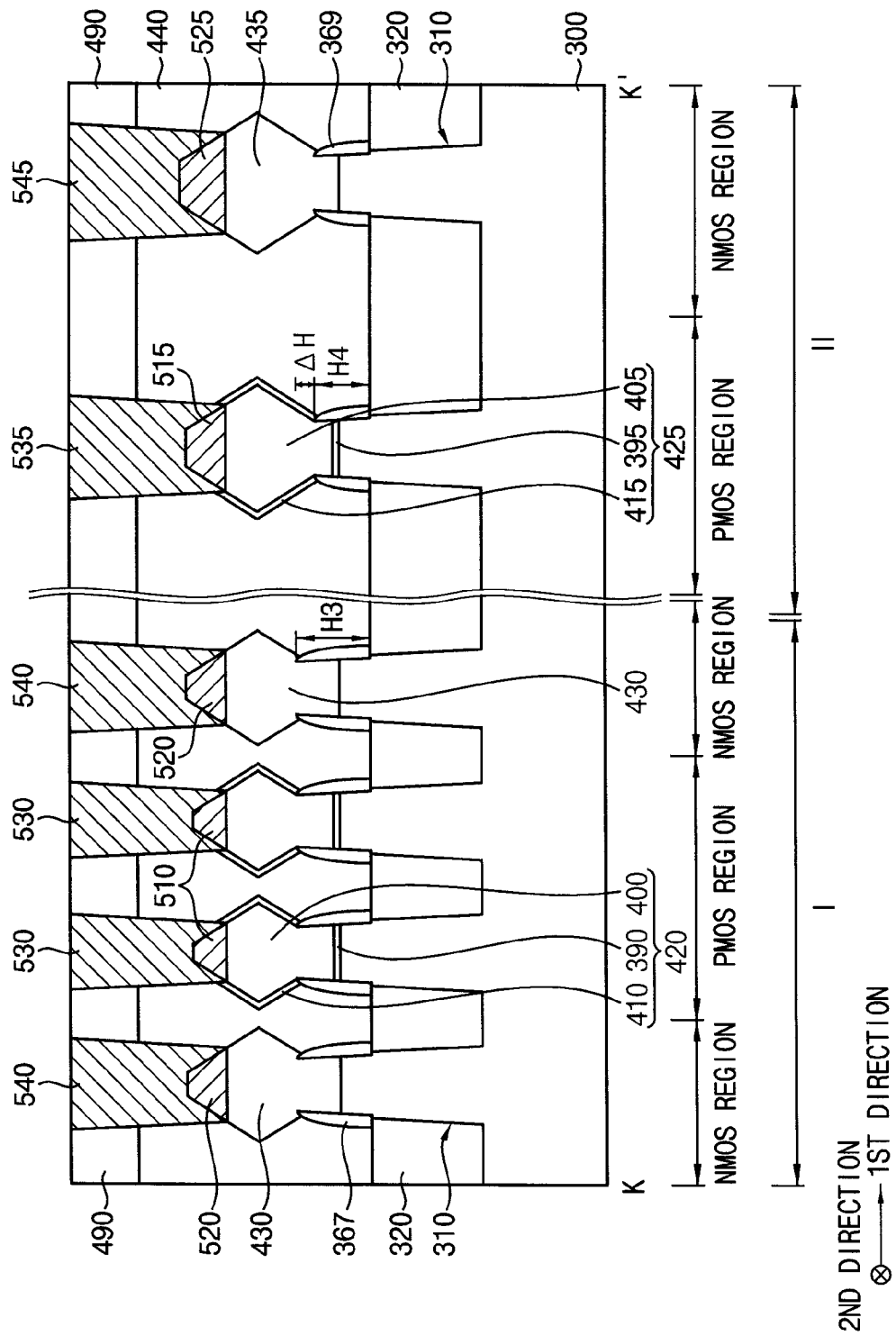
Figure 75:
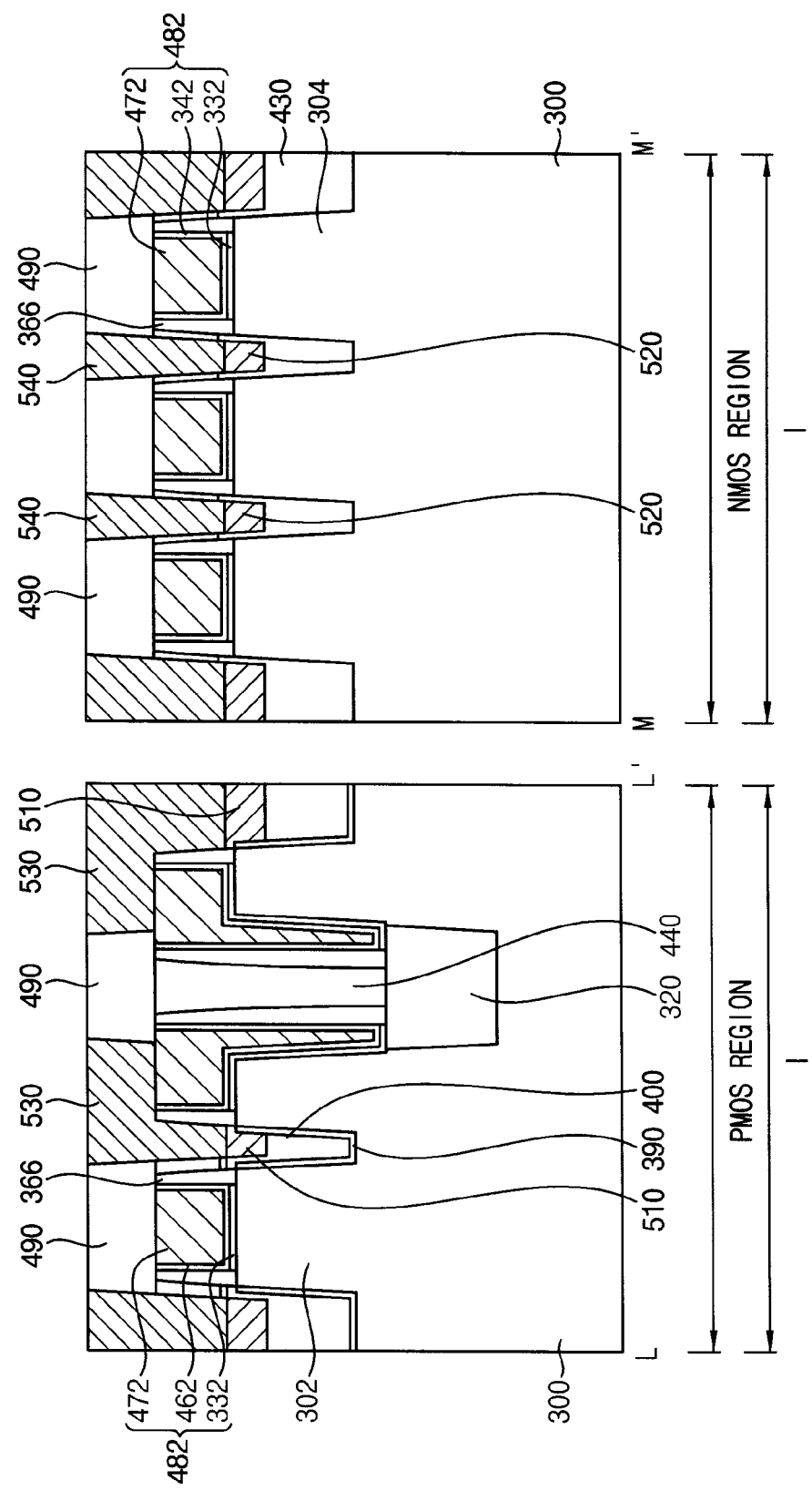
Figure 76:
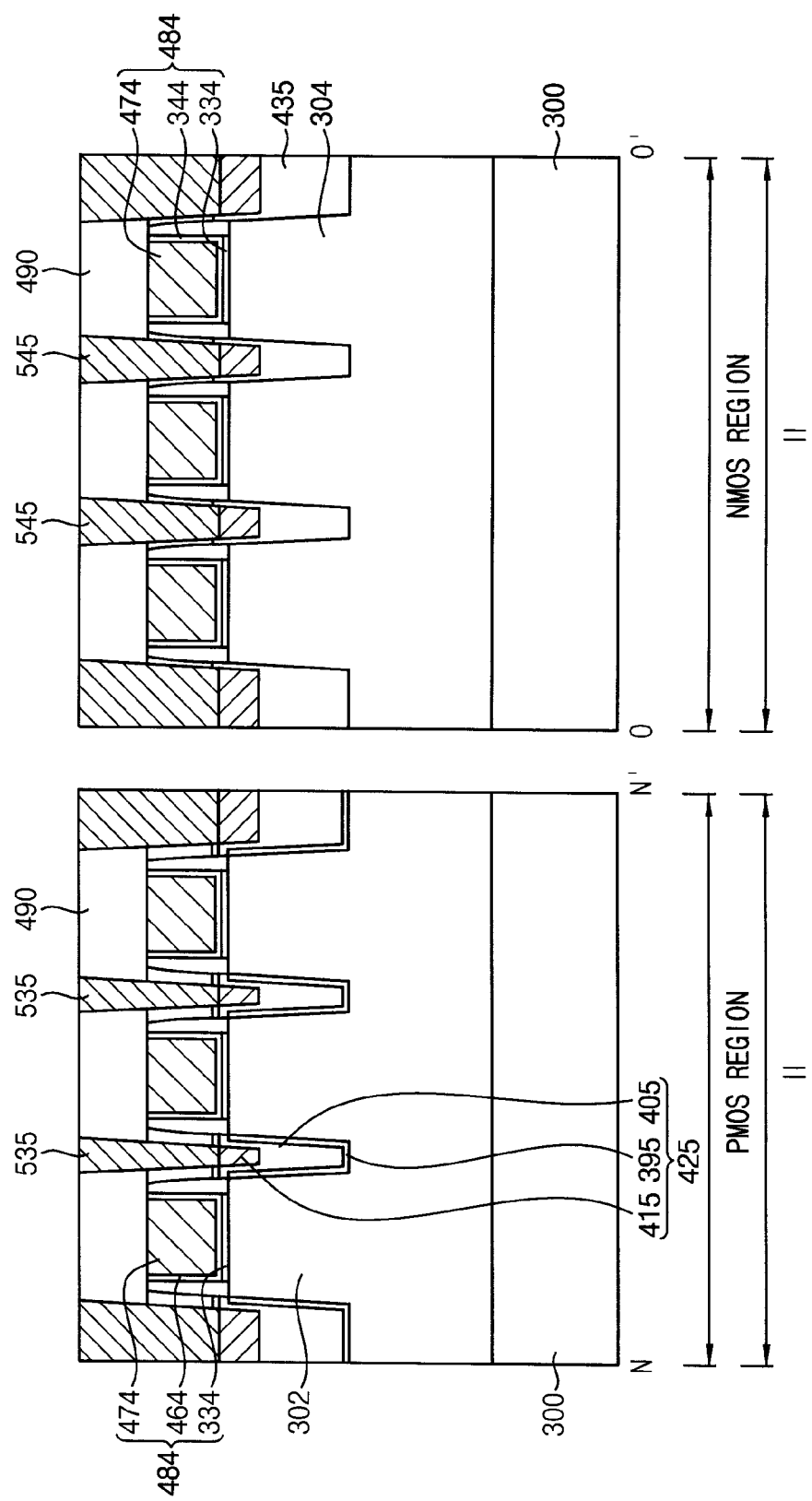

Referring to FIGS. 51 to 53, a process substantially the same as or similar to that illustrated with reference to FIGS. 1 to 3 may be performed.

That is, a substrate 300 may be partially removed to form a trench 310, and an isolation layer 320 may be formed on the substrate 300 to fill the trench 310. According as the isolation layer 320 is formed, a field region of which a top surface may be covered by the isolation layer 320 and an active region of which a top surface may not be covered by the isolation layer 320 may be defined in the substrate 300. The active region may protrude from the isolation layer 320 and have a fin shape so as to be referred to as an active fin.

The substrate 300 may include a first region I and a second region II. The first region I of the substrate 300 may be an SRAM region in which an SRAM device may be formed, and the second region II of the substrate 300 may be a logic region in which a logic device may be formed. Each of the first and second regions I and II may include a PMOS region in which PMOS transistors may be formed and an NMOS region in which NMOS transistors may be formed.

The active region may extend in a second direction substantially parallel to the top surface of the substrate 300, and a plurality of active regions may be formed in a first direction substantially parallel to the top surface of the substrate 300 and substantially perpendicular to the second direction, and a plurality of active regions may be also formed in the second direction.

Thus, the plurality of active regions may be formed in each of the first region I and the second region II. Hereinafter, the active regions in the PMOS region of the first region I may be referred to as first active regions 302, the active regions in the NMOS region of the first region I may be referred to as second active regions 304, the active regions in the PMOS region of the second region II may be referred to as third active regions 306, and the active regions in the NMOS region of the second region II may be referred to as fourth active regions 308.

A first gap G1 between the first and second active regions 302 and 304 in the first region I may be smaller than a second gap G2 between the third and fourth active regions 306 and 308 in the second region II.

Referring to FIGS. 55 to 58, processes substantially the same as or similar to those illustrated with reference to FIGS. 4 to 20 may be performed.

Thus, first and second dummy gate structures may be formed on the first and second regions I and II, respectively, of the substrate 300. The first dummy gate structure may be formed to include a first gate insulation layer pattern 332, a first dummy gate electrode 342 and a first gate mask 352 sequentially stacked, and the second dummy gate structure may be formed to include a second gate insulation layer pattern 334, a second dummy gate electrode 344 and a second gate mask 354 sequentially stacked. Additionally, first and second gate spacers 366 and 368 may be formed on the sidewalls of the first and second dummy gate structures, respectively.

A first spacer 367 may be formed on sidewalls of the first and second active regions 302 and 304 on which no first gate structure is formed, and a second spacer 369 may be formed on sidewalls of the third and fourth active regions 306 and 308 on which no second gate structure is formed. A third height H3 of a top surface of the first spacer 367 from the isolation layer 320 may be higher than a fourth height H4 of the second spacer 369 from the isolation layer 320 by ΔH.

Referring to FIGS. 59 to 62, processes substantially the same as or similar to those illustrated with reference to FIGS. 21 to 29 may be performed.

First, processes substantially the same as or similar to those illustrated with reference to FIGS. 21 to 27 may be performed.

Accordingly, after forming first and third recesses (not shown) by etching upper portions of the first and third active regions 302 and 306, a first SEG process may be performed using upper portions of the first and third active regions 302 and 306 exposed by the first and third recesses, respectively, as a seed to form first and third source/drain layer structures 420 and 425 on the first and third active regions 302 and 306, respectively. Thus, the first and third source/drain layer structures 420 and 425 each including a single crystalline silicon-germanium layer may be formed, which may serve as a source/drain region of a PMOS transistor.

The first source/drain layer structure 420 may be formed to include a first lower buffer layer 390, a first source/drain layer 400 and a first upper buffer layer 410 sequentially stacked on the first active region 302, and the third source/drain layer structure 425 may be formed to include a second lower buffer layer 395, a second source/drain layer 405 and a second upper buffer layer 415 sequentially stacked on the second active region 306.

Then, processes substantially the same as or similar to those illustrated with reference to FIGS. 21 to 23 and 27 to 29 may be performed.

Thus, after forming second and fourth recesses (not shown) by etching upper portions of the second and fourth active regions 304 and 308, a second SEG process may be performed using upper portions of the second and fourth active regions 304 and 308 exposed by the second and fourth recesses, respectively, as a seed to form second and fourth source/drain layer structures 430 and 435 on the second and fourth active regions 304 and 308, respectively. Thus, the second and fourth source/drain layer structures 430 and 435 each including a single crystalline silicon carbide layer or a single crystalline silicon layer may be formed, which may serve as a source/drain region of an NMOS transistor.

The first and second source/drain layer structures 420 and 430 may have fifth and sixth maximum widths W5 and W6, respectively, in the first direction, and the third and fourth source/drain layer structures 425 and 435 may have seventh and eighth maximum widths W7 and W8, respectively, in the first direction. The fifth and sixth maximum widths W5 and W6 may be smaller than the seventh and eighth maximum widths W7 and W8, respectively.

Referring to FIGS. 63 to 67, processes substantially the same as or similar to those illustrated with reference to FIGS. 30 to 39 may be performed.

Thus, an insulating interlayer 440 covering the first and second dummy gate structures, the first and second gate spacers 366 and 368, the first to fourth source/drain layer structures 420, 430, 425 and 435, the first and second spacers 367 and 369, and the isolation layer 320 may be formed to a sufficient height on the substrate 300, and the insulating interlayer 440 may be planarized until top surfaces of the first and second dummy gate electrodes 342 and 344 of the first and second dummy gate structures, respectively, may be exposed. During the planarization process, the first and second gate masks 352 and 354 of the first and second dummy gate structures, respectively, and upper portions of the first and second gate spacers 366 and 368 may be also removed.

The exposed first and second dummy gate electrodes 342 and 344 may be removed to form first and second openings (not shown) exposing top surfaces of the first and second gate insulation layer patterns 332 and 334, respectively, and a first high-k dielectric layer pattern 462 and a first gate electrode 472 may be formed to fill the first opening, and a second high-k dielectric layer pattern 464 and a second gate electrode 474 may be formed to fill the second opening.

Thus, a first gate structure 482 including the first gate insulation layer pattern 332, the first high-k dielectric layer pattern 462 and the first gate electrode 472 sequentially stacked may be formed, and a second gate structure 484 including the second gate insulation layer pattern 334, the second high-k dielectric layer pattern 464 and the second gate electrode 474 sequentially stacked may be formed.

The first gate structure 482 and the first source/drain layer structure 420 adjacent thereto may form a PMOS transistor, and the second gate structure 484 and the third source/drain layer structure 425 adjacent thereto may also form a PMOS transistor. The first gate structure 482 and the second source/drain layer structure 430 adjacent thereto may form an NMOS transistor, and the second gate structure 484 and the fourth source/drain layer structure 435 adjacent thereto may also form an NMOS transistor.

The first gate structure 482 and the first source/drain layer structure 420 adjacent thereto may form a pull-up transistor, and the first gate structure and the second source/drain layer structure 430 adjacent thereto may form a pull-down transistor or a pass-gate transistor. Thus, two pull-up transistors, two pull-down transistors and two pass-gate transistors in the PMOS region may form a unit cell of an SRAM device.

Referring to FIGS. 67 to 71, a second insulating interlayer 490 may be formed on the first insulating interlayer 440, the first and second gate structures 482 and 484, and the first and second gate spacers 366 and 368, and third to sixth openings 502, 504, 506 and 508 may be formed through the first and second insulating interlayers 440 and 490 to expose top surfaces of the first to fourth source/drain layer structures 420, 430, 425 and 435, respectively. In an exemplary embodiment, the first and second upper buffer layers 410 and 415 of the first and third source/drain layer structures 420 and 425, respectively, may be partially removed when the third to sixth openings 502, 504, 506 and 508 are formed.

A metal layer (not shown) may be formed on the exposed top surfaces of the first to fourth source/drain layer structures 420, 430, 425 and 435, and may be reacted with the first to fourth source/drain layer structures 420, 430, 425 and 435 by a heat treatment to form first to fourth metal silicide patterns 510, 520, 515 and 525, respectively. The metal layer may be formed to include a metal, e.g., titanium, nickel, cobalt, etc., and accordingly, the first to fourth metal silicide patterns 510, 520, 515 and 525 may be formed to include titanium silicide, nickel silicide, cobalt silicide, etc.

Referring to FIGS. 72 to 76, first to fourth contact plugs 530, 540, 535 and 545 contacting top surfaces of the first to fourth metal silicide patterns 510, 520, 515 and 525 and filling remaining portions of the third and sixth openings 502, 504, 506 and 508, respectively, may be formed to complete manufacturing the semiconductor device.

In the semiconductor device manufactured by the above processes, the first and second active regions 302 and 304 in the SRAM region I may be disposed at a relatively small distance from each other, and the third and fourth active regions 306 and 308 in the logic region II may be disposed at a relatively large distance from each other. Thus, the first spacers 367 having a relatively high top surface may be formed on both sidewalls of the first and second active regions 302 and 304, and the second spacers 369 having a relatively low top surface may be formed on both sidewalls of the third and fourth active regions 306 and 308.

Thus, the horizontal growth of the first and second source/drain layer structures 420 and 430 may be much restricted in the SRAM region I so that the first and second source/drain layer structures 420 and 430 may be formed to have relatively narrow widths. Additionally, the horizontal growth of the third and fourth source/drain layer structures 425 and 435 may be little restricted in the logic region II so that the third and fourth source/drain layer structures 425 and 435 may be formed to have relatively wide widths. Accordingly, in the SRAM device, the electrical short between transistors may be prevented and process margin may be enhanced, while the logic device may have enhanced electrical performance.

The above semiconductor device and the method of manufacturing the semiconductor device may be applied to various types of memory devices including a finFET and a source/drain layer formed by an SEG process. For example, the semiconductor device and the method of manufacturing the same may be applied to logic devices such as central processing units (CPUs), main processing units (MPUs), or application processors (APs), etc. Additionally, the semiconductor device and the method of manufacturing the same may be applied to volatile memory devices such as DRAM devices or SRAM devices, or non-volatile memory devices such as flash memory devices, parameter RAM (PRAM) devices, magnetoresistive RAM (MRAM) devices, resistive RAM (RRAM) devices, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A semiconductor device, comprising:
   a substrate comprising a plurality of first active regions and a plurality of second active regions;
   a plurality of first spacers, respective first spacers of the plurality of first spacers respectively being on both sidewalls of the plurality of first active regions;
   a plurality of first gate structures formed above the first active regions, respectively, and a plurality of second gate structures formed above the second active regions, respectively; and
   a plurality of first source/drain layers corresponding to the first gate structures, respectively, and a plurality of second source/drain layers corresponding to the second gate structures, respectively,
   wherein a width of each of the first source/drain layers is smaller than a width of each of the second source/drain layers.

2. The semiconductor device of claim 1, wherein top surfaces of the first source/drain layers are formed at a substantially same height as top surfaces of the second source/drain layers.

3. The semiconductor device of claim 1, wherein a distance between the first active regions is smaller than a distance between the second active regions.

4. The semiconductor device of claim 1, further comprising a plurality of second spacers,
   wherein respective second spacers of the plurality of second spacers are formed on both sidewalls of the second active regions, respectively, and
   wherein top portions of the first spacers are formed to be higher than top portions of the second spacers.

5. The semiconductor device of claim 1, wherein the first gate structures and the first source/drain layers constitute at least one negative-channel metal oxide semiconductor (NMOS) transistor and one positive-channel metal oxide semiconductor (PMOS) transistor, and the second gate structures and the second source/drain layers constitute at least one NMOS transistor and one PMOS transistor.

6. A semiconductor device, comprising:
   a substrate including a field region and first and second active regions, an isolation layer being formed on the field region, and the first and second active regions protruding from the isolation layer;
   first and second gate structures on the first and second active regions, respectively;
   first and second spacers on sidewalls of the first and second active regions, respectively, top surfaces of the first and second spacers being formed to be higher than those of the first and second active regions, respectively, and heights of the top surfaces of the first and second spacers being different from each other; and
   first and second source/drain layers adjacent to the first and second gate structures on the first and second active regions, respectively, the first and second source/drain layers contacting the first and second spacers, respectively.

7. The semiconductor device of claim 6, wherein the first and second spacers are formed on both sidewalls of the first and second active regions, respectively, to define first and second recesses together with top surfaces of the first and second active regions, respectively, and
   wherein the first and second source/drain layers fill the first and second recesses and protrude from the first and second spacers, respectively.

8. The semiconductor device of claim 7, wherein each of the first and second active regions extends in a second direction substantially parallel to a top surface of the substrate,
   wherein a top surface of the first spacer is higher than that of the second spacer, and
   wherein the first source/drain layer has a maximum width in a first direction smaller than that of the second source/drain layer, the first direction being substantially parallel to the top surface of the substrate and substantially perpendicular to the second direction.

9. The semiconductor device of claim 7, wherein top surfaces of the first and second source/drain layers are substantially coplanar with each other.

10. The semiconductor device of claim 6, wherein each of the first and second source/drain layers includes silicon-germanium doped with p-type impurities.

11. The semiconductor device of claim 6, wherein each of the first and second source/drain layers includes silicon doped with n-type impurities or silicon carbide doped with n-type impurities.

12. A semiconductor device, comprising:
   a substrate including a field region and first and second active regions, an isolation layer being formed on the field region, and the first and second active regions protruding from the isolation layer;
   first and second gate structures on the first and second active regions, respectively;
   first and second spacers on sidewalls of the first and second active regions, respectively, top surfaces of the first and second spacers being formed to be higher than those of the first and second active regions, respectively, and heights of the top surfaces of the first and second spacers being different from each other; and first and second source/drain layers adjacent to the first and second gate structures on the first and second active regions, respectively, the first and second source/drain layers contacting the first and second spacers, respectively, wherein the first active region includes a plurality of first active regions, each of which extends in a second direction substantially parallel to a top surface of the substrate, disposed at a first gap from each other in a first direction substantially parallel to the top surface of the substrate and substantially perpendicular to the second direction, and wherein the second active region includes a plurality of second active regions, each of which extends in the second direction, disposed at a second gap from each other in the first direction, the second gap being greater than the first gap.

13. The semiconductor device of claim 12, wherein each of the first and second gate structures extends in the first and second direction, and wherein the semiconductor device further comprises first and second gate spacers on both sidewalls of the first and second gate structures in the second direction, the first and second gate spacers including a material substantially the same as that of the first and second spacers.

14. The semiconductor device of claim 6, wherein each of the first and second gate structures includes a gate insulation layer pattern, a high-k dielectric layer pattern and a gate electrode sequentially stacked on the substrate.

15. The semiconductor device of claim 6, wherein the first active region is formed in a static random access memory (SRAM) region in which a SRAM device is formed, and the second active region is formed in a logic region in which a logic device is formed.

16. The semiconductor device of claim 1, wherein the first and second spacers are formed on both sidewalls of the first and second active regions, respectively, to define first and second recesses together with top surfaces of the first and second active regions, respectively, and wherein the first and second source/drain layers fill the first and second recesses and protrude from the first and second spacers, respectively.

17. The semiconductor device of claim 1, wherein each of the plurality of first active regions extends in a second direction substantially parallel to a top surface of the substrate, disposed at a first gap from each other in a first direction substantially parallel to the top surface of the substrate and substantially perpendicular to the second direction, and wherein each of the plurality of second active regions, each of which extends in the second direction, disposed at a second gap from each other in the first direction, the second gap being greater than the first gap.

18. The semiconductor device of claim 1, further comprising a plurality of second gate spacers, each of the plurality of second spacers being formed on either side of each of the second gate structures and directly on each of the second active regions.

19. The semiconductor device of claim 6, further comprising a plurality of first spacers respectively formed on either side of the first gate structures and directly on the first active regions; and a plurality of second spacers respectively formed on either side of each of the second gate structures and directly on the second active regions.

20. The semiconductor device of claim 1, further comprising a plurality of first gate insulating patterns, each of the plurality of first gate insulation patterns being formed between opposite ones of the plurality of first gate spacers and directly on each of the plurality of the first active regions.

\* \* \* \* \*